(12) United States Patent
Kitano et al.

(10) Patent No.: US 7,772,360 B2
(45) Date of Patent: Aug. 10, 2010

(54) POLYMER COMPOUND AND POLYMER LIGHT-EMITTING DEVICE USING THE SAME

(75) Inventors: Makoto Kitano, Tsukuba (JP); Yoshiaki Tsubata, Tsukuba (JP); Chizu Sekine, Tsukuba (JP); Jun Oguma, Abiko (JP); Katsumi Agata, Kobe (JP); Akihiro Ono, Tsukuba (JP); Akiko Nakazono, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 376 days.

(21) Appl. No.: 10/647,454

(22) Filed: Aug. 26, 2003

(65) Prior Publication Data
US 2004/0109955 A1 Jun. 10, 2004

(30) Foreign Application Priority Data
Aug. 28, 2002 (JP) ............................. 2002-248410
Oct. 24, 2002 (JP) ............................. 2002-309312

(51) Int. Cl.
*C08G 73/00* (2006.01)
*H01L 51/54* (2006.01)

(52) U.S. Cl. ...................... 528/422; 428/917; 313/504; 313/506; 257/40; 257/E51.028; 257/E51.036

(58) Field of Classification Search ........................ None
See application file for complete search history.

(56) References Cited

U.S. PATENT DOCUMENTS

| | | | |
|---|---|---|---|
| 5,814,244 A | | 9/1998 | Kreuder et al. |
| 5,879,821 A | * | 3/1999 | Hsieh .......................... 428/690 |
| 5,948,552 A | | 9/1999 | Antoniadis et al. |
| 6,034,206 A | * | 3/2000 | Yamamoto et al. .......... 528/397 |
| 6,309,763 B1 | * | 10/2001 | Woo et al. .................... 428/690 |
| 2001/0037012 A1 | * | 11/2001 | Towns et al. ................ 528/394 |
| 2002/0076577 A1 | | 6/2002 | Noguchi et al. |
| 2002/0185635 A1 | | 12/2002 | Doi et al. |
| 2004/0004433 A1 | * | 1/2004 | Lamansky et al. .......... 313/506 |
| 2004/0009368 A1 | | 1/2004 | Otani et al. |

FOREIGN PATENT DOCUMENTS

| | | |
|---|---|---|
| EP | 0 648 737 A1 | 4/1995 |
| EP | 0 827 366 A2 | 3/1998 |
| EP | 1 229 063 A2 | 8/2002 |
| JP | 05-025102 | 2/1993 |
| JP | 10-92582 | 4/1998 |
| JP | 11-246660 | 9/1999 |
| JP | 2000-219660 A | 8/2000 |
| JP | 2001-139940 | 5/2001 |
| JP | 2001-527102 | 12/2001 |
| JP | 2002-506481 | 2/2002 |
| JP | 2002-69161 A | 3/2002 |
| JP | 2002-155274 | 5/2002 |
| JP | 2002-515078 | 5/2002 |
| JP | 2003-034715 | 2/2003 |
| JP | 2003-206335 | 7/2003 |
| JP | 2005-506419 | 3/2005 |
| JP | 2005-516059 | 6/2005 |
| WO | 97/09394 | 3/1997 |
| WO | WO 98/06773 A1 | 2/1998 |
| WO | 99/32537 | 7/1999 |
| WO | 99/54385 | 10/1999 |
| WO | 01/49769 A1 | 7/2001 |
| WO | 03/035714 | 5/2003 |
| WO | 03/064373 | 8/2003 |

\* cited by examiner

*Primary Examiner*—Marie R. Yamnitzky
(74) *Attorney, Agent, or Firm*—Sughrue Mion, PLLC

(57) ABSTRACT

A polymer compound comprising at least one repeating unit selected from the group of repeating units shown by formula (1) or formula (2), $$-Ar_1-N(-Ar_2-N)_a-Ar_3- \quad (1)$$

with substituents $Ar_4$, $E_1$ on first N, and $E_2-N$ with $E_3$ branch, subscript $b$.

wherein $Ar_1$ to $Ar_4$ represent an arylene group etc.; $E_1$, $E_2$, and $E_3$ represent an aryl group (A) having three or more substituents, or a heterocyclic group (B) having one or more substituents, and the total number of substituents and hetero atoms of the heterocyclic ring is three or more;
a and b represent 0 or 1, and $0 \le a+b \le 1$, $$-Ar_5-N(-Ar_6-N)_n-Ar_7- \quad (2)$$

with $E_4$, $Ar_8$, $Ar_9$, $E_6$ branches and $E_5-(N-Ar_{10})_o-N$ ... $N-(Ar_{11}-N)_p-E_7$, with $E_8$, $E_9$ and subscripts $l$, $m$.

wherein $Ar_5$ to $Ar_{10}$ and $Ar_{11}$ represent an arylene group etc.; $E_4$ to $E_9$ represent an aryl group or a monovalent heterocyclic group; l, m and n represent 0 to 2; o and p represent 0 or 1, and $l+m+n+o+p$ is 2 or more.

18 Claims, No Drawings

POLYMER COMPOUND AND POLYMER LIGHT-EMITTING DEVICE USING THE SAME

BACKGROUND OF THE INVENTION

1. Field of the Invention

The present invention relates to a polymer compound and a polymer light-emitting device (hereinafter may be referred to as polymer LED) using the polymer compound.

2. Description of the Related Art

Unlike a low molecular weight light-emitting material, a high molecular weight light-emitting material is soluble in a solvent, and a light emitting layer in a light-emitting device can be formed by application method, and it has been studied. For example, polymer compounds comprising repeating units, such as a combination of phenylene-group/N-phenyl-N,N-diyl-amino group/phenylene group connected in this order, and a combination of phenylene-group/N-phenyl-N,N-diyl-amino group/phenylene-group/N-phenyl-N,N-diyl-amino group/phenylene group connected in this order, are known.

As such a polymer compound, for example, WO 99/54385 discloses a polymer compound comprising a repeating unit represented by the below formula whose phenyl group of the N-phenyl-N,N-diyl-amino group is a phenyl group having one butyl group as the substituent,

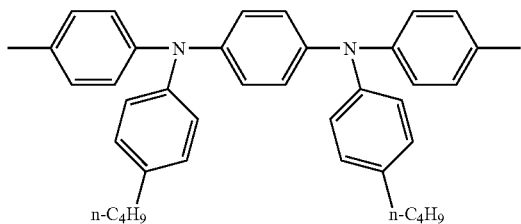

and a repeating unit consisting of fluorene-diyl group.

However, when the above known polymer compound is used as a light-emitting material of a light-emitting device, there has been a problem that the lifetime of the light-emitting device is not sufficient.

SUMMARY OF THE INVENTION

The object of the present invention is to provide a polymer compound which gives a light-emitting device having longer lifetime when used as a light-emitting material of a light-emitting device.

As a result of intensive studies to solve the above problems, the present inventors found that by using a specific polymer compound comprising a repeating unit containing nitrogen atoms, the lifetime of a light-emitting device can be improved.

That is, the present invention relates to a polymer compound having a polystyrene reduced number average-molecular weight of $10^3$-$10^8$, and comprising at least one repeating unit selected from the group of repeating units shown by formula (1) or formula (2),

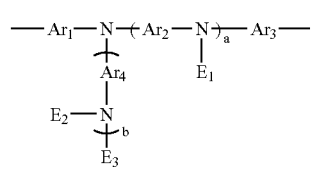

[wherein $Ar_1$, $Ar_2$, $Ar_3$ and $Ar_4$ each independently represent an arylene group or a divalent heterocyclic group; $E_1$, $E_2$, and $E_3$ each independently represent the below aryl group (A) or heterocyclic group (B); a and b each independently represent 0 or 1, and $0<=a+b<=1$, aryl group (A): an aryl group which has three or more substituents selected from an alkyl group, alkoxy group, alkylthio group, aryl group, aryloxy group, arylthio group, arylalkyl group, arylalkoxy group, arylalkylthio group, aryl alkenyl group, arylalkynyl group, amino group, substituted amino group, silyl group, substituted silyl group, silyloxy group, substituted silyloxy group, monovalent heterocyclic group, or halogen atom, heterocyclic group (B): a monovalent heterocyclic group which has one or more substituents selected from an alkyl group, alkoxy group, alkylthio group, aryl group, aryloxy group, arylthio group, arylalkyl group, arylalkoxy group, arylalkylthio group, aryl alkenyl group, arylalkynyl group, amino group, substituted amino group, silyl group, substituted silyl group, silyloxy group, substituted silyloxy group, monovalent heterocyclic group, or halogen atom, and the total number of the substituent and hetero atoms of the heterocyclic ring is three or more.]

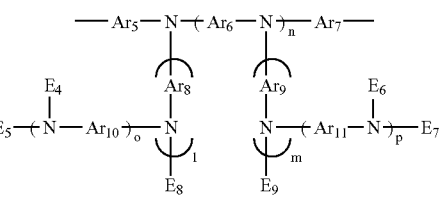

[wherein $Ar_5$, $Ar_6$, $Ar_7$, $Ar_8$, $Ar_9$, $Ar_{10}$ and $Ar_{11}$ each independently represent an arylene group or a divalent heterocyclic group; $E_4$, $E_5$, $E_6$, $E_7$, $E_8$ and $E_9$ each independently represent an aryl group or a monovalent heterocyclic group; l, m and n each independently represent an integer of 0 to 2; o and p each independently represent an integer of 0 or 1, and $l+m+n+o+p$ is 2 or more.

When $Ar_6$, $Ar_8$, $Ar_9$,

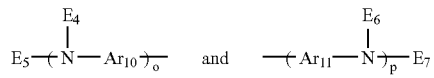

exist in plural, they may be the same or different.]

DETAILED DESCRIPTION OF THE INVENTION

In the above formula (1), $Ar_1$, $Ar_2$, $Ar_3$, and $Ar_4$ each independently represent an arylene group or a divalent heterocyclic group.

The arylene group is an atomic group in which two hydrogen atoms are removed from an aromatic hydrocarbon. The aromatic hydrocarbon includes those containing a benzene ring or a condensed ring, and those containing two or more independent benzene rings or condensed rings bonded directly or through a group such as a vinylene group or the like. The arylene group may have a substituent. As the substituent, an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, silyloxy group, substituted silyloxy group, halogen atom, acyl group, acyloxy group, imino group, amide group, imide group, monovalent heterocyclic group, carboxyl group, substituted carboxyl group, cyano group etc. are exemplified and an alkyl group, alkoxy group, alkylthio group, aryl group, aryloxy group, arylthio group, substituted amino group, substituted silyl group, substituted silyloxy group, and monovalent heterocyclic group are preferable.

The arylene group usually has about 6 to 60 carbon atoms, preferably 6 to 20, without including the number of carbon atoms of the substituent.

The arylene group may be, for example, a phenylene group (for example, following formulas 1-3), a naphthalene-diyl group (following formulas 4-13), an anthracene-diyl group (following formulas 14-19), biphenyl-diyl group (following formulas 20-25), a terphenyl-diyl group (following formulas 26-28), a condensed-ring compound group (following formulas 29-35), a fluorene-diyl group (following formulas 36-38), an indenofluorene-diyl group (following formulas 38A-38B), a stilbene-diyl group (following formulas A-D), and a distilbene-diyl group (following formulas E and F). Among them, a phenylene group, a biphenyl-diyl group, a fluorene-diyl group, and a stilbene-diyl group are preferable.

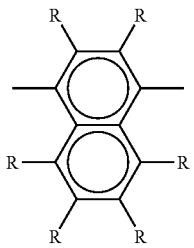

1

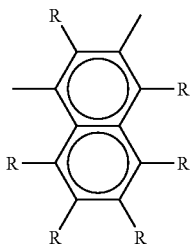

2

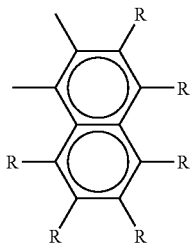

3

-continued

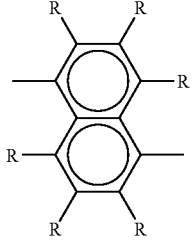

4

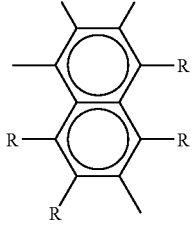

5

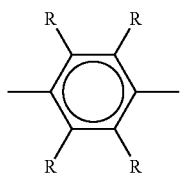

6

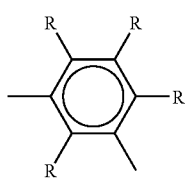

7

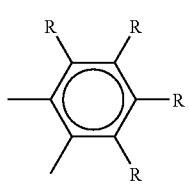

8

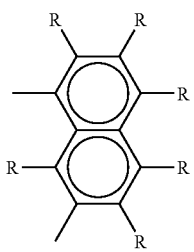

9

-continued
10
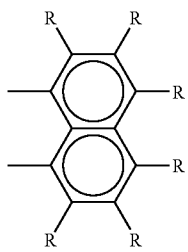
11
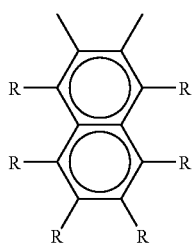
12
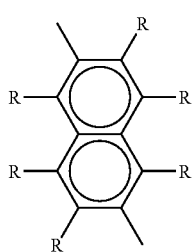
13
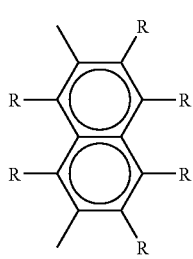
14
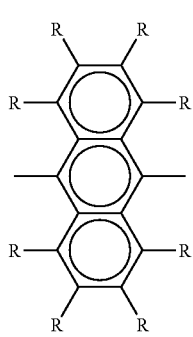
-continued
15
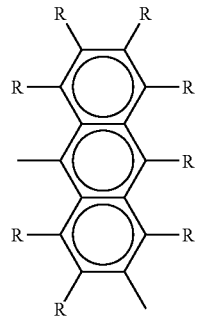
16
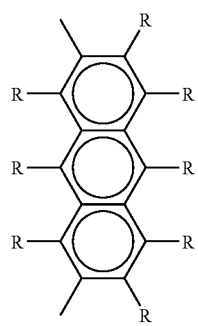
17
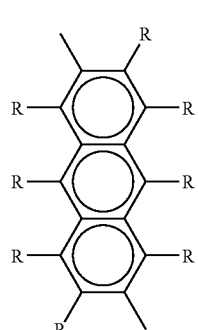
18
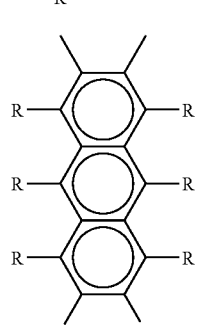
19
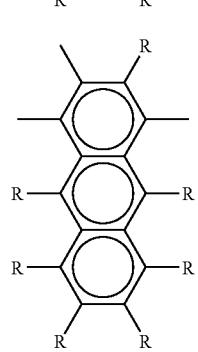

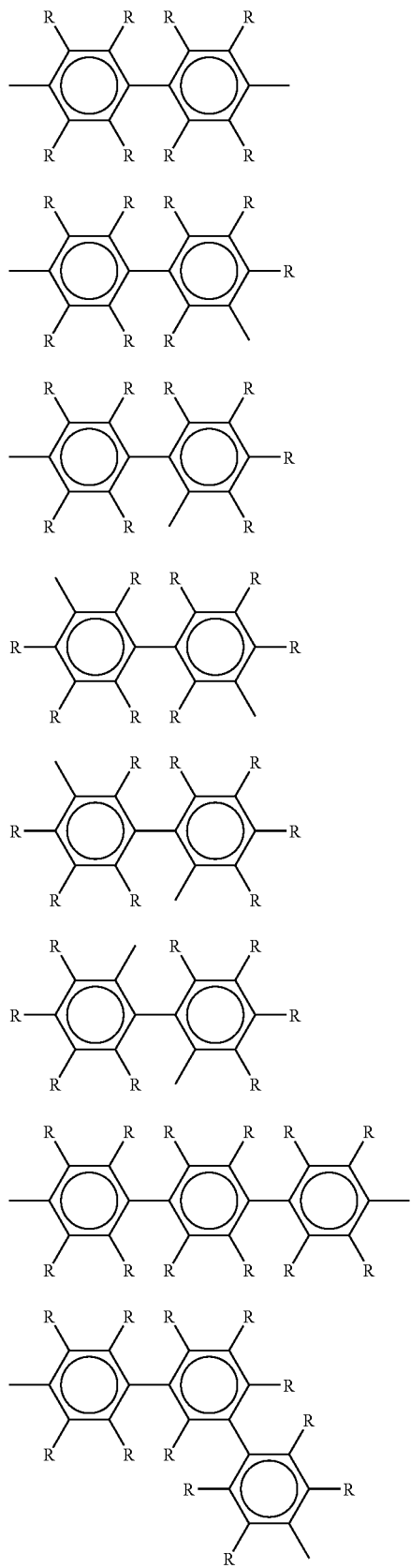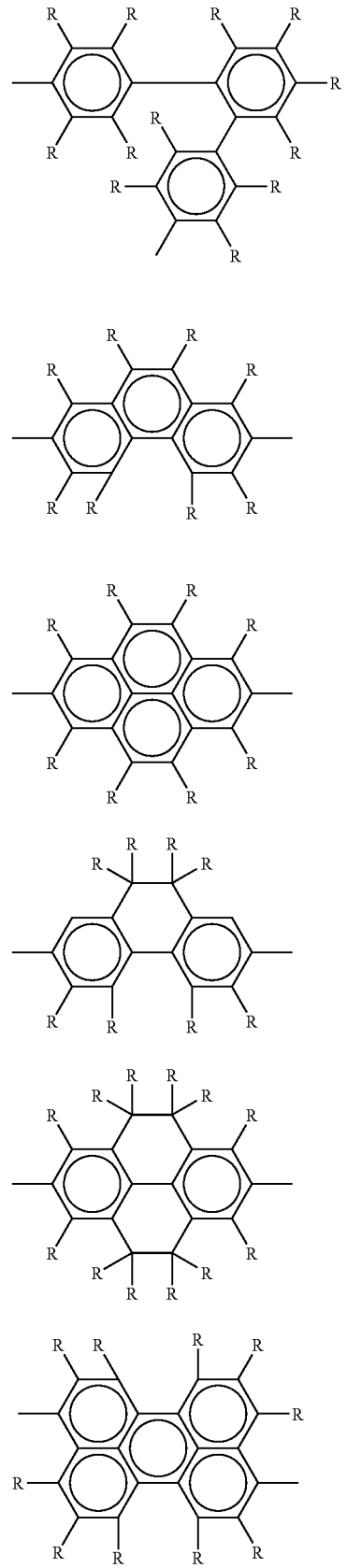

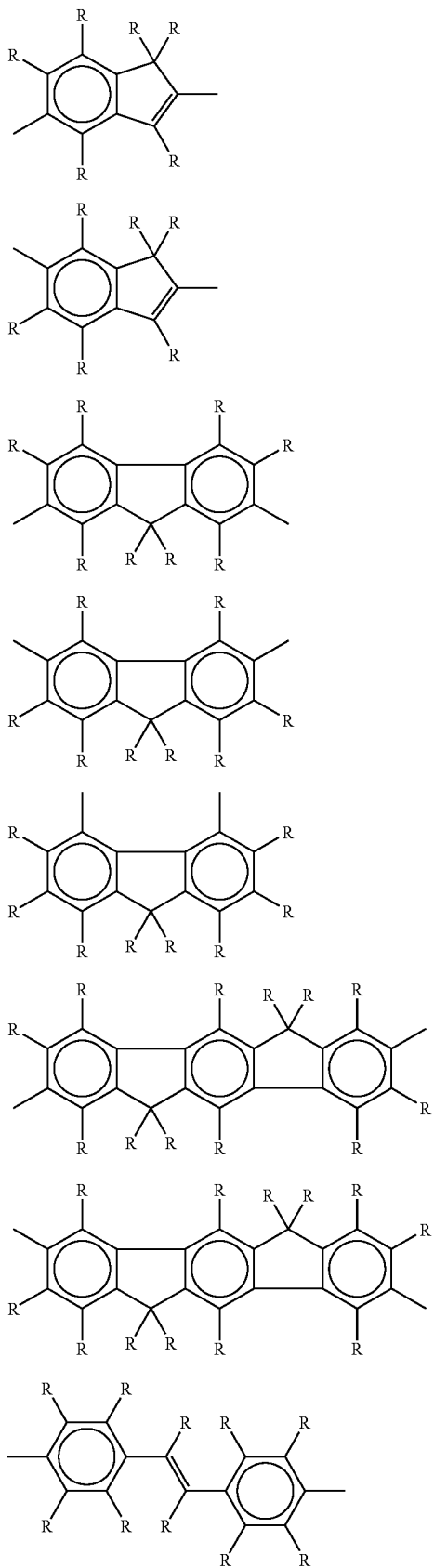
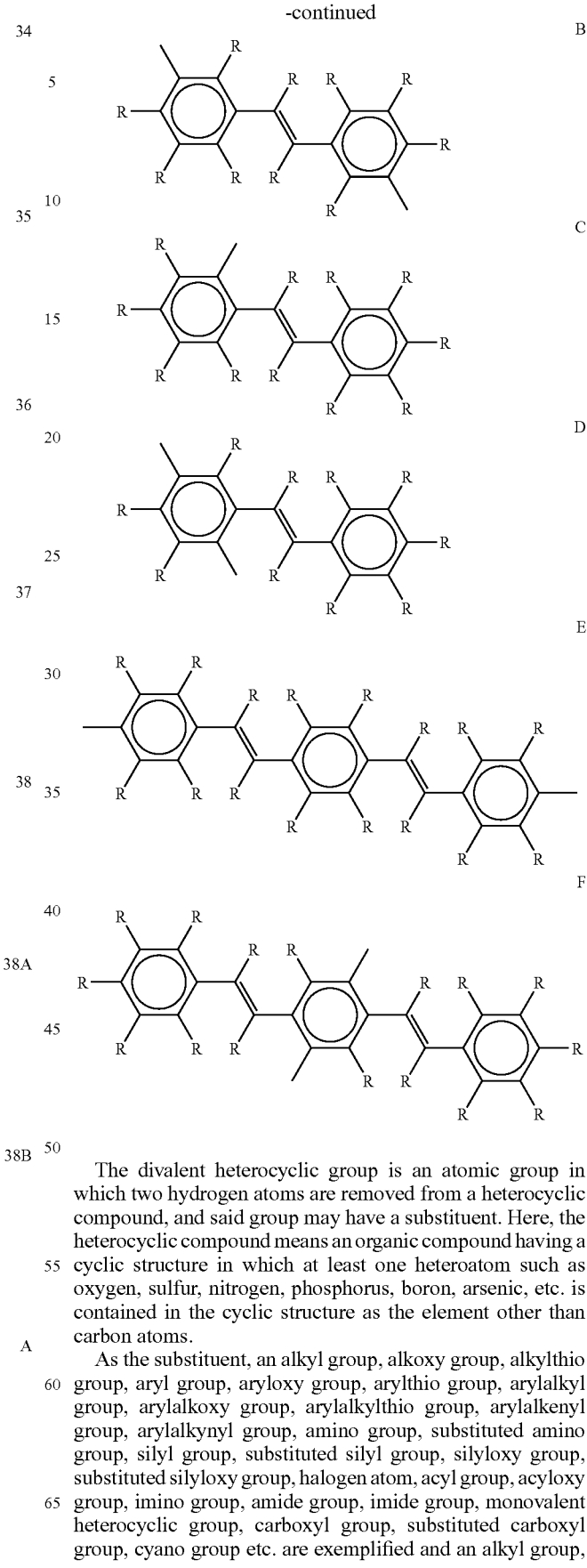

The divalent heterocyclic group is an atomic group in which two hydrogen atoms are removed from a heterocyclic compound, and said group may have a substituent. Here, the heterocyclic compound means an organic compound having a cyclic structure in which at least one heteroatom such as oxygen, sulfur, nitrogen, phosphorus, boron, arsenic, etc. is contained in the cyclic structure as the element other than carbon atoms.

As the substituent, an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, silyloxy group, substituted silyloxy group, halogen atom, acyl group, acyloxy group, imino group, amide group, imide group, monovalent heterocyclic group, carboxyl group, substituted carboxyl group, cyano group etc. are exemplified and an alkyl group, an alkoxy group, alkylthio group, an aryl group, aryloxy group, arylthio group, a substituted amino group, substituted silyl group, substituted silyloxy group, and a monovalent heterocyclic group are preferable.

The divalent heterocyclic group usually has about 3 to 60 carbon atoms without including the number of carbon atoms of the substituent.

The divalent heterocyclic compound group may be, for example, a divalent heterocyclic-group containing nitrogen as a hetero atom; a pyridine-diyl group (following formulas 39-44), a diaza phenylene group (following formulas 45-48), a quinoline-diyl group (following formulas 49-63), a quinoxaline-diyl group (following formulas 64-68), an acridine-diyl group (following formulas 69-72), a bipyridyl-diyl group (following formulas 73-75), a phenanthroline-diyl group (following formulas 76-78);

Groups having a fluorene structure and containing silicon, nitrogen, sulfur, selenium, boron, etc. as a hetero atom (following formulas 79-93, G-I);

Groups having an indenofluorene structure and containing silicon, nitrogen, sulfur, selenium, etc. as a hetero atom (following formulas J-O);

5 membered-ring heterocyclic groups containing silicon, nitrogen, sulfur, selenium, etc. as a hetero atom (following formulas 94-98);

Condensed 5 membered-ring heterocyclic groups containing silicon, nitrogen, sulfur, selenium, etc. as a hetero atom (following formulas 99-110);

Groups in which 5 membered-ring heterocyclic group containing silicon, nitrogen, sulfur, selenium, etc. as a hetero atom is connected with a phenyl group at the α position of the hetero atom to form a dimer or oligomer (following formulas 111-112);

Groups in which 5 membered-ring heterocyclic group containing silicon, nitrogen, sulfur, selenium, etc. as a hetero atom is connected with a phenyl group at the α position of the hetero atom (following formulas 113-119); and Groups in which 5 membered-ring heterocyclic group containing oxygen, nitrogen, sulfur, etc. as a hetero atom is connected with a furyl group, or thienyl group (following formulas 120-125).

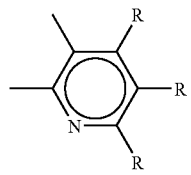

39

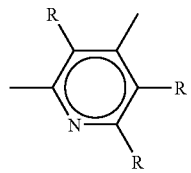

40

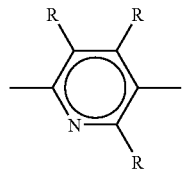

41

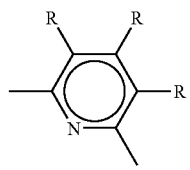

42

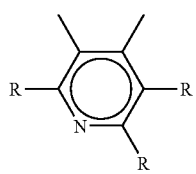

43

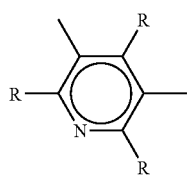

44

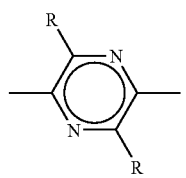

45

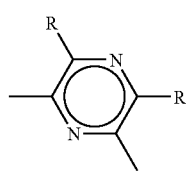

46

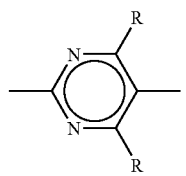

47

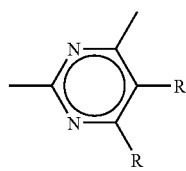

48

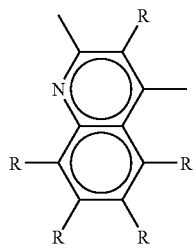

49

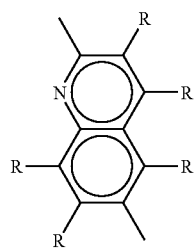
50
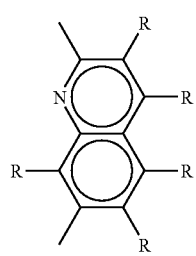
51
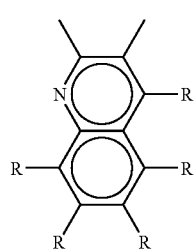
52
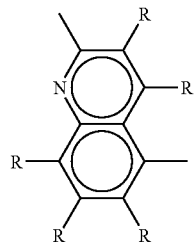
53
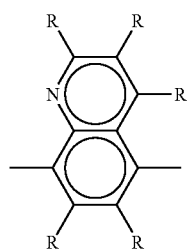
54
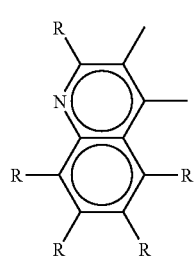
55
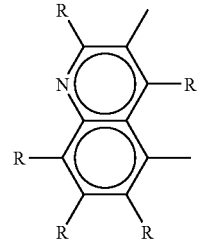
56
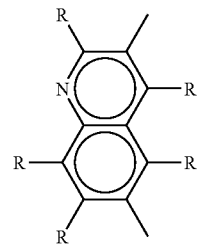
57
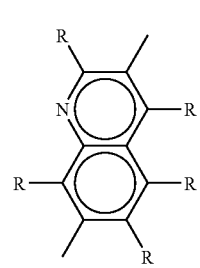
58
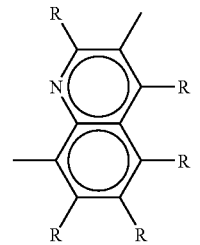
59
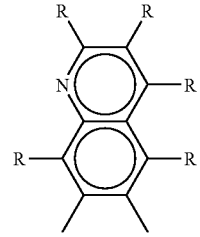
60
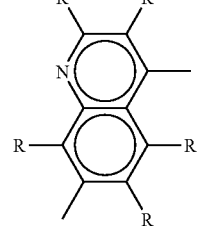
61

-continued
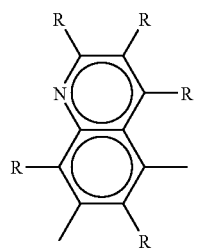
62
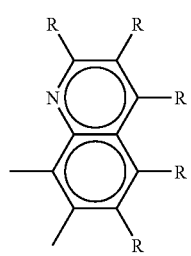
63
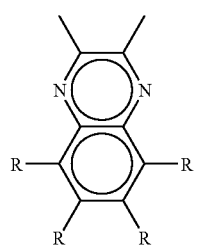
64
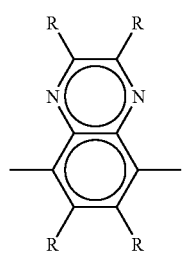
65
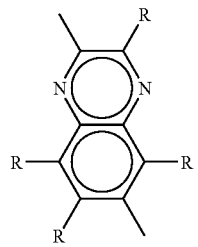
66
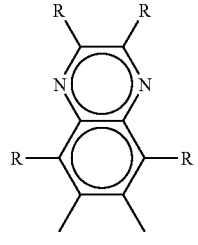
67
-continued
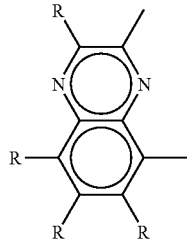
68
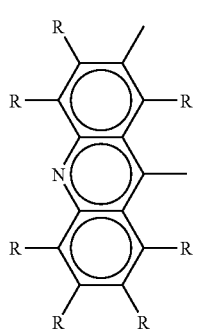
69
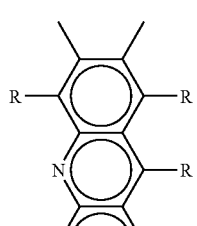
70
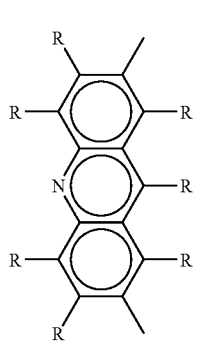
71
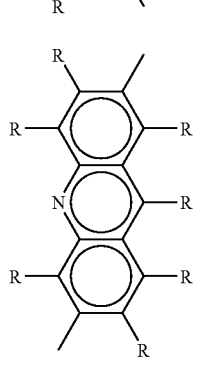
72

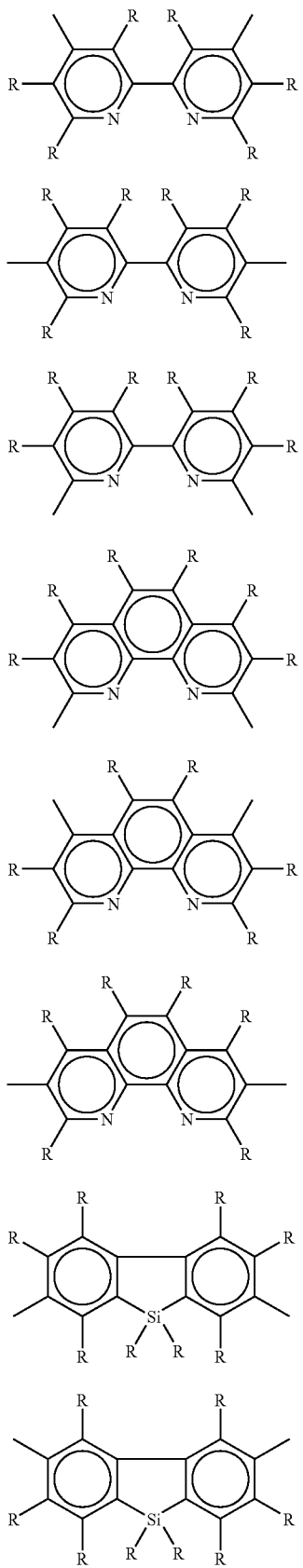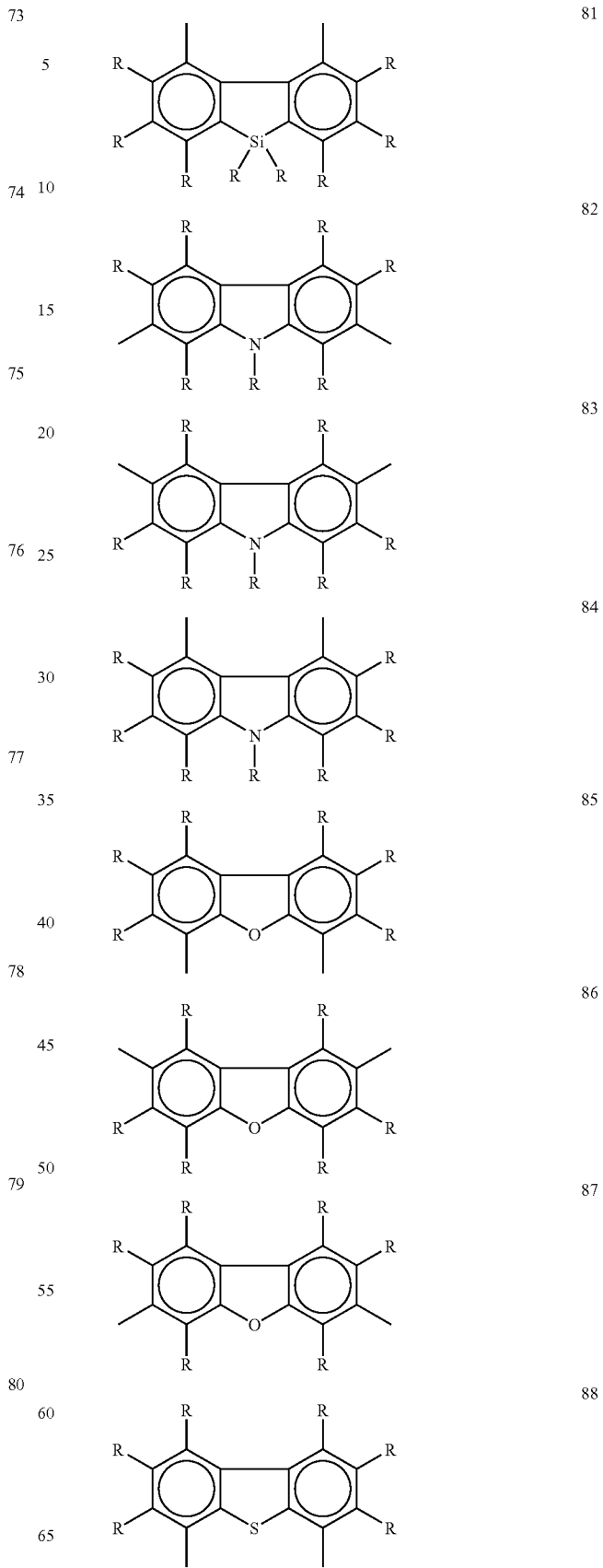

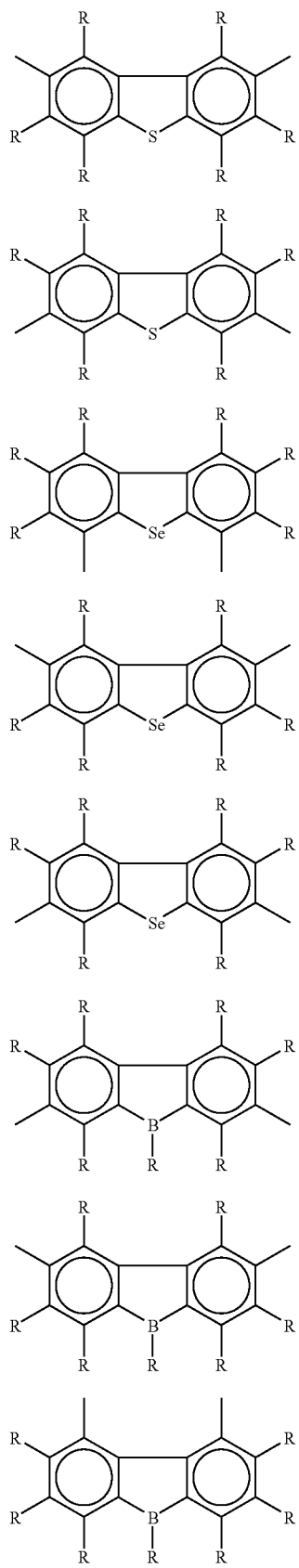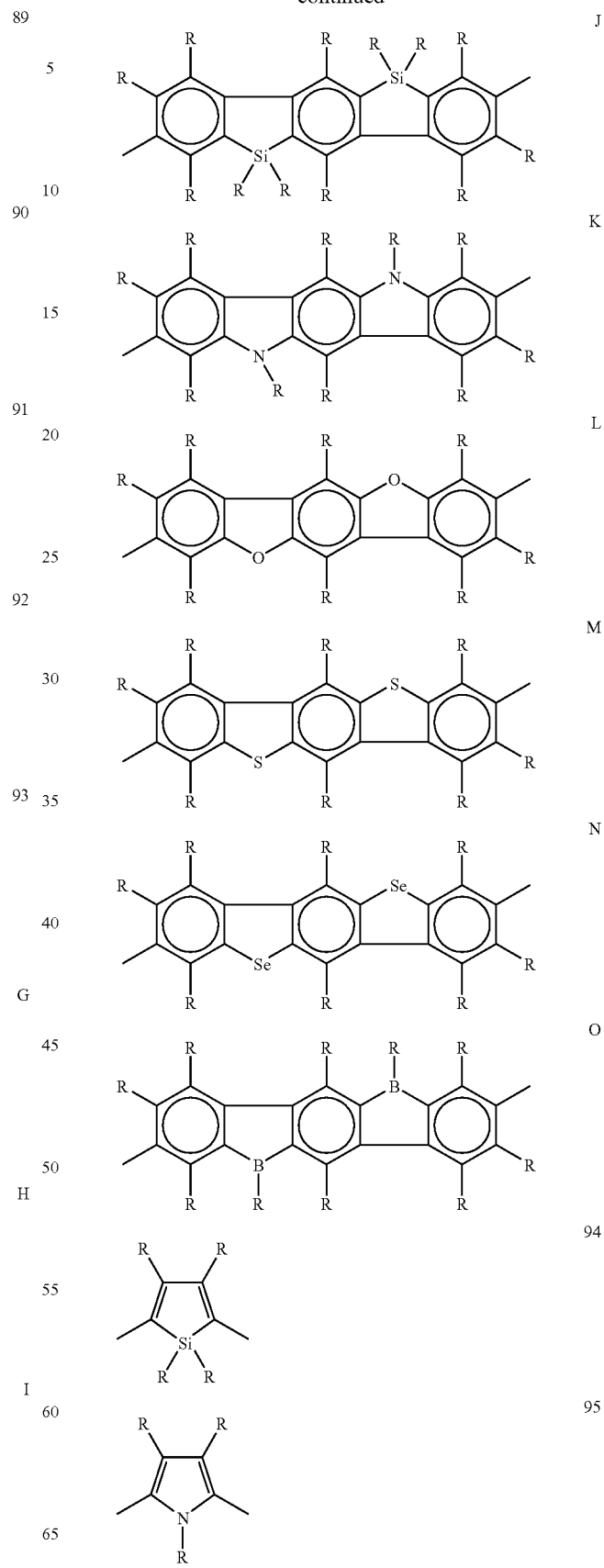

-continued
96
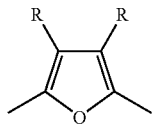
97
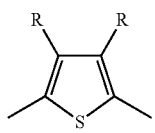
98
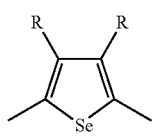
99
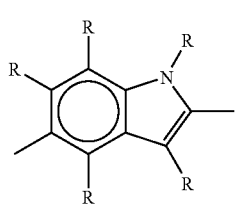
100
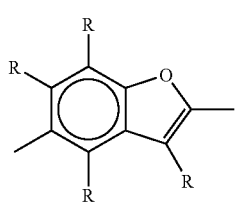
101
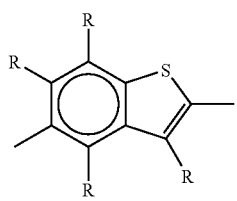
102
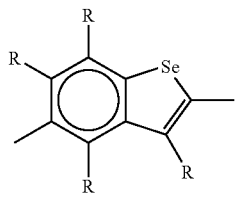
103
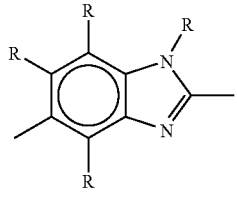
104
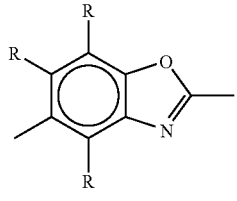
-continued
105
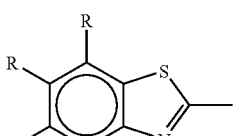
106
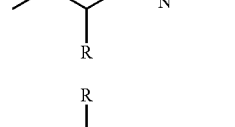
107
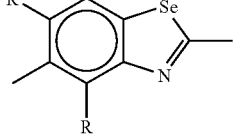
108
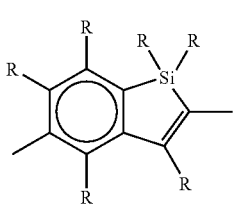
109
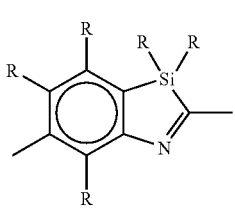
110
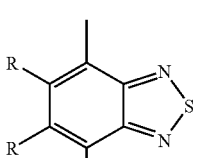
111
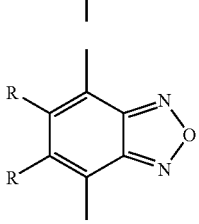
112
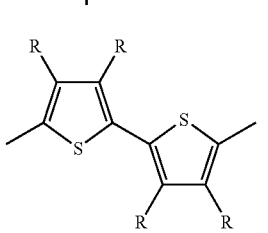
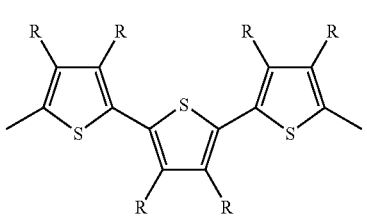

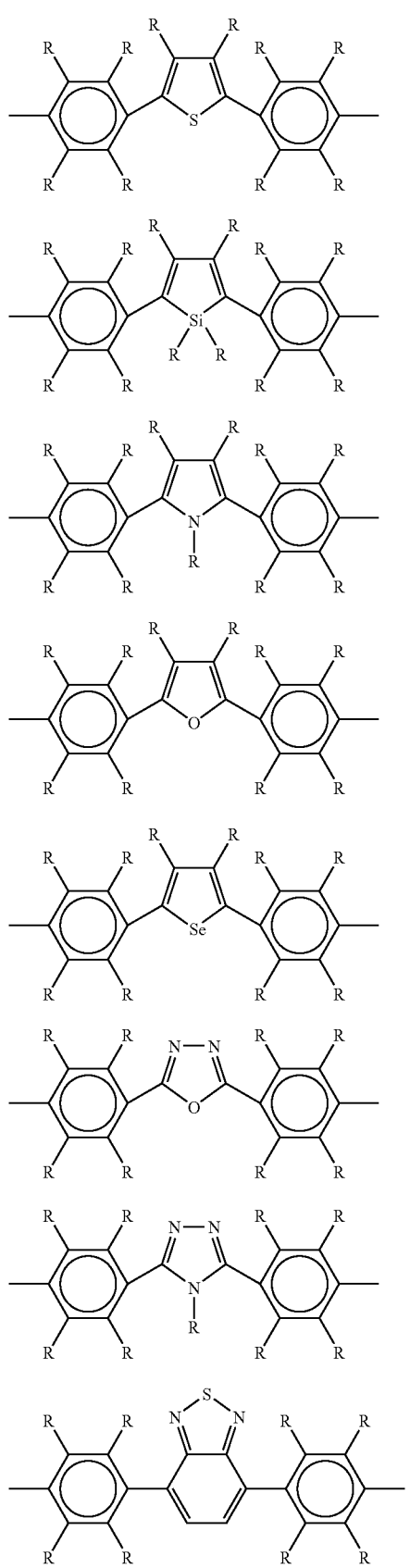

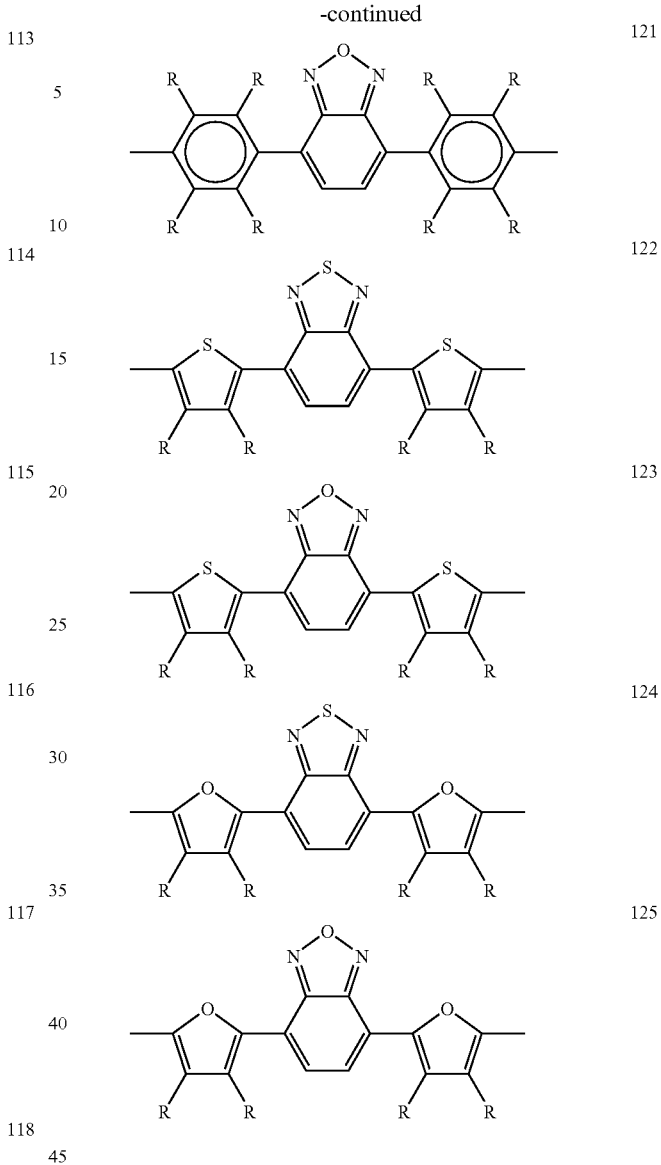

In the above formulas 1-125, and G-O, Rs each independently represent a hydrogen atom, alkyl group, alkoxy group, alkylthio group, aryl group, aryloxy group, arylthio group, arylalkyl group, arylalkoxy group, arylalkylthio group, aryl alkenyl group, arylalkynyl group, amino group, substituted amino group, silyl group, substituted silyl group, silyloxy group, substituted silyloxy group, halogen atom, acyl group, acyloxy group, imino group, amide group, imide group, monovalent heterocyclic group, carboxyl group, substituted carboxyl group, or cyano group.

Here, the alkyl group may be any of linear, branched, or cyclic, and usually has about 1 to 20 carbon atoms. Examples thereof include a methyl group, ethyl group, propyl group, i-propyl group, butyl group, i-butyl group, t-butyl group, pentyl group, hexyl group, cyclohexyl group, heptyl group, octyl group, 2-ethylhexyl group, nonyl group, decyl group, 3,7-dimethyloctyl group, lauryl group, trifluoromethyl group, pentafluoroethyl group, perfluorobutyl group, perfluorohexyl group, perfluorooctyl group, etc. Among them, pentyl group, hexyl group, octyl group, 2-ethylhexyl group, decyl group, and 3,7-dimethyloctyl group are preferable.

The alkoxy group may be any of linear, branched, or cyclic, and usually has about 1 to 20 carbon atoms. Examples thereof include a methoxy group, ethoxy group, propyloxy group, i-propyloxy group, butoxy group, i-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group, trifluoromethoxy group, pentafluoroethoxy group, perfluorobutoxy group, perfluorohexyl group, perfluorooctyl group, methoxymethyloxy group, 2-methoxyethyloxy group, etc. Among them, pentyloxy group, hexyloxy group, octyloxy group, 2-ethylhexyloxy group, decyloxy group, and 3,7-dimethyl octyloxy group are preferable.

The alkylthio group may be any of linear, branched, or cyclic, and usually has about 1 to 20 carbon atoms. Examples thereof include a methylthio group, ethylthio group, propylthio group, and i-propylthio group, butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group, trifluoromethylthio group, etc. Among them, pentylthio group, hexylthio group, octylthio group, 2-ethylhexylthio group, decylthio group, and 3,7-dimethyl octylthio group are preferable.

The aryl group usually has about 6 to 60 carbon atoms. Examples thereof include a phenyl group, and $C_1$-$C_{12}$ alkoxyphenyl group ($C_1$-$C_{12}$ means the number of carbon atoms of 1 to 12), $C_1$-$C_{12}$ alkylphenyl group, 1-naphthyl group, 2-naphthyl group, 1-anthracenyl group, 2-anthracenyl group, 9-anthracenyl group, pentafluoro phenyl group, etc. Among them, $C_1$-$C_{12}$ alkoxyphenyl group, and $C_1$-$C_{12}$ alkylphenyl group are preferable. Here, the aryl group is an atomic group in which one hydrogen atom is removed from an aromatic hydrocarbon. The aromatic hydrocarbon includes those containing a condensed ring, and those containing two or more independent benzene rings, or condensed rings bonded through a group such as a direct bond, a vinylene group or the like.

Examples of $C_1$-$C_{12}$ alkoxy include a methoxy, ethoxy, propyloxy, i-propyloxy, butoxy, i-butoxy, t-butoxy, pentyloxy, hexyloxy, cyclohexyloxy, heptyloxy, octyloxy, 2-ethylhexyloxy, nonyloxy, decyloxy, 3,7-dimethyl octyloxy, lauryloxy, etc.

Examples of $C_1$-$C_{12}$ alkyl include a methyl, ethyl, propyl, i-propyl, butyl, i-butyl, t-butyl, pentyl, hexyl, cyclohexyl, heptyl, octyl, 2-ethylhexyl, nonyl, decyl, 3,7-dimethyloctyl, lauryl, etc.

The aryloxy group usually has about 6 to 60 carbon atoms. Examples thereof include a phenoxy group, $C_1$-$C_{12}$ alkoxyphenoxy group, $C_1$-$C_{12}$ alkylphenoxy group, 1-naphtyloxy group, 2-naphtyloxy group, pentafluorophenyloxy group, etc. Among them, $C_1$-$C_{12}$ alkoxyphenoxy group, and $C_1$-$C_{12}$ alkylphenoxy group are preferable.

The arylthio group usually has about 6 to 60 carbon atoms. Examples thereof include a phenylthio group, $C_1$-$C_{12}$ alkoxyphenylthio group, $C_1$-$C_{12}$ alkylphenylthio group, 1-naphthylthio group, 2-naphthylthio group, pentafluoro phenylthio group, etc. Among them, $C_1$-$C_{12}$ alkoxy phenylthio group, and $C_1$-$C_{12}$ alkylphenylthio group are preferable.

The arylalkyl group usually has about 7 to 60 carbon atoms. Examples thereof include a phenyl-$C_1$-$C_{12}$ alkyl group, such as a phenylmethyl group, phenylethyl group, phenylbutyl group, phenylpentyl group, phenylhexyl group, phenylheptyl group, and phenyloctyl group; $C_1$-$C_{12}$ alkoxyphenyl-$C_1$-$C_{12}$ alkyl group, $C_1$-$C_{12}$ alkylphenyl-$C_1$-$C_{12}$ alkyl group, 1-naphtyl-$C_1$-$C_{12}$ alkyl group, 2-naphtyl-$C_1$-$C_{12}$ alkyl group, etc. Among them, $C_1$-$C_{12}$ alkoxyphenyl-$C_1$-$C_{12}$ alkyl group, and $C_1$-$C_{12}$ alkylphenyl-$C_1$-$C_{12}$ alkyl group are preferable.

The arylalkoxy group usually has about 7 to 60 carbon atoms. Examples thereof include phenyl-$C_1$-$C_{12}$ alkoxy group such as a phenylmethoxy group, phenylethoxy group, phenylbutoxy group, phenylpentyloxy group, phenylhexyloxy group, phenylheptyloxy group, and phenyloctyloxy group; $C_1$-$C_{12}$ alkoxyphenyl-$C_1$-$C_{12}$ alkoxy group, $C_1$-$C_{12}$ alkylphenyl-$C_1$-$C_{12}$ alkoxy group, 1-naphtyl-$C_1$-$C_{12}$ alkoxy group, 2-naphtyl-$C_1$-$C_{12}$ alkoxy group, etc. Among them, $C_1$-$C_{12}$ alkoxyphenyl-$C_1$-$C_{12}$ alkoxy group, and $C_1$-$C_{12}$ alkylphenyl-$C_1$-$C_{12}$ alkoxy group are preferable.

The arylalkylthio usually has about 7 to 60 carbon atoms. Examples thereof include a phenyl-$C_1$-$C_{12}$ alkylthio group, $C_1$-$C_{12}$ alkoxyphenyl-$C_1$-$C_{12}$ alkylthio group, $C_1$-$C_{12}$ alkylphenyl-$C_1$-$C_{12}$ alkylthio group, 1-naphtyl-$C_1$-$C_{12}$ alkylthio group, 2-naphtyl-$C_1$-$C_{12}$ alkylthio group, etc. Among them, $C_1$-$C_{12}$ alkoxyphenyl-$C_1$-$C_{12}$ alkylthio group, and $C_1$-$C_{12}$ alkyl phenyl-$C_1$-$C_{12}$ alkylthio group are preferable.

The aryl alkenyl usually has about 8 to 60 carbon atoms. Examples thereof include a phenyl-$C_2$-$C_{12}$ alkenyl group, $C_1$-$C_{12}$ alkoxyphenyl-$C_2$-$C_{12}$ alkenyl group, $C_1$-$C_{12}$ alkylphenyl-$C_2$-$C_{12}$ alkenyl group, 1-naphtyl-$C_2$-$C_{12}$ alkenyl group, 2-naphtyl-$C_2$-$C_{12}$ alkenyl group, etc. Among them, $C_1$-$C_{12}$ alkoxyphenyl-$C_2$-$C_{12}$ alkenyl group, and $C_1$-$C_{12}$ alkylphenyl-$C_2$-$C_{12}$ alkenyl group are preferable.

The aryl alkynyl usually has about 8 to 60 carbon atoms. Examples thereof include a phenyl-$C_2$-$C_{12}$ alkynyl group, $C_1$-$C_{12}$ alkoxyphenyl-$C_2$-$C_{12}$ alkynyl group, $C_1$-$C_{12}$ alkylphenyl-$C_2$-$C_{12}$ alkynyl group, 1-naphtyl-$C_2$-$C_{12}$ alkynyl group, 2-naphtyl-$C_2$-$C_{12}$ alkynyl group, etc. Among them, $C_1$-$C_{12}$ alkoxyphenyl-$C_2$-$C_{12}$ alkynyl group, and $C_1$-$C_{12}$ alkylphenyl-$C_2$-$C_{12}$ alkynyl group are preferable.

The substituted amino group means an amino group having one or two substituents selected from an alkyl group, aryl group, arylalkyl group, or a monovalent heterocyclic group. The substituted amino group has usually about 1 to 60 carbon atoms. Examples thereof include a methylamino group, dimethylamino group, ethylamino group, diethylamino group, propylamino group, dipropylamino group, i-propyl amino group, diisopropylamino group, butylamino group, i-butylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group, cyclopentylamino group, dicyclopentylamino group, cyclohexylamino group, dicyclohexylamino group, pyrrolidyl group, piperidyl group, ditrifluoromethylamino group, phenyl amino group, diphenylamino group, $C_1$-$C_{12}$ alkoxyphenylamino group, di($C_1$-$C_{12}$ alkoxyphenyl) amino group, di($C_1$-$C_{12}$ alkyl phenyl)amino group, 1-naphtylamino group, 2-naphtylamino group, pentafluorophenylamino group, pyridylamino group, pyridazinylamino group, pyrimidylamino group, pyrazylamino group, triazylamino group, phenyl-$C_1$-$C_{12}$ alkylamino group, $C_1$-$C_{12}$ alkoxyphenyl-$C_1$-$C_{12}$ alkylamino group, $C_1$-$C_{12}$ alkyl phenyl-$C_1$-$C_{12}$ alkylamino group, di($C_1$-$C_{12}$ alkoxyphenyl-$C_1$-$C_{12}$ alkyl) amino group, di($C_1$-$C_{12}$ alkylphenyl-$C_1$-$C_{12}$ alkyl)amino group, 1-naphtyl-$C_1$-$C_{12}$ alkylamino group, 2-naphtyl-$C_1$-$C_{12}$ alkylamino group, carbazolyl group, etc.

The substituted silyl group means a silyl group having 1, 2 or 3 substituents selected from an alkyl group, aryl group, arylalkyl group, or a monovalent heterocyclic group. The substituted silyl group has usually about 1 to 60 carbon atoms. Examples thereof include a trimethyl silyl group, triethyl silyl group, tripropyl silyl group, tri-i-propyl silyl group, dimethyl-i-propyl silyl group, diethyl-i-propyl silyl group, t-butyldimethylsilyl group, pentyldimethyl silyl group, hexyldimethyl silyl group, heptyldimethyl silyl group, octyldimethyl silyl group, 2-ethylhexyl-dimethyl silyl group, nonyldimethyl silyl group, decyldimethyl silyl group, 3,7-dimethyloctyl-dimethyl silyl group, lauryldimethyl silyl group, phenyl-$C_1$-$C_{12}$ alkyl silyl group, $C_1$-$C_{12}$ alkoxyphenyl-$C_1$-$C_{12}$ alkyl silyl group, $C_1$-$C_{12}$ alkyl phenyl-$C_1$-$C_{12}$ alkyl silyl group, 1-naphtyl-$C_1$-$C_{12}$ alkyl silyl group, 2-naphtyl-$C_1$-$C_{12}$ alkyl silyl group, phenyl-$C_1$-$C_{12}$ alkyldimethyl silyl group, triphenyl silyl group, tri-p-xylyl silyl group, tribenzyl silyl group, diphenylmethyl silyl group, t-butyldiphenyl silyl group, dimethylphenyl silyl group, trimethoxy silyl group, triethoxy silyl group, tripropyloxy silyl group, tri-i-propyl silyl group, dimethyl-i-propyl silyl group, methyldimethoxy silyl group, ethyldimethoxy silyl group, etc.

The substituted silyloxy group means a silyloxy group having 1, 2 or 3 substituents selected from an alkyl group, aryl group, arylalkyl group, or a monovalent heterocyclic group. The substituted silyl group has usually about 1 to 60 carbon atoms. Examples thereof include a trimethyl silyloxy group, triethyl silyloxy group, tripropyl silyloxy group, tri-i-propyl silyloxy group, dimethyl-i-propyl silyloxy group, diethyl-i-propyl silyloxy group, t-butyldimethyl silyloxy group, pentyldimethyl silyloxy group, hexyldimethyl silyloxy group, heptyldimethyl silyloxy group, octyldimethyl silyloxy group, 2-ethylhexyl-dimethyl silyloxy group, nonyldimethyl silyloxy group, decyldimethyl silyloxy group, 3,7-dimethyloctyl-dimethyl silyloxy group, lauryldimethyl silyloxy group, phenyl-$C_1$-$C_{12}$ alkyl silyloxy group, $C_1$-$C_{12}$ alkoxyphenyl-$C_1$-$C_{12}$ alkyl silyloxy group, $C_1$-$C_{12}$ alkylphenyl-$C_1$-$C_{12}$ alkyl silyloxy group, 1-naphtyl-$C_1$-$C_{12}$ alkyl silyloxy group, 2-naphtyl-$C_1$-$C_{12}$ alkyl silyloxy group, phenyl-$C_1$-$C_{12}$ alkyl dimethyl silyloxy group, triphenyl silyloxy group, tri-p-xylyl silyloxy group, tribenzyl silyloxy group, diphenylmethyl silyloxy group, t-butyldiphenyl silyloxy group, dimethylphenyl silyloxy group, trimethoxy silyloxy group, triethoxy silyloxy group, tripropyloxy silyloxy group, tri-i-propyl silyloxy group, dimethyl-i-propyl silyloxy group, methyldimethoxy silyloxy group, ethyldimethoxy silyloxy group, etc.

The halogen atom may be, for example, a fluorine atom, a chlorine atom, a bromine atom, and an iodine atom.

The acyl group usually has about 2 to 20 carbon atoms, and examples thereof include an acetyl group, propionyl group, butyryl group, isobutyryl group, pivaloyl group, benzoyl group, trifluoroacetyl group, pentafluorobenzoyl group, etc.

The acyloxy group usually has about 2 to 20 carbon atoms, and examples thereof include an acetoxy group, propionyloxy group, butyryloxy group, isobutyryloxy group, pivaloyloxy group, benzoyloxy group, trifluoro acetyloxy group, pentafluorobenzoyloxy group, etc.

The imino group usually has about 2 to 20 carbon atoms, and examples thereof include the following groups.

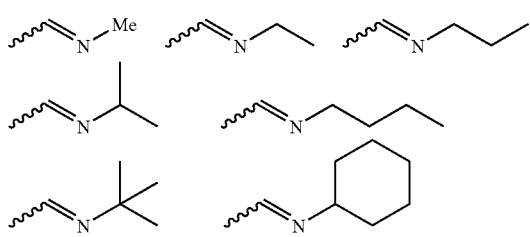

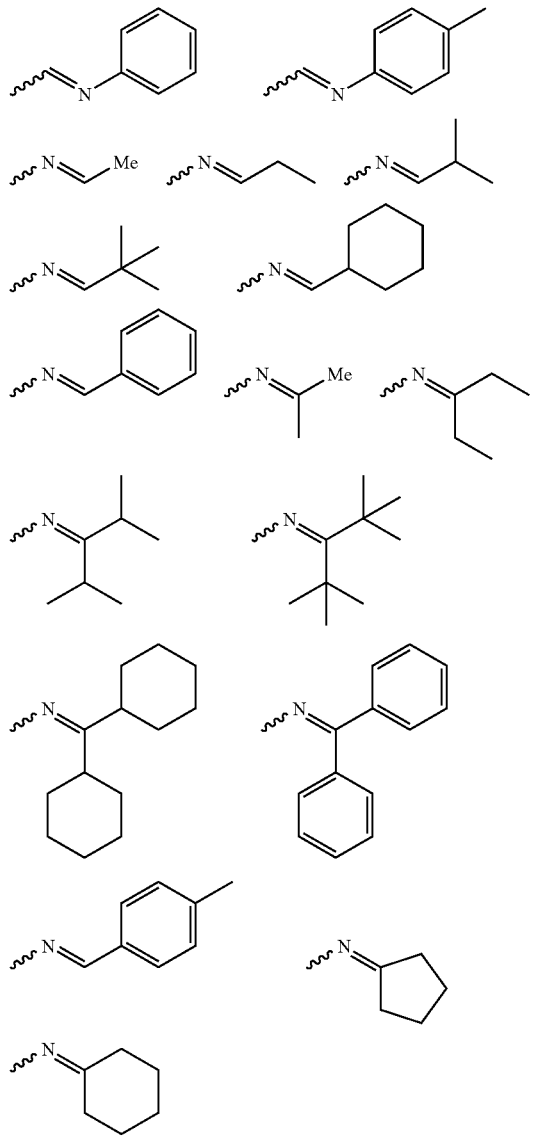

The amide group usually has about 1 to 20 carbon atoms, and examples thereof include formamide group, acetamide group, propioamide group, butyroamide group, benzamide group, trifluoroacetamide group, pentafluorobenzamide group, diformamide group, diacetamide group, dipropioamide group, dibutyroamide group, dibenzamide group, ditrifluoro acetamide group, dipentafluorobenzamide group, etc.

The imide group usually has about 4 to 20 carbon atoms, and examples thereof include the following groups.

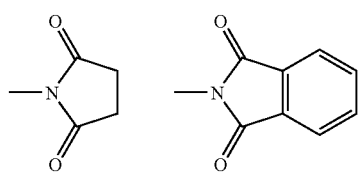

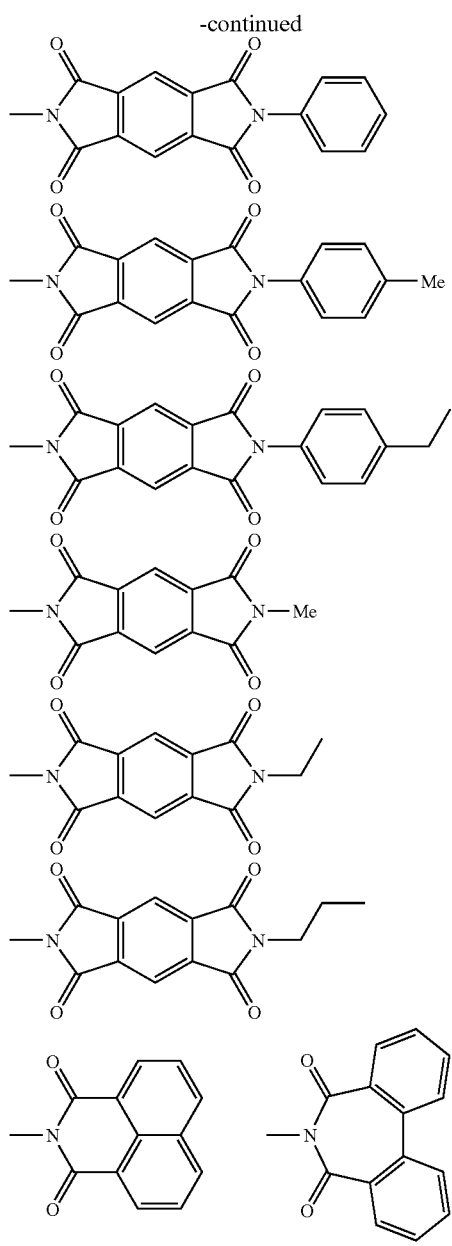

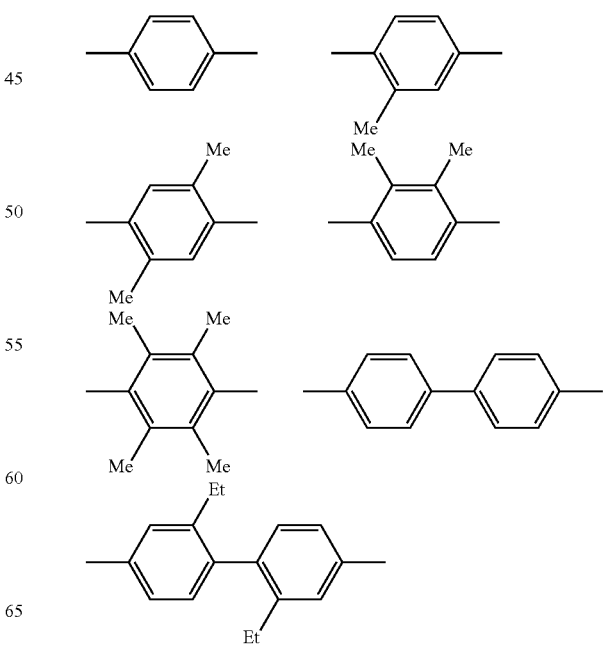

In the above formulas, Me represents a methyl group.

The monovalent heterocyclic group is an atomic group in which a hydrogen atom is removed from a heterocyclic compound, which may have a substituent. The monovalent heterocyclic group usually has about 4 to 60 carbon atoms, preferably 4 to 20, without including the number of carbon atoms of the substituent. As the monovalent heterocyclic group, thienyl group, $C_1$-$C_{12}$ alkylthienyl group, pyroryl group, furyl group, pyridyl group, $C_1$-$C_{12}$ alkylpyridyl group, etc. are exemplified, and thienyl group, $C_1$-$C_{12}$ alkylthienyl group, pyridyl group, and $C_1$-$C_{12}$ alkylpyridyl group are preferable.

The substituted carboxyl group usually has about 2 to 60 carbon atoms, and means a carboxyl group which has a substituent of an alkyl group, aryl group, arylalkyl group, or monovalent heterocyclic group. Examples thereof include a methoxy carbonyl group, ethoxy carbonyl group, propoxy carbonyl group, i-propoxy carbonyl group, butoxy carbonyl group, i-butoxy carbonyl group, t-butoxy carbonyl group, pentyloxy carbonyl group, hexyloxy carbonyl group, cyclohexyloxy carbonyl group, heptyloxy carbonyl group, octyloxy carbonyl group, 2-ethylhexyloxy carbonyl group, nonyloxy carbonyl group, decyloxy carbonyl group, 3,7-dimethyloctyloxy carbonyl group, dodecyloxy carbonyl group, trifluoromethoxy carbonyl group, pentafluoroethoxy carbonyl group, perfluorobutoxy carbonyl group, perfluorohexyloxy carbonyl group, perfluorooctyloxy carbonyl group, phenoxy carbonyl group, naphtoxy carbonyl group, pyridyloxy carbonyl group, etc.

In the above example, a plurality of Rs contained in one structural formula may be the same or different. In order to improve the solubility into a solvent, it is preferable that at least one of the Rs in one structural formula is other than a hydrogen atom, and it is preferable that the form of the repeating unit including the substituent has little symmetry. Moreover, it is preferable that at least one of Rs in one structural formula contains a cyclic or branched alkyl group. A plurality of Rs may be connected to form a ring.

In the above formula, when R is a substituent containing alkyl group, the alkyl group may be linear, branched or cyclic one, or the combination thereof. As the alkyl chain which is not linear, exemplified are isoamyl group, 2-ethylhexyl group, 3,7-dimethyloctyl group, cyclohexyl group, 4-$C_1$-$C_{12}$ alkylcyclohexyl group, etc., Furthermore, methyl or methylene as a part of said alkyl chain may be replaced by a group containing a hetero atom, or a methyl or methylene group which is substituted with one or more fluorine atoms. The hetero atom may be, for example, an oxygen atom, a sulfur atom, a nitrogen atom, etc.

In the above formula (1), $Ar_1$, $Ar_2$, $Ar_3$ and $Ar_4$ are preferably arylene groups, and more preferably, as shown below, a substituted or non-substituted phenylene group, substituted or non-substituted biphenyl-diyl group, substituted or non-substituted fluorene-diyl group, and substituted or non-substituted stilbene-diyl group.

-continued

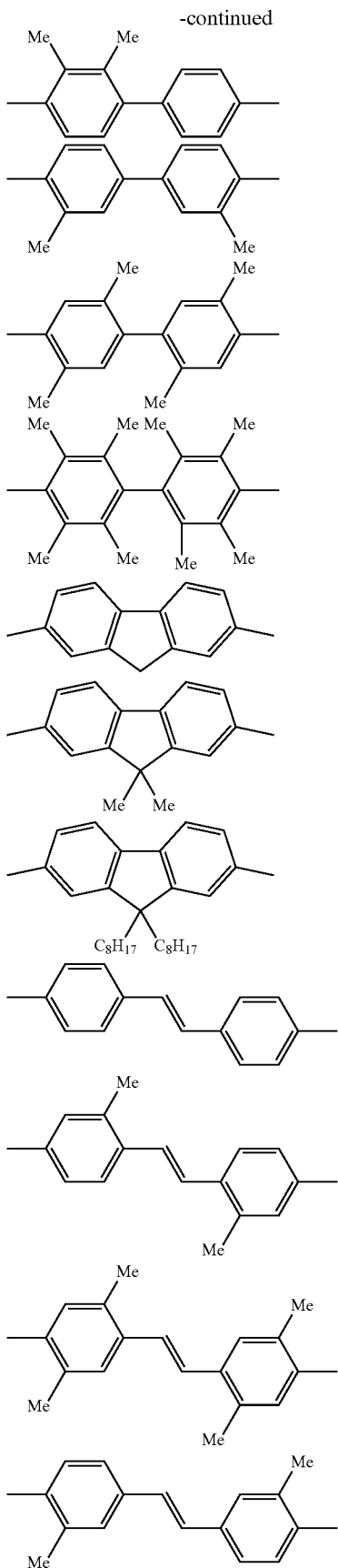

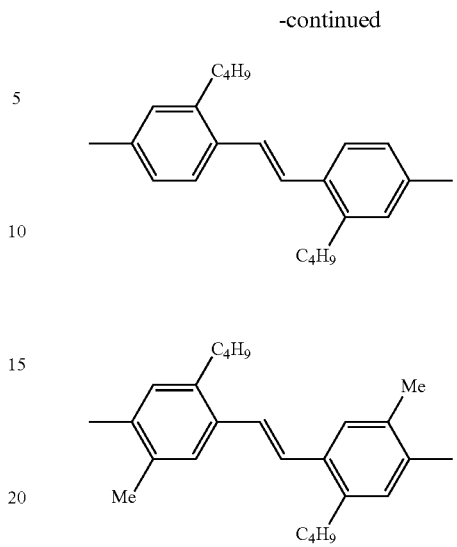

An unsubstituted phenylene group is especially preferable.

In the above formula (1), $E_1$, $E_2$, and $E_3$ each independently represent the below aryl group (A) or heterocyclic group (B);

aryl group (A): an aryl group which has three or more substituents selected from an alkyl group, alkoxy group, alkylthio group, aryl group, aryloxy group, arylthio group, arylalkyl group, arylalkoxy group, arylalkylthio group, aryl alkenyl group, arylalkynyl group, amino group, substituted amino group, silyl group, substituted silyl group, silyloxy group, substituted silyloxy group, monovalent heterocyclic group, or halogen atom, heterocyclic group (B): a monovalent heterocyclic group which has one or more substituents selected from an alkyl group, alkoxy group, alkylthio group, aryl group, aryloxy group, arylthio group, arylalkyl group, arylalkoxy group, arylalkylthio group, aryl alkenyl group, arylalkynyl group, amino group, substituted amino group, silyl group, substituted silyl group, silyloxy group, substituted silyloxy group, monovalent heterocyclic group, or halogen atom, and the total number of substituents and hetero atoms of the heterocyclic ring is three or more.

Here as the substituent in the above (A), the alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, silyloxy group, substituted silyloxy group, and monovalent heterocyclic group mean the same as those described above.

Among them, alkyl group, alkoxy group, alkylthio group, aryl group, aryloxy group, arylthio group, substituted amino group, substituted silyl group, substituted silyloxy group, and monovalent heterocyclic group are preferable, and alkyl group, alkoxy group, arylthio group, substituted silyl group, and substituted silyloxy group are more preferable. Alkyl group, alkoxy group, and arylthio group are especially preferable.

Examples of the aryl group satisfying the above (A) include the following.

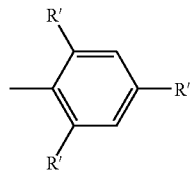
A1
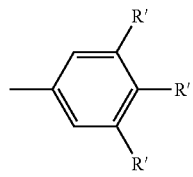
A2
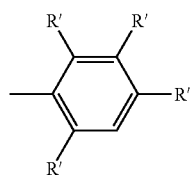
A3
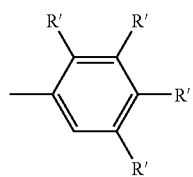
A4
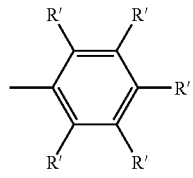
A5
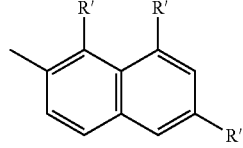
A6
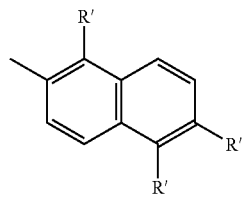
A7
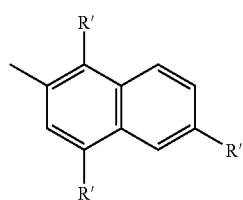
A8
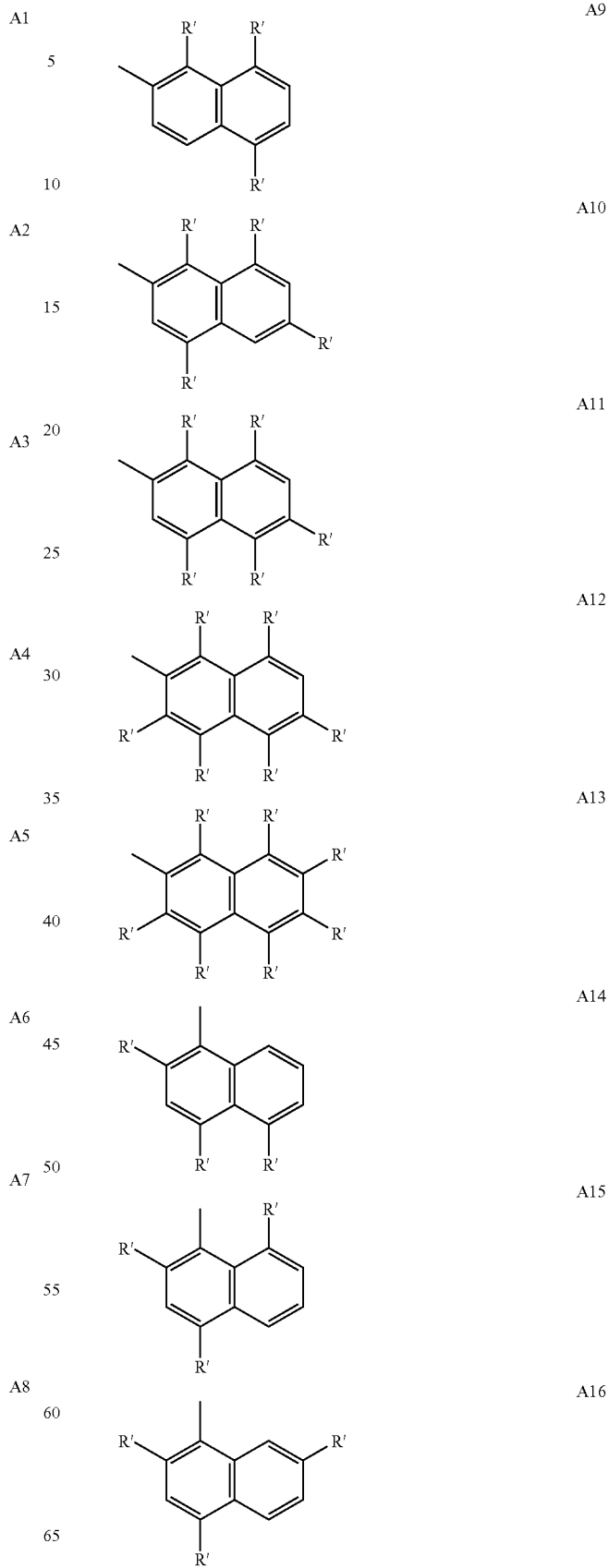

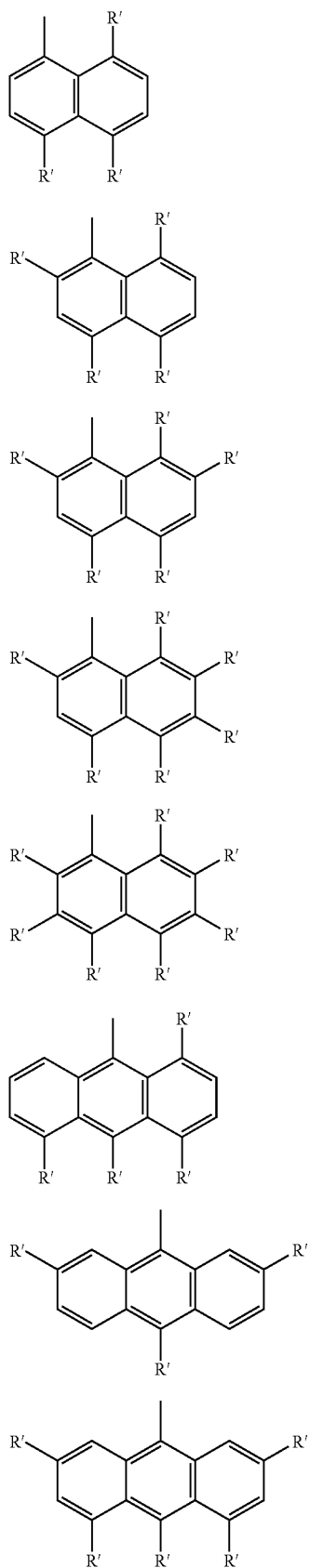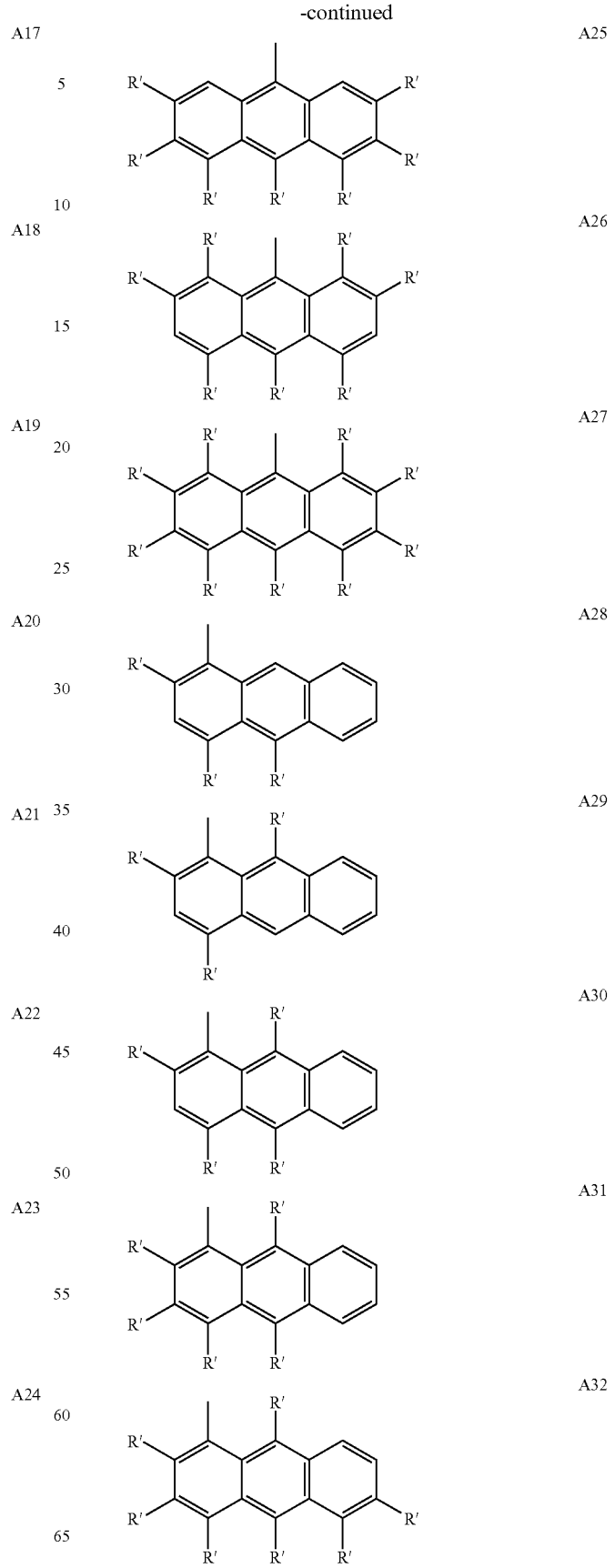

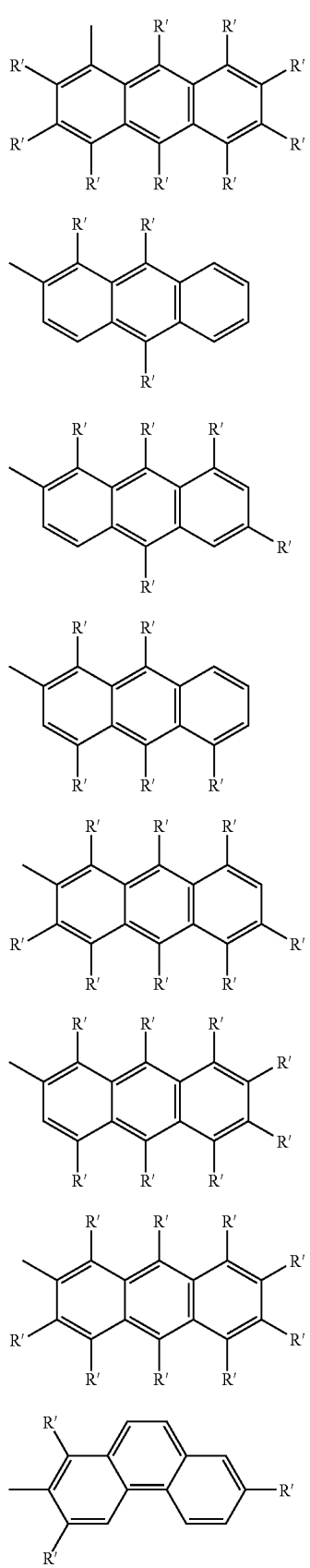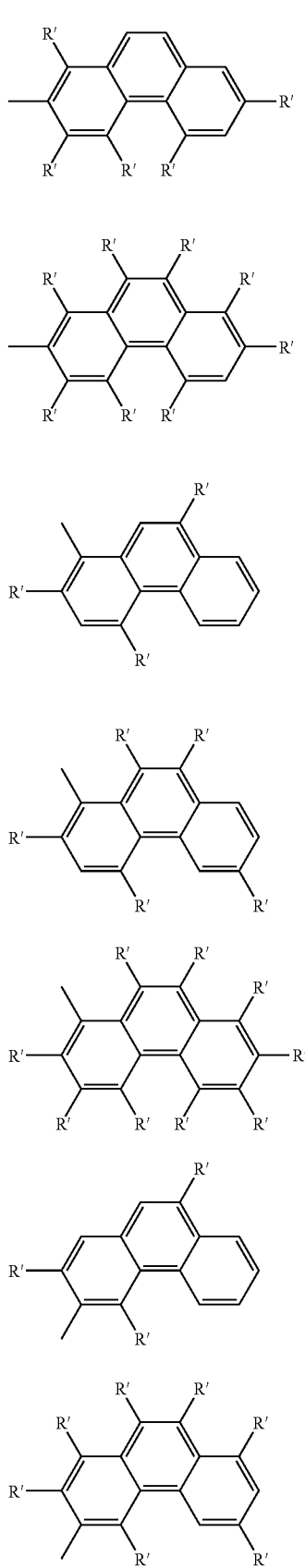

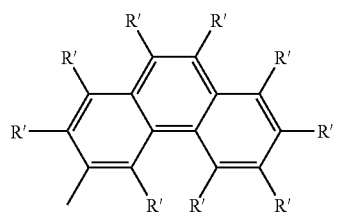 A48
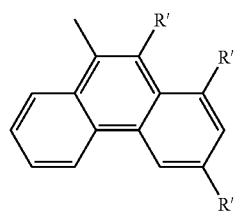 A49
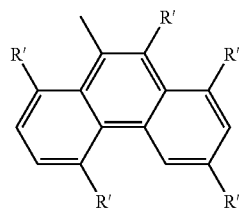 A50
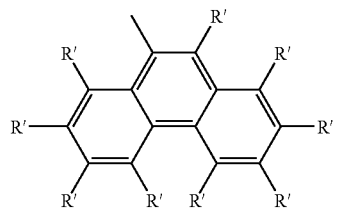 A51
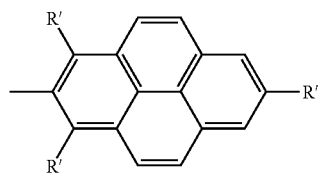 A52
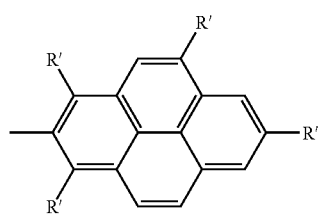 A53
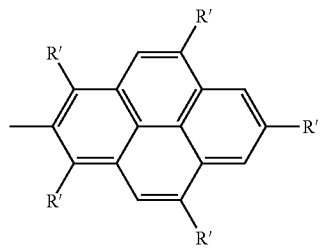 A54
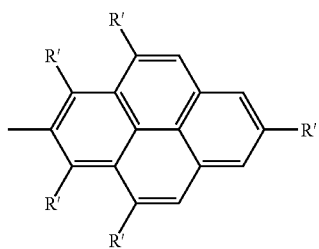 A55
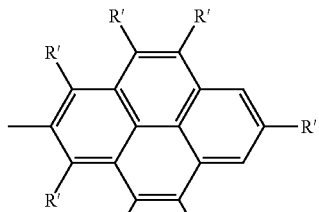 A56
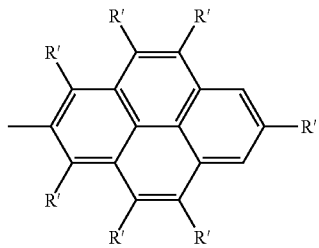 A57
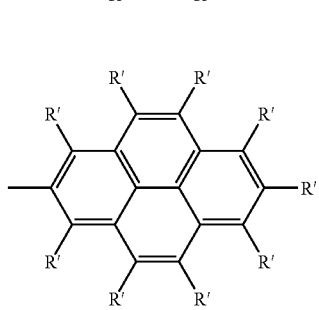 A58
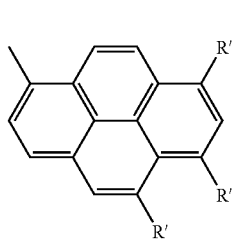 A58
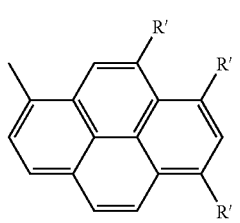 A59
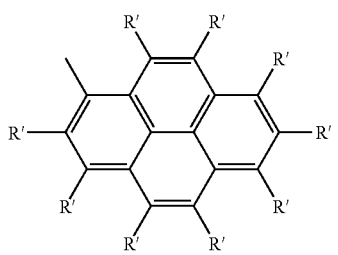 A60

-continued

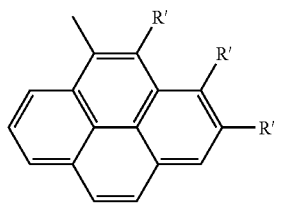
A61

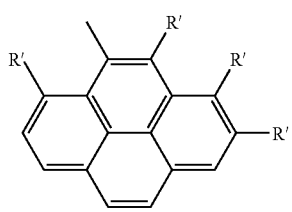
A62

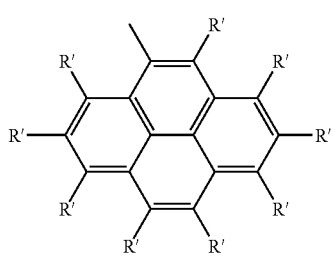
A63

In the above formulas, R's each independently represent a substituent selected from an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, silyloxy group, substituted silyloxy group, monovalent heterocyclic group, or halogen atom.

Examples of the monovalent heterocyclic group satisfying the above (B) include the following.

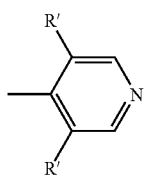
B1

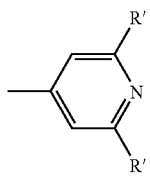
B2

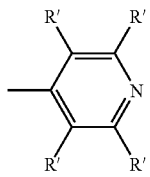
B3

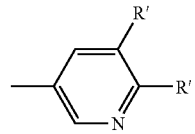
B4

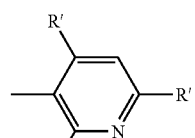
B5

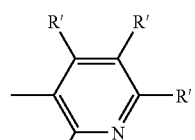
B6

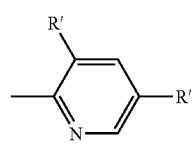
B7

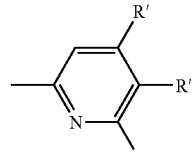
B8

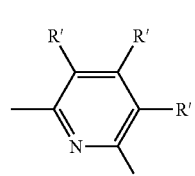
B9

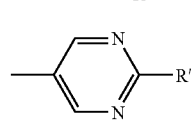
B10

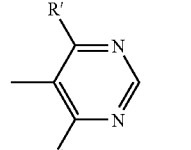
B11

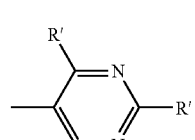
B12

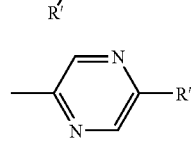
B13

-continued

B14 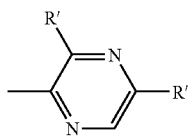

B15 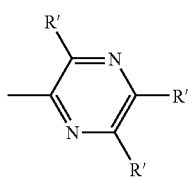

B16 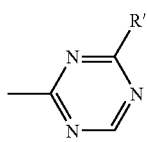

B17 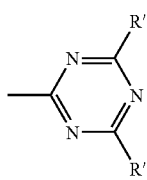

B18 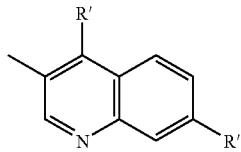

B19 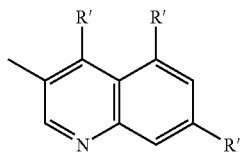

B20 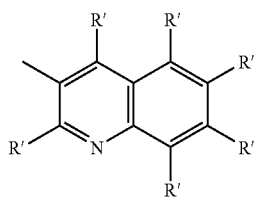

B21 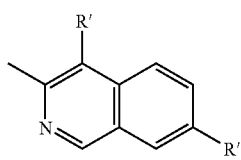

B22 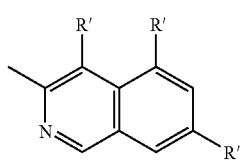

-continued

B23 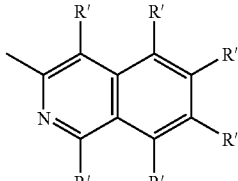

B24 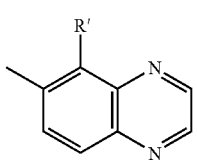

B25 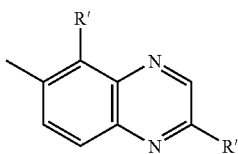

B25 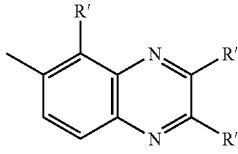

B26 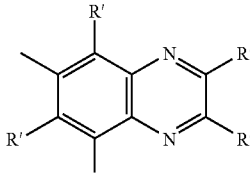

In the formulas, R's represent the same groups as the above.

In the above formula (1), $E_1$, $E_2$, and $E_3$ represent preferably the above aryl group (A). More preferably, the aryl group satisfies the following (C).

(C): An arylamine compound derived from aryl group (A) by replacing the free bond of aryl group (A) with amino group, and by replacing all the substituents of aryl group (A) with hydrogen atoms, is considered for the calculation; one of the highest occupied molecular orbitals (HOMO) of the arylamine compound calculated by AM1 method which is a semi-empirical molecular orbital method, is arbitrarily selected; sum square values of atomic orbital coefficients of the HOMO are calculated only about the carbon atoms to which a hydrogen atom is bonded, and three or more carbon atoms are selected from the carbon atoms having large sum square value in descending order.

The sum squares ($\rho_m^{HOMO}$) of atomic orbital coefficients in the highest occupied molecular orbitals (HOMO) of carbon atoms in (c) is obtained according to the following equation by a semi-empirical molecular orbital method, AM1 method (Dewar, M. J. S. et. al., J. Am. Chem. Soc., 107, 3902 (1985)).

$$\rho_m^{HOMO} = \Sigma_u (C_{mu}^{HOMO})^2$$

Here, m represents a mark showing a carbon atom, u represents a mark showing atomic orbital taken into consideration in the AM1 method corresponding to the carbon atom.

$C_{mu}^{HOMO}$ represents atomic orbital coefficient represented by u of HOMO of the carbon atom.

Comparison of the sum square values of atomic orbital coefficients is made using two significant figures. When there are two or more carbon atoms having same sum square values of atomic orbital coefficients, any of these carbon atoms can be selected as the carbon atom having a substituent.

As the aryl group which has substituents on the carbon atoms selected by the above (C), cases of phenyl group, 1-naphthyl group, 2-naphthyl group, and 2-pyrenyl group are specifically explained. That is, all the substituents of the aryl group are replaced with hydrogen atoms, and the free bond is replaced with amino group to produce an amine compound, and atomic orbital coefficients of the amine compound are calculated using a molecular orbital calculation program, WinMOPAC 3.0 Professional (key word: AM1 PRECISE EF VECTORS) with optimizing the structure by AM1 method. Position numbers of carbon atom of respective amine compounds are shown as follows. The calculation results are shown in Table 1.

Examples of the aryl group and corresponding arylamine compound for calculation.

TABLE 1

| Aryl group | Position No. of carbon atom | Sum squares ($\rho_m^{HOMO}$) of atomic orbital coefficient | Order of priority having substituent |
|---|---|---|---|
| Phenyl | 2 | 0.146 | 2 |
|  | 3 | 0.024 | 4 |
|  | 4 | 0.239 | 1 |
|  | 5 | 0.024 | 4 |
|  | 6 | 0.146 | 2 |
| 1-Naphthyl | 2 | 0.175 | 2 |
|  | 3 | 0.042 | 6 |
|  | 4 | 0.224 | 1 |
|  | 5 | 0.079 | 3 |
|  | 6 | 0.023 | 7 |
|  | 7 | 0.059 | 5 |
|  | 8 | 0.060 | 4 |
| 2-Naphthyl | 1 | 0.246 | 1 |
|  | 3 | 0.012 | 6 |
|  | 4 | 0.055 | 4 |
|  | 5 | 0.050 | 5 |
|  | 6 | 0.120 | 2 |
|  | 7 | 0.001 | 7 |
|  | 8 | 0.092 | 3 |
| 2-Pyrenyl | 1 | 0.106 | 1 |
|  | 3 | 0.106 | 1 |
|  | 4 | 0.013 | 6 |
|  | 5 | 0.050 | 4 |
|  | 6 | 0.007 | 8 |
|  | 7 | 0.069 | 3 |
|  | 8 | 0.007 | 8 |
|  | 9 | 0.050 | 4 |
|  | 10 | 0.013 | 6 |

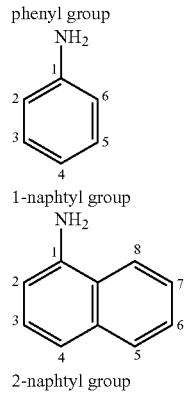

phenyl group 1-naphtyl group 2-naphtyl group 2-pyrenyl

About each carbon atoms of Table 1, the sum square values of $\rho_m^{HOMO}$ (atomic orbital coefficient)$^2$ are compared, and the carbon atoms to have a substituent are selected in descending order from the largest value of $\rho_m^{HOMO}$. For example, in the case of phenyl group, the position numbers of carbon atoms are arranged as 4>2, 6>3, 5 in descending order of $\rho_m^{HOMO}$. In the case of three substituents, the phenyl group which satisfies (C) is a phenyl group having substituents on the carbon atom of position number 4, 2 and 6 (the above formula A1). In the case of four substituents, since the $\rho_m^{HOMO}$ values of the carbon atoms of position number 3 and 5 are the same, the phenyl group has substituents on the carbon atoms of position number 4, 2, 6, and either 3 or 5 (the above formula A3). In the case of five substituents, the phenyl group has substituents on the carbon atoms of position number 4, 2, 6, 3 and 5 (above formula A5).

Furthermore, in the case of 1-naphthyl group, the carbon atom position numbers HOMO are arranged as 4>2>5>8>7>3>6 in descending order of $\rho_m^{HOMO}$. In the case of three substituents, 1-naphthyl group which satisfies (C) is a 1-naphthyl group having substituents on the carbon atoms of position number 4, 2, and 5 (the above formula A14). In case of five or more substituents, it is a 1-naphthyl group having substituents on the carbon atoms of the position number which are similarly selected in descending order of $\rho_m^{HOMO}$.

In the case of 2-naphthyl group, the position numbers of carbon atoms are arranged as 1>6>8>4>5>3>7 in descending order of $\rho_m^{HOMO}$. In the case of three substituents, 2-naphthyl group which satisfies (C) is a 2-naphthyl group having substituents on the carbon atoms of position number 1, 6 and 8 (the above formula A6). In the case of four substituents, 2-naphthyl group has substituents at 1, 6, 8, and 4 positions (the above formula A10). In case of five or more substituents, it is a 2-naphthyl group having substituents on the carbon atoms of the position number which are similarly selected in descending order of $\rho_m^{HOMO}$.

In the case of 2-pyrenyl group, the carbon atom position numbers are arranged as 1,3>7>5,9>4,10>6,8 in descending order of $\rho_m^{HOMO}$. In the case of three substituents, 2-pyrenyl group which satisfies (C) is a 2-pyrenyl group having substituents on the carbon atoms of position number 1, 3 and 7 (the above formula A52). In the case of four substituents, since the values $\rho_m^{HOMO}$ of the carbon atoms of position number 5 and 9 are the same, it is a 2-pyrenyl group having substituents on the carbon atoms of position number 1, 3, 7 and either 5 or 9 (the above formula A53). In the case of five substituents, it is a 2-pyrenyl group having substituents on the carbon atoms of position number 1, 3, 7, 5 and 9 (the above formula A54). In the case of six or more substituents, it is a 2-pyrenyl group having substituents on the carbon atoms of position number, which are similarly selected in descending order of $\rho_m^{HOMO}$.

In the above formula (1), as $E_1$, $E_2$, and $E_3$, a phenyl, naphthyl, or anthracenyl group having three or more substituents is preferable, and those having three or more substituents on the carbon atoms selected by the above (C) are more preferable.

As $E_1$, $E_2$, and $E_3$ in the above formula (1), below formula (3) is especially preferable.

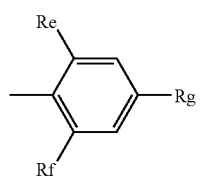

(3)

In the formula, Re, Rf and Rg each independently represent an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, silyloxy group, substituted silyloxy group, monovalent heterocyclic group, or halogen atom.

In the above formula (1), a and b each independently represent 0 or 1, and satisfies 0<=a+b<=1, preferably a+b=1.

Of the repeating unit of the above formula (1), preferable are those in which $Ar_1$, $Ar_2$, $Ar_3$, and $Ar_4$ are an arylene group each independently, and a+b=1. Preferably, the arylene group is a phenylene group, biphenyl-diyl group, fluorene-diyl group or stilbene-diyl group, and more preferably a phenylene group which has no substituent.

As the examples of the repeating unit represented by the above formula (1), the following are examples in which $Ar_1$, $Ar_2$, $Ar_3$, and $Ar_4$ are each independently phenylene groups having no substituent, and a=1 and b=0.

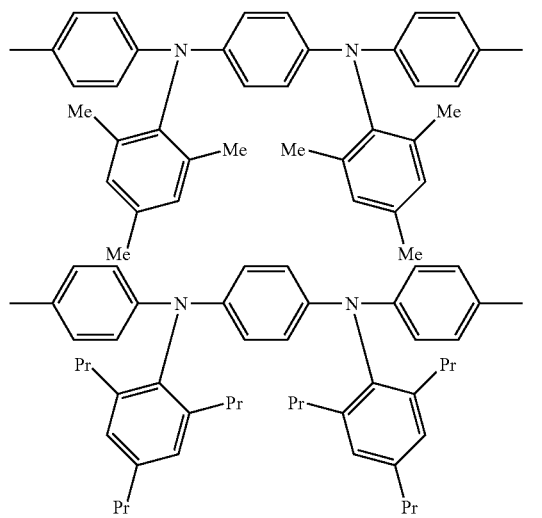

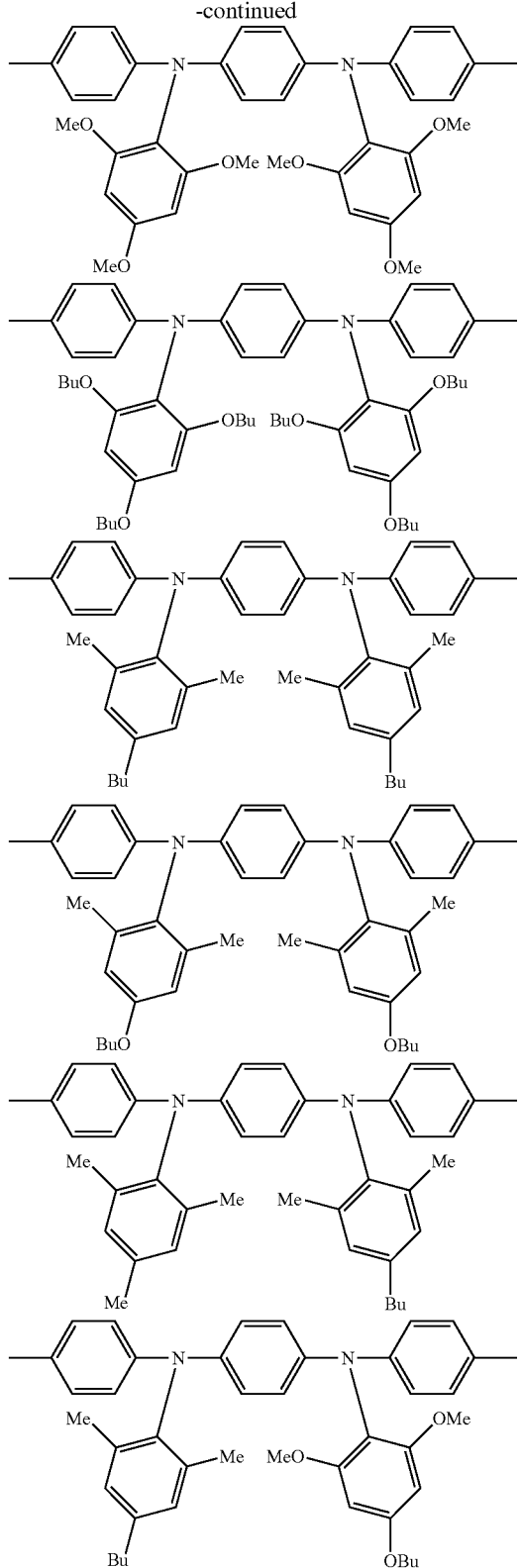

As the concrete examples of the repeating unit represented by the above formula (1), the following are examples in which $Ar_1$, $Ar_2$, $Ar_3$ and $Ar_4$ are each independently phenylene groups having no substituent, and a=0 or b=1.

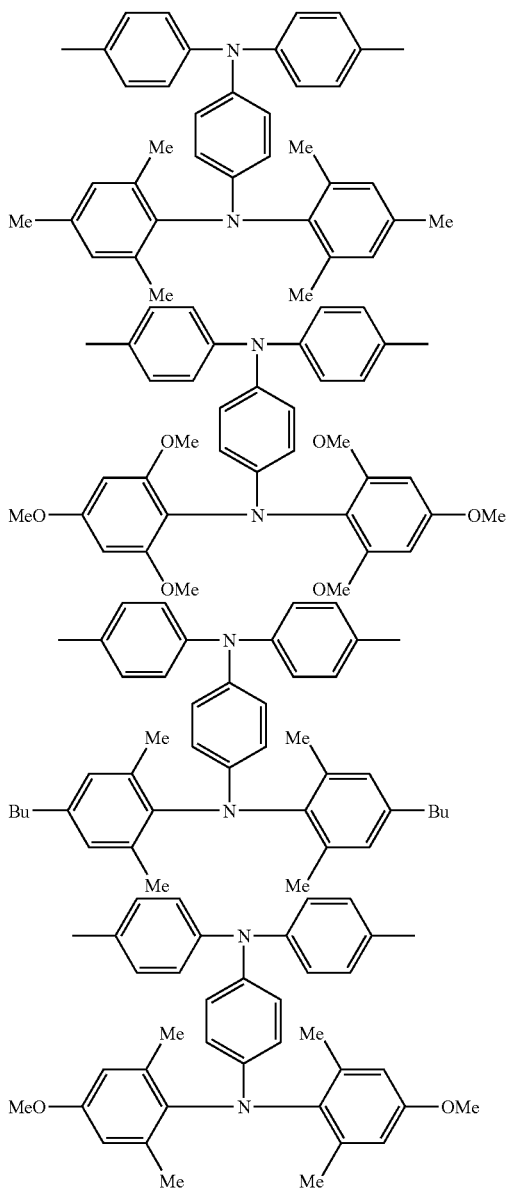

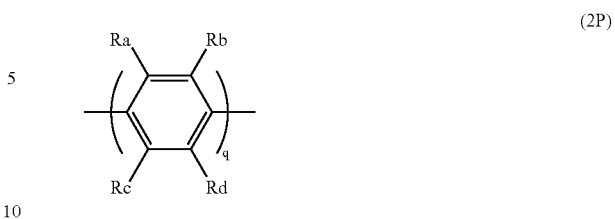

In the above formula, Me, Pr, Bu, MeO, and BuO respectively represents methyl group, propyl group, butyl group, methoxy group, and butyloxy group.

In the above formula (1), when $E_1$, $E_2$, and $E_3$ are represented by the above formula (3), Re and Rf are each independently preferably an alkyl group, alkoxy group, or alkylthio group having three or less carbon atoms, and Rg is an alkyl group, alkoxy group, or alkylthio group having 3 to 20 carbon atoms.

In the above formula (2), $Ar_5$, $Ar_6$, $Ar_7$, $Ar_8$, $Ar_9$, $Ar_{10}$, and $Ar_{11}$ each independently represent an arylene group or a divalent heterocyclic group.

Here, the arylene group or the divalent heterocyclic group means the same as above.

In the repeating unit of the above formula (2), it is preferable that $Ar_5$, $Ar_6$, $Ar_7$, $Ar_8$, $Ar_9$, $Ar_{10}$, and $Ar_{11}$ are each independently the groups represented by the below formula (2P).

In the formula, Ra, Rb, Rc, and Rd each independently represent a hydrogen atom, alkyl group, alkoxy group, alkylthio group, aryl group, aryloxy group, arylthio group, arylalkyl group, arylalkoxy group, arylalkylthio group, aryl alkenyl group, arylalkynyl group, amino group, substituted amino group, silyl group, substituted silyl group, silyloxy group, substituted silyloxy group, halogen atom, acyl group, acyloxy group, imino group, amide group, imide group, monovalent heterocyclic group, carboxyl group, substituted carboxyl group, or cyano group; q represents an integer of 1 to 3. When Ras, Rbs, Rcs, and Rds exist in plural, the plurality of Ras, Rbs, Rcs, or Rds may be the same or different. Moreover, the groups of 'Ra and Rb' as well as the groups of 'Rc and Rd' may be connected to form an aromatic ring together with the carbon atoms of the benzene ring to which the groups attach.

In the above formula (2P), as the aromatic ring formed by connecting the groups of 'Ra and Rb' or the groups of 'Rc and Rd' together with the carbon atoms of the benzene ring to which the groups attach, examples are: aromatic hydrocarbon rings such as benzene ring, naphthalene ring, anthracene ring, tetracene ring, pentacene ring, pyrene ring and phenanthrene ring; heterocyclic aromatic groups such as pyridine ring, bipyridine ring, phenanthroline ring, quinoline ring, isoquinoline ring, thiophene ring, furan ring and pyrrole ring. Among them, benzene ring, naphthalene ring and pyridine ring are preferable.

Said aromatic ring may have a substituent selected from an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, silyloxy group, substituted silyloxy group, halogen atom, acyl group, acyloxy group, imino group, amide group, imide group, monovalent heterocyclic group, carboxyl group, substituted carboxyl group, and cyano group. When the substituents exist in plural, the substituents may be the same or different.

In the above formula (2), $E_4$, $E_5$, $E_6$, $E_7$, $E_8$, and $E_9$ represent each independently an aryl group or a monovalent heterocyclic group. The aryl group and the monovalent heterocyclic group may have a substituent.

As the substituent, examples are: an alkyl group, alkoxy group, alkylthio group, aryl group, aryloxy group, arylalkyl group, arylalkoxy group, arylthio group, arylalkenyl group, arylalkynyl group, arylalkylthio group, amino group, substituted amino group, silyl group, substituted silyl group, silyloxy group, substituted silyloxy group, halogen atom, acyl group, acyloxy group, imino group, and amide group.

Here, the aryl group, monovalent heterocyclic group, and substituent are the same as above.

Moreover, $E_4$, $E_5$, $E_6$, $E_7$, $E_8$, and $E_9$ have the above substituent other than halogen atom or cyano group, the substituents themselves may be connected to form a ring.

In an above formula (2), $E_4$, $E_5$, $E_6$, $E_7$, $E_8$ and $E_9$ each independently represent preferably the below aryl group (A') or heterocyclic group (B'), aryl group (A'): an aryl group which has three or more substituents selected from an alkyl group, alkoxy group, alkylthio group, aryl group, aryloxy group, arylthio group, arylalkyl group, arylalkoxy group, arylalkylthio group, aryl alkenyl group, arylalkynyl group, amino group, substituted amino group, silyl group, substituted silyl group, silyloxy group, substituted silyloxy group, monovalent heterocyclic group, or halogen atom, heterocyclic group (B'): a monovalent heterocyclic group which has one or more substituents selected from an alkyl group, alkoxy group, alkylthio group, aryl group, aryloxy group, arylthio group, arylalkyl group, arylalkoxy group, arylalkylthio group, aryl alkenyl group, arylalkynyl group, amino group, substituted amino group, silyl group, substituted silyl group, silyloxy group, substituted silyloxy group, monovalent heterocyclic group, or halogen atom, and the total number of the substituent and hetero atoms of the heterocyclic ring is three or more.

Concrete examples of aryl group (A') and heterocyclic group (B') are the same as those exemplified as aryl group (A) and heterocyclic group (B), respectively.

In the above formula (2), $E_4$, $E_5$, $E_6$, $E_7$, $E_8$ and $E_9$, a phenyl, naphthyl, or anthracenyl group having three or more substituents is preferable, and those having three or more substituents on the carbon atoms selected by the following (C') are more preferable.

(C'): An arylamine compound derived from aryl group (A') by replacing the free bond of aryl group (A') with amino group, and by replacing all the substituents of aryl group (A') with hydrogen atoms, is considered for the calculation; one of the highest occupied molecular orbitals (HOMO) of the arylamine compound calculated by AM1 method which is a semi-empirical molecular orbital method, is arbitrarily selected; sum square values of atomic orbital coefficients of the HOMO are calculated only about the carbon atoms to which a hydrogen atom is bonded, and three or more carbon atoms are selected from the carbon atoms having large sum square value in descending order.

Concrete examples of the aryl group (A') which satisfies the above (C') are the same as those exemplified as aryl group (A)

In the above formula (2), it is preferable that $E_4$, $E_5$, $E_6$, $E_7$, $E_8$, and $E_9$ are each independently a phenyl group, naphthyl group, or anthracenyl group, which satisfies the above (C). Especially preferable are those represented by the above formula (3).

In the formula (2), l, m and n each independently represent an integer of 0 to 2; and o and p each independently represent 0 or 1; l+m+n+o+p is two or more, and preferably 12 or less.

In view of solubility, it is preferable the repeating unit represented by the above formula (2) has one or more substituents.

In the above formula (2), when $Ar_6$, $Ar_8$, $Ar_9$,

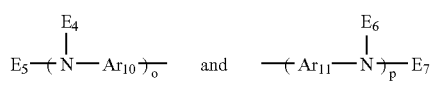

exist in plural, they may be the same or different.

Of the repeating unit of the above formula (2), it is preferable that $Ar_5$, $Ar_6$, $Ar_7$, $Ar_8$, $Ar_9$, $Ar_{10}$ and $Ar_{11}$ are each independently an arylene groups, and more preferable that n and l are one or more.

Among them, examples of the arylene group preferably include, as shown below, a substituted or unsubstituted phenylene group, substituted or unsubstituted biphenyl-diyl group, substituted or unsubstituted fluorene-diyl group, and substituted or unsubstituted stilbene-diyl group. Unsubstituted phenylene group is more preferable.

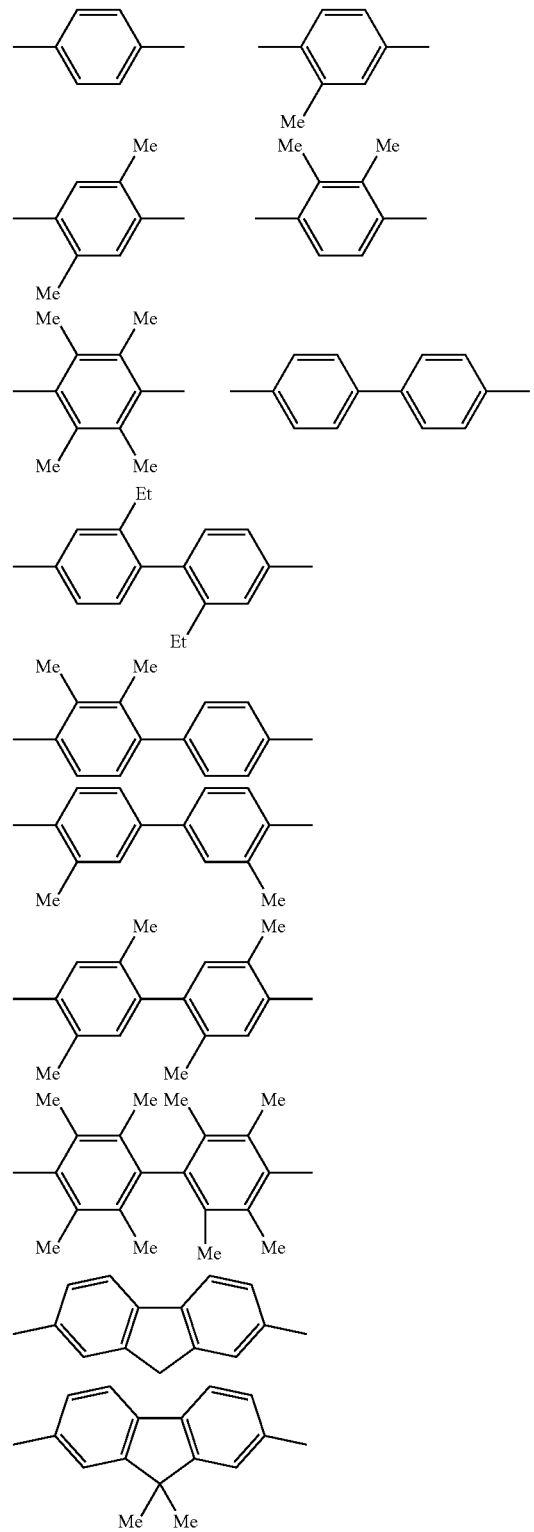

-continued
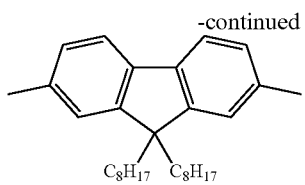
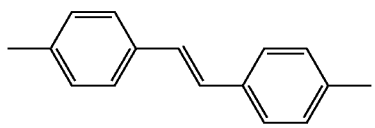
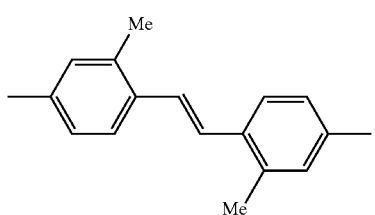
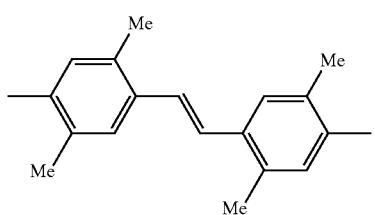
-continued
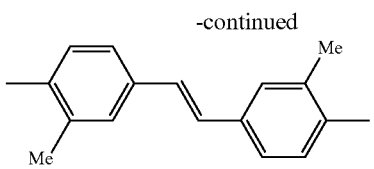
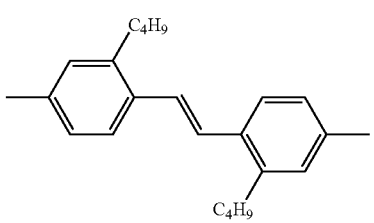
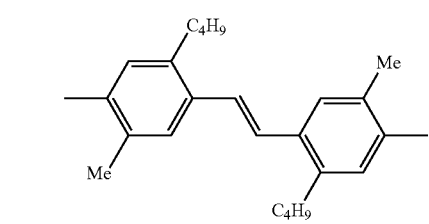
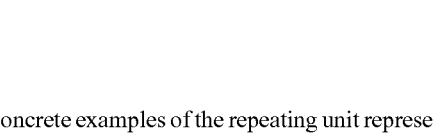
Concrete examples of the repeating unit represented by the above formula (2) include the following repeating units.
n = 0:
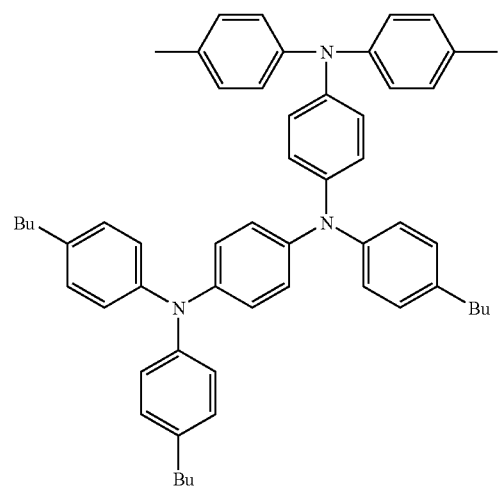
(l = 2)
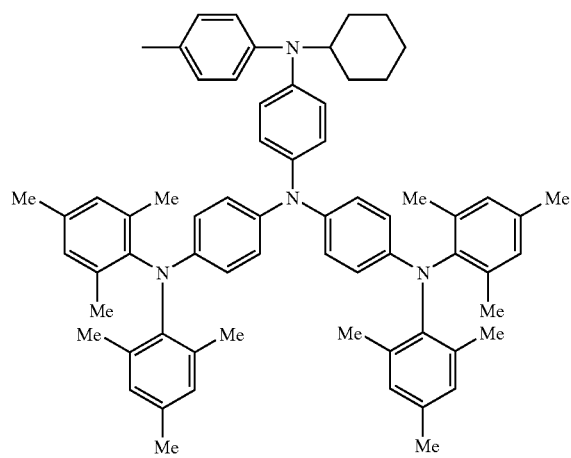
(l = 2, o = 1)

-continued
n = 1:
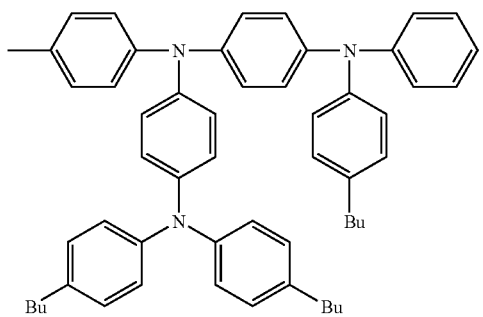
(l = 0)
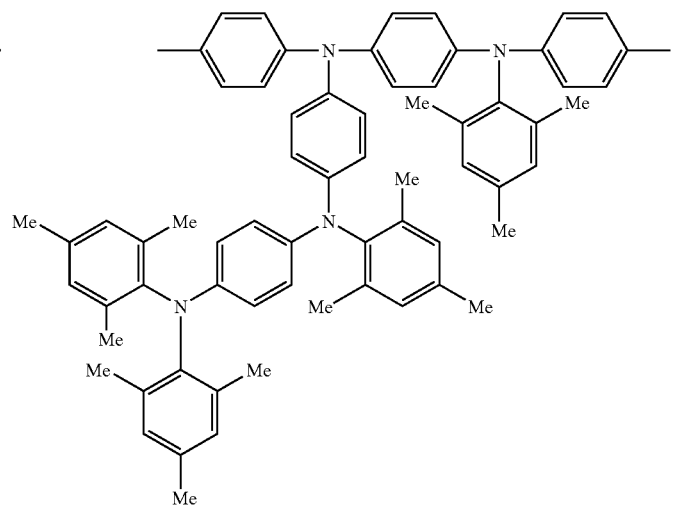
(l = 2)
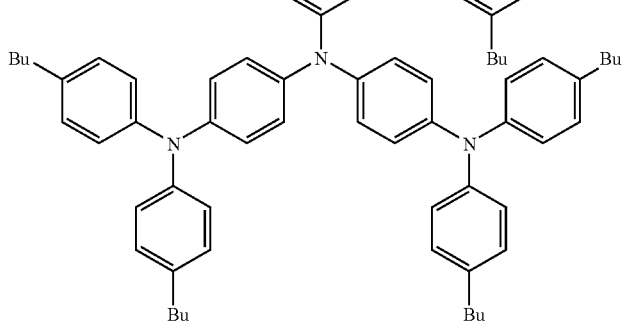
(l = 2, o = 1)
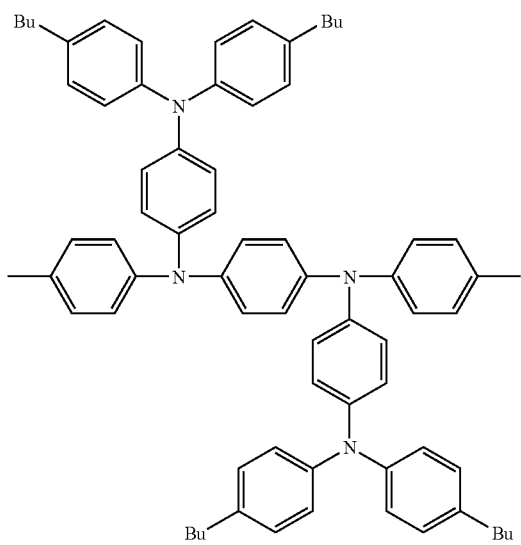
(l = 1, m = 1)

-continued
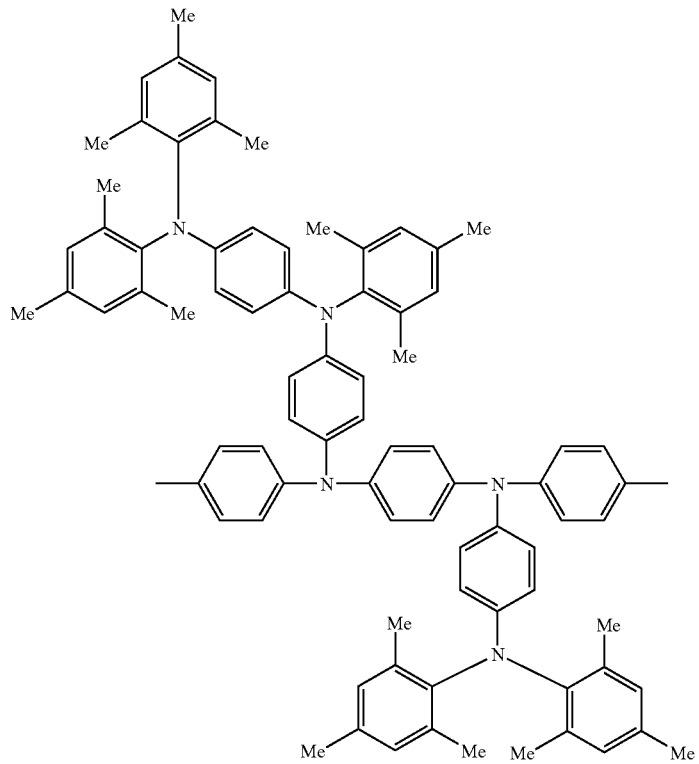
(l = 2, m = 1)
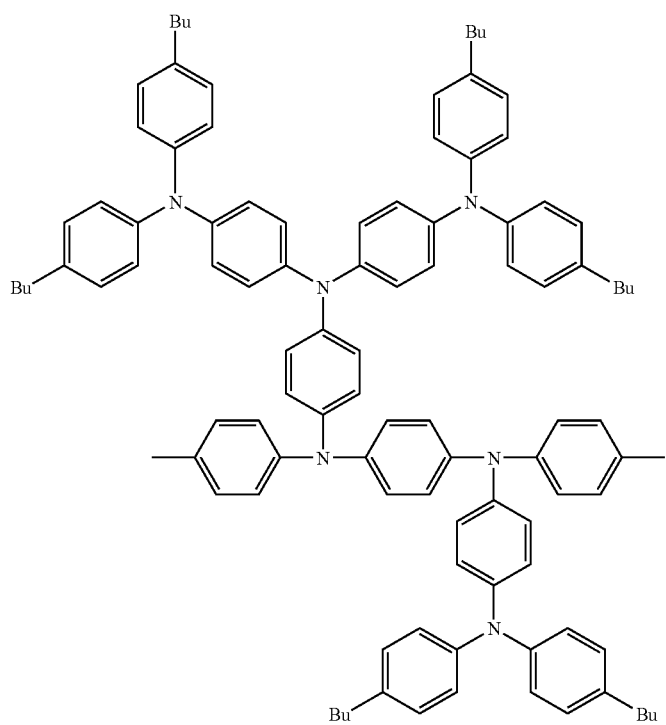
(l = 2, o = 1, m = 1)

-continued
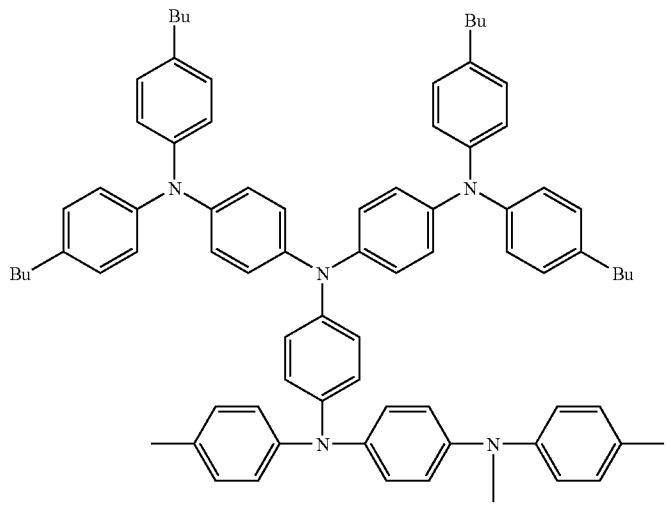
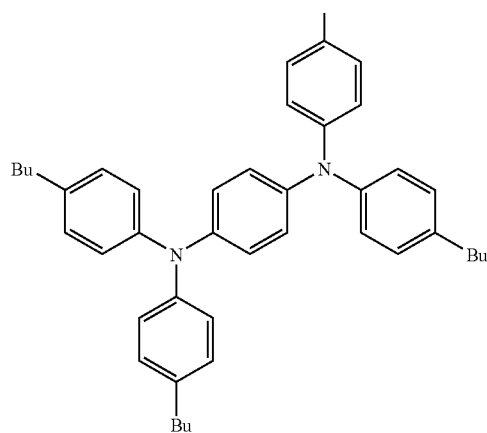
(I = 2, m = 2, o = 1)
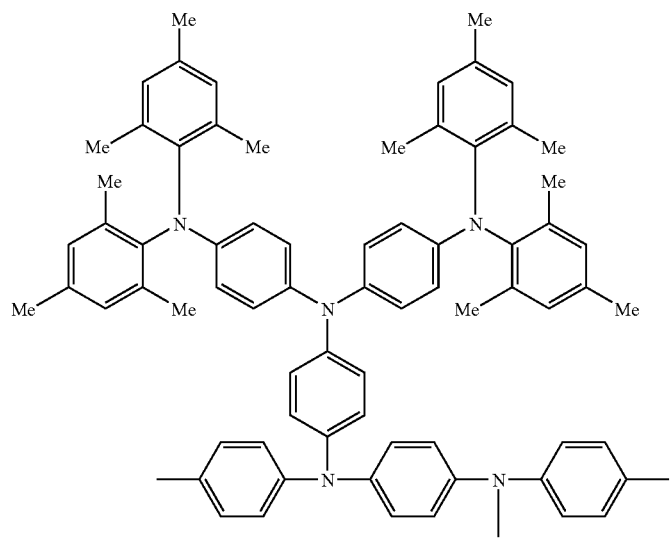

-continued
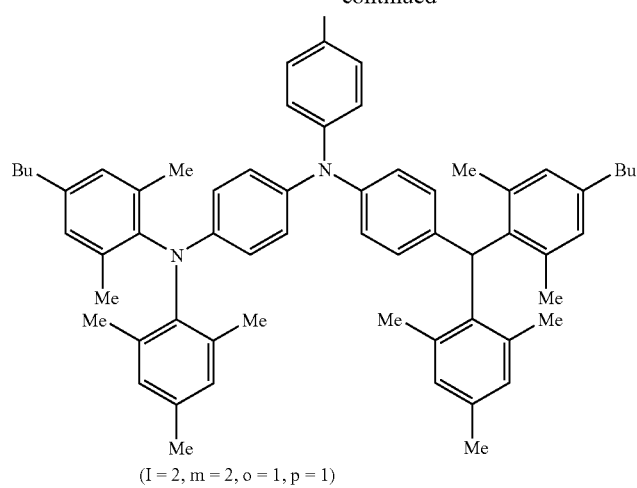
(I = 2, m = 2, o = 1, p = 1)
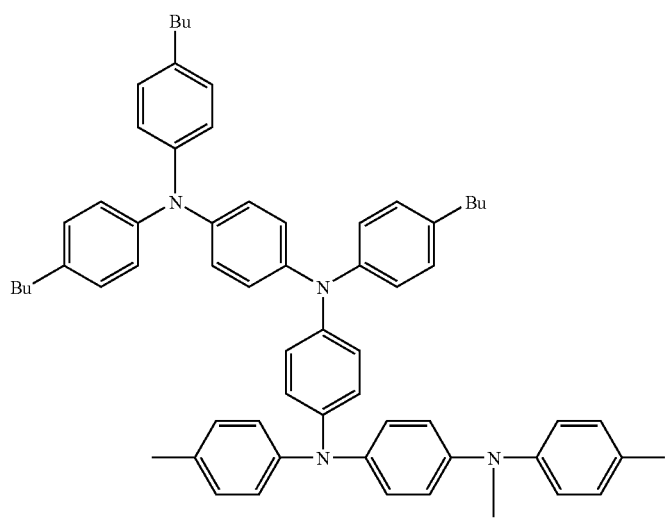
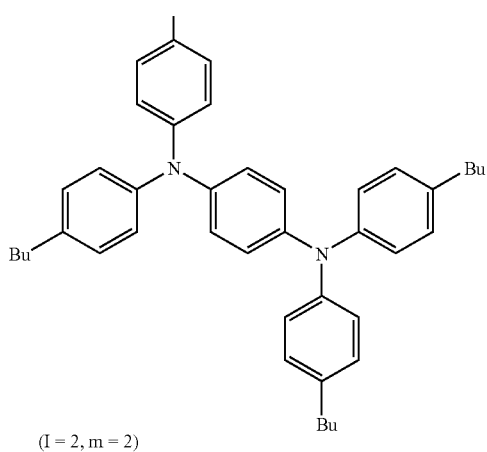
(I = 2, m = 2)

-continued
n = 2:
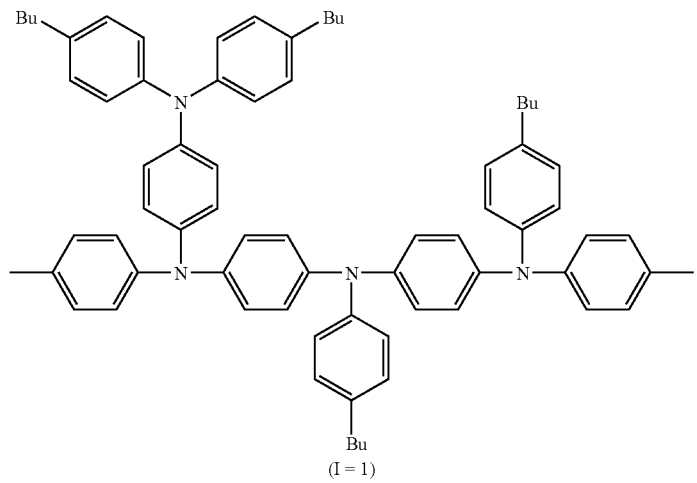
(I = 1)
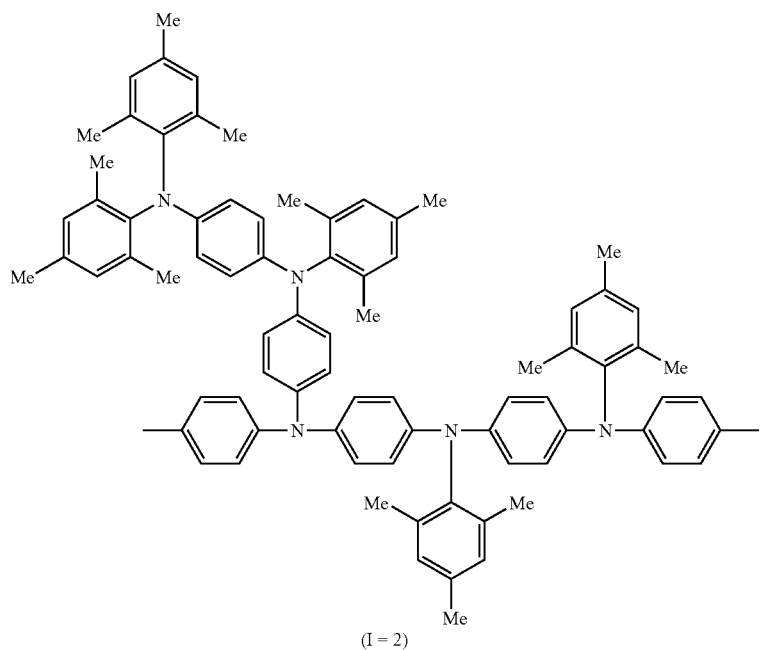
(I = 2)

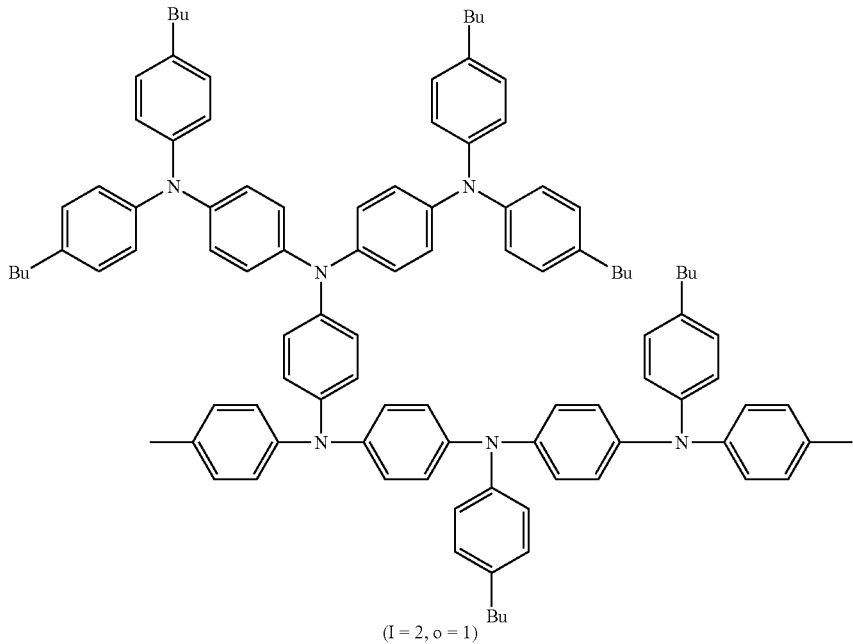
(I = 2, o = 1)
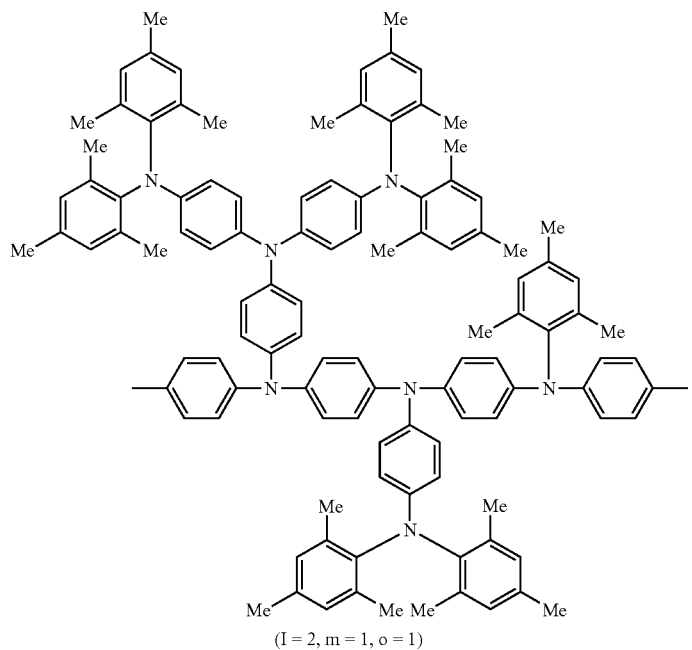
(I = 2, m = 1, o = 1)

-continued
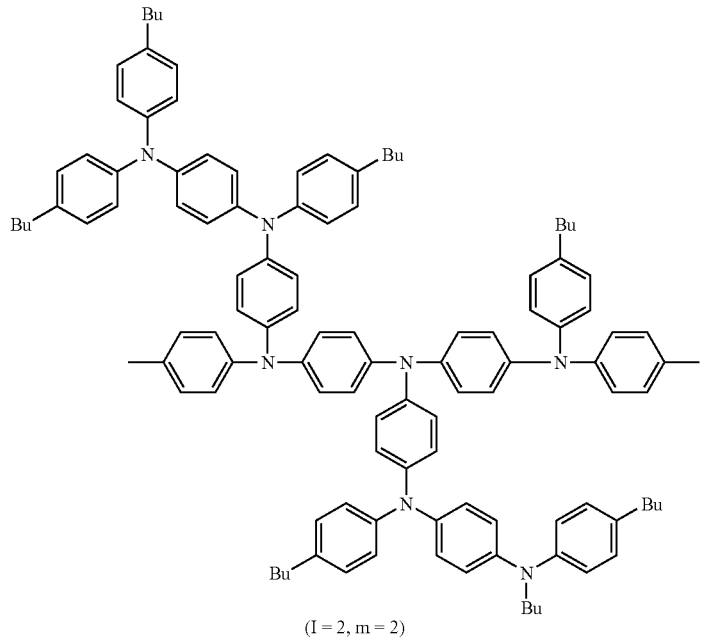
(I = 2, m = 2)
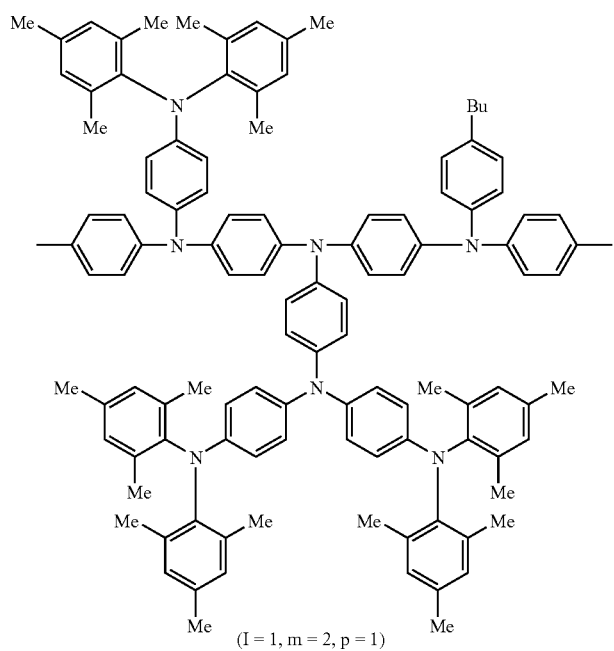
(I = 1, m = 2, p = 1)

-continued
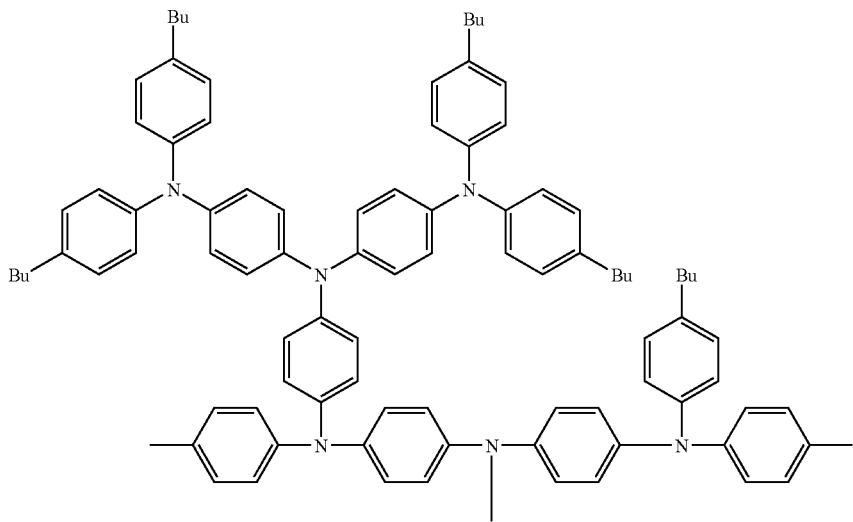
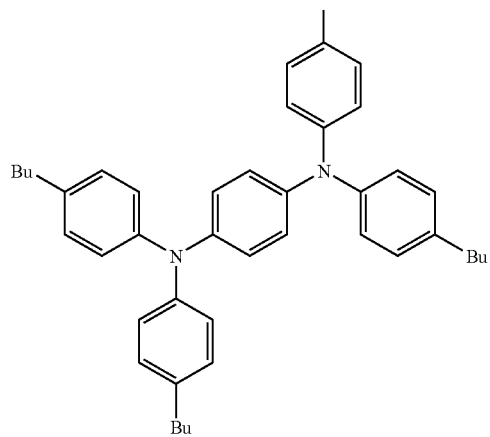
(I = 2, m = 2, o = 1)
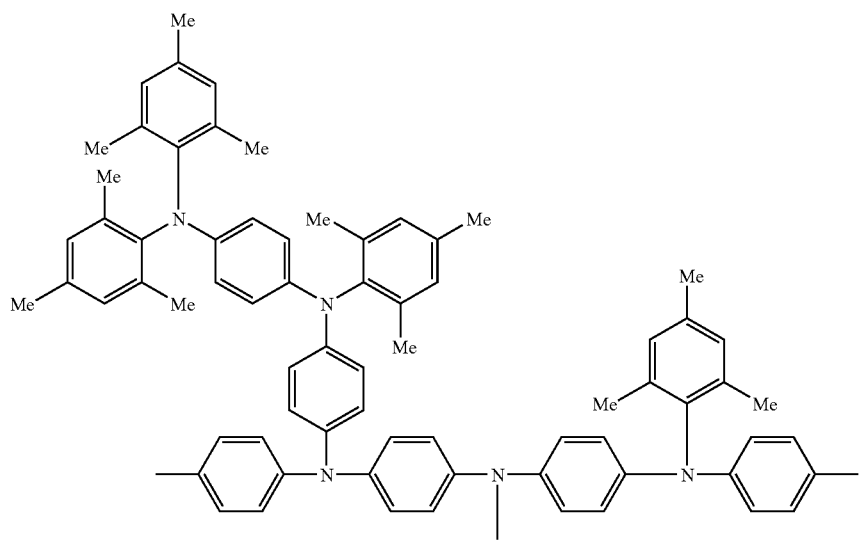

-continued
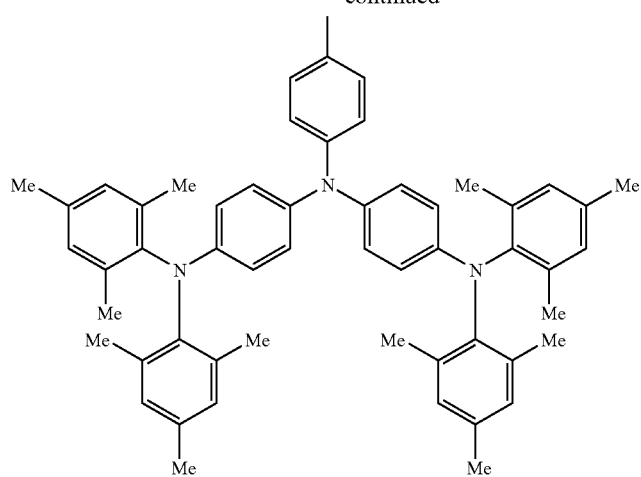
(I = 2, m = 2, p = 1)
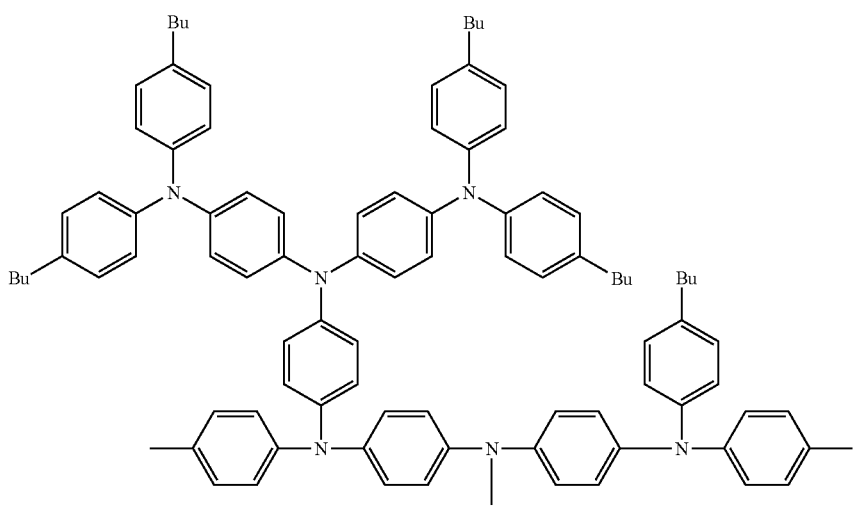
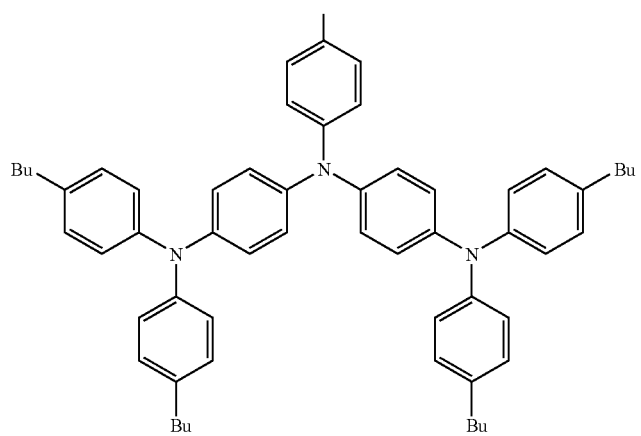
(I = 2, m = 2, o = 1, p = 1)

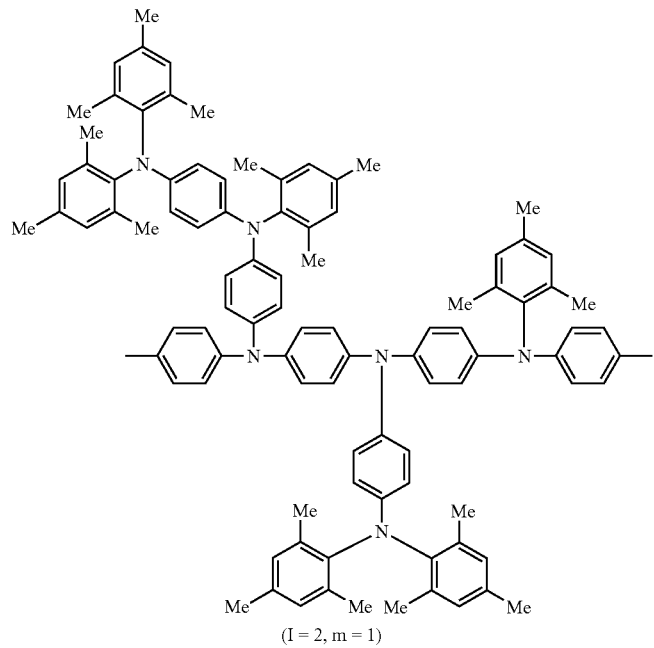
(I = 2, m = 1)
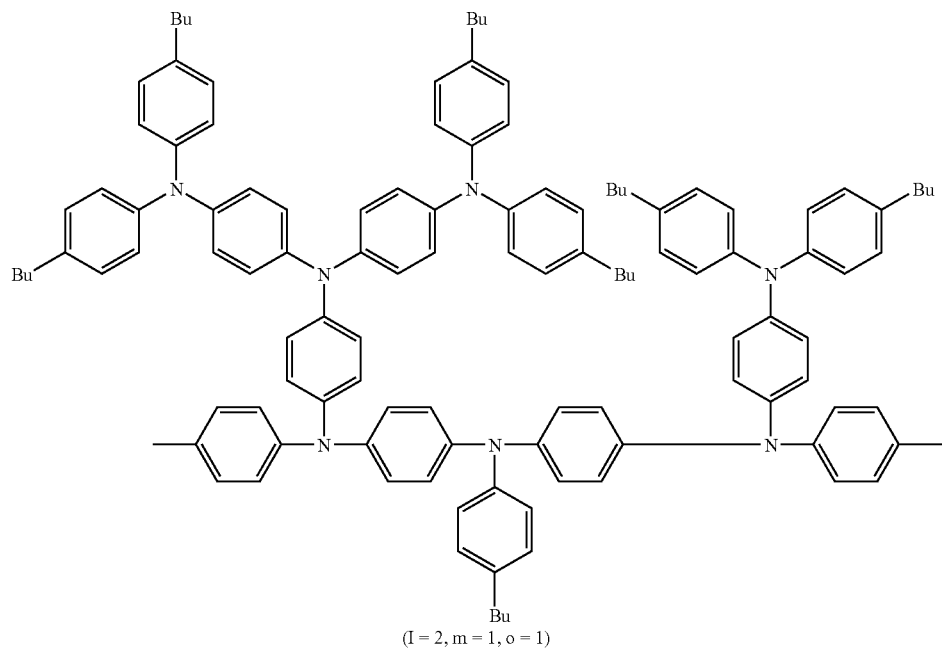
(I = 2, m = 1, o = 1)

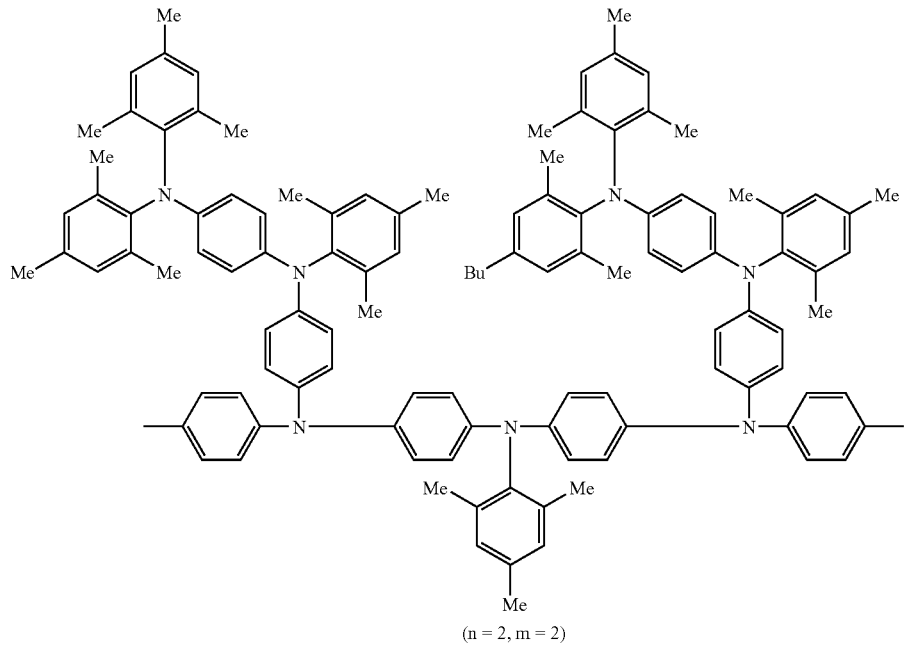
(n = 2, m = 2)
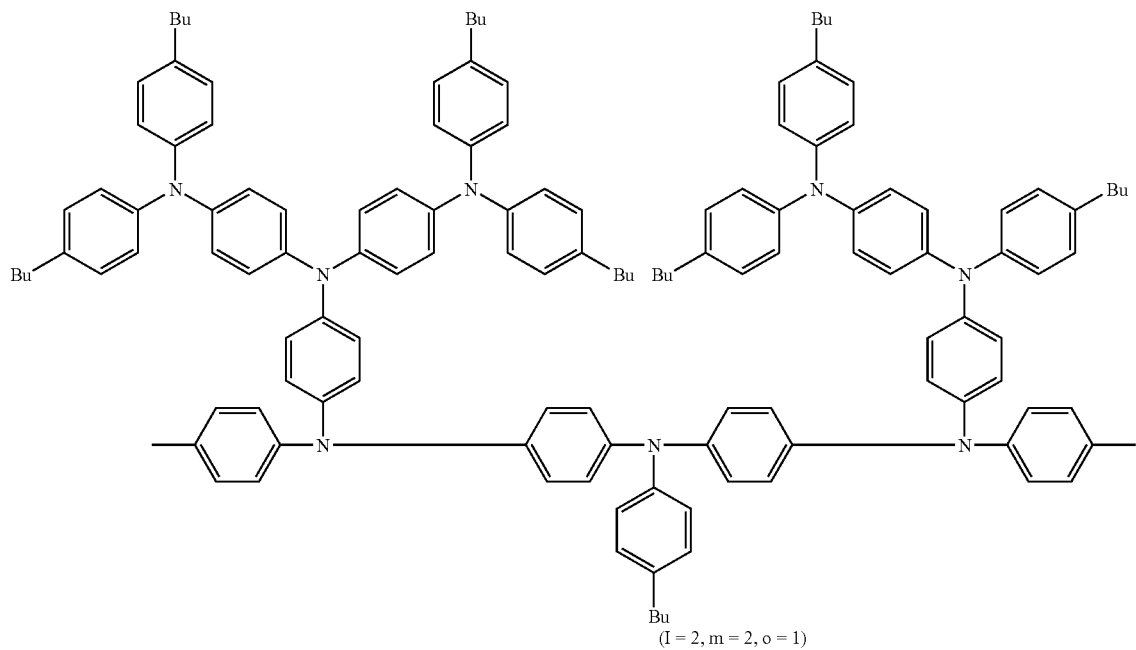
(l = 2, m = 2, o = 1)

-continued
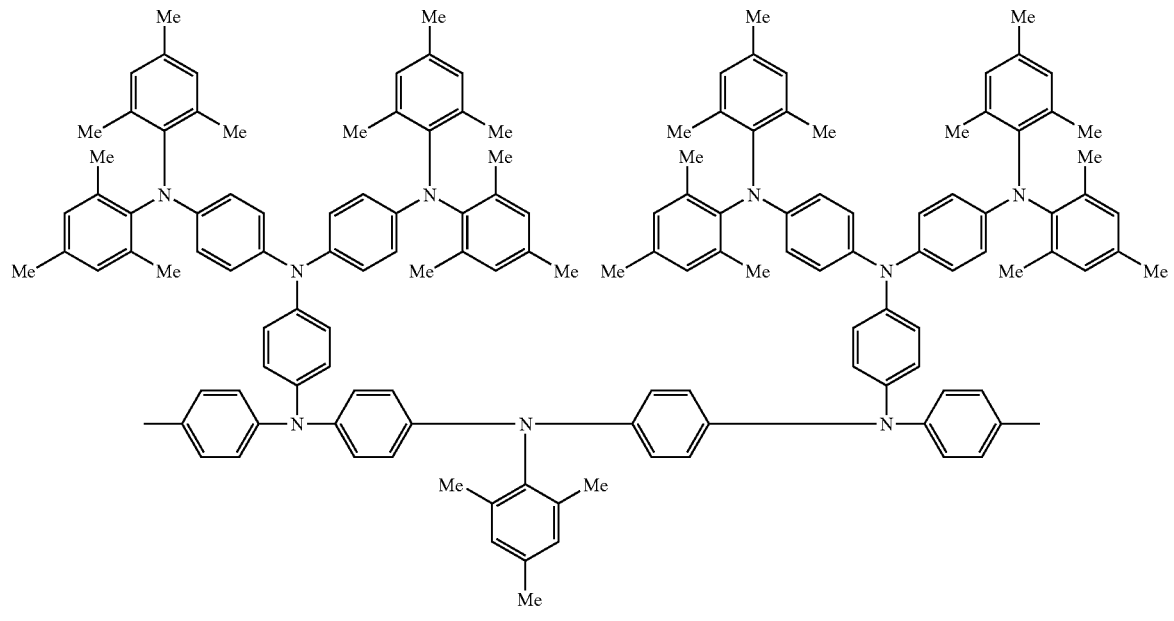
(I = 2, m = 2, o = 1, p = 1)
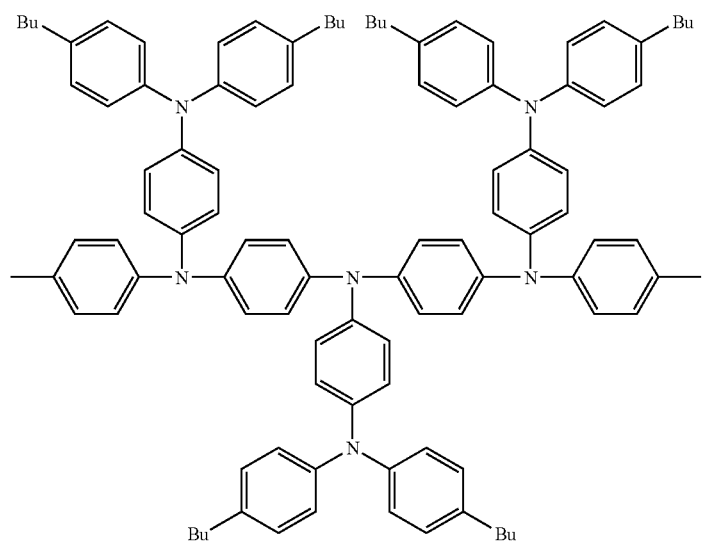
(I = 1, m = 2)

-continued
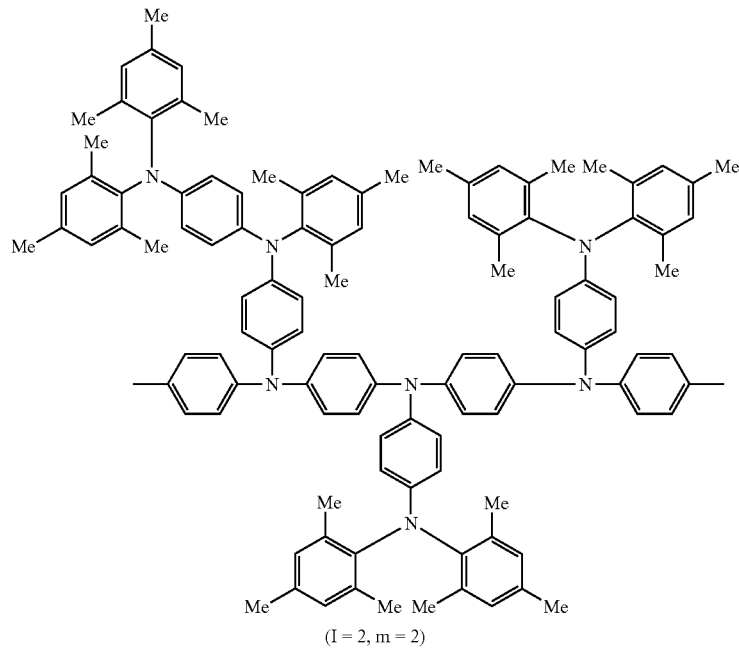
(I = 2, m = 2)
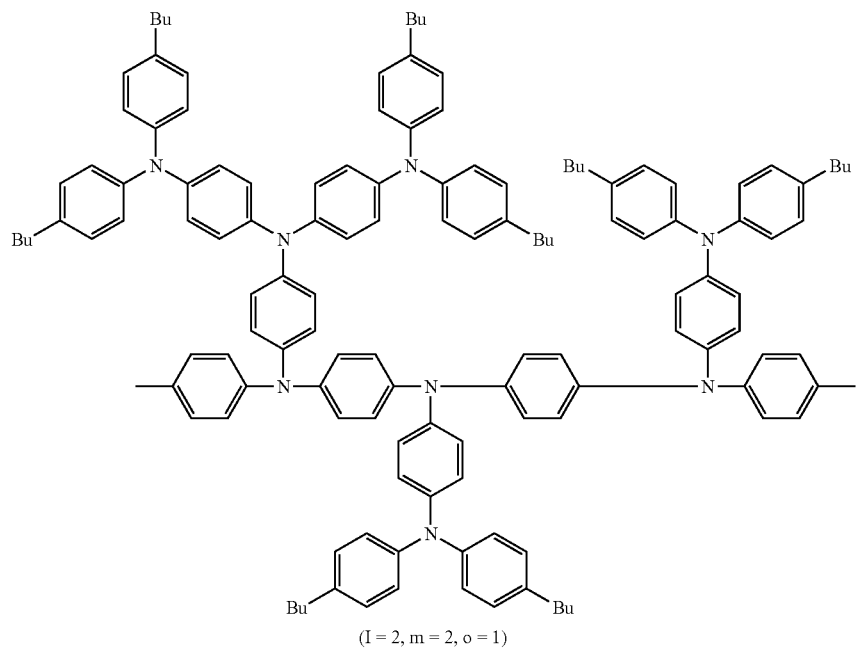
(I = 2, m = 2, o = 1)

-continued
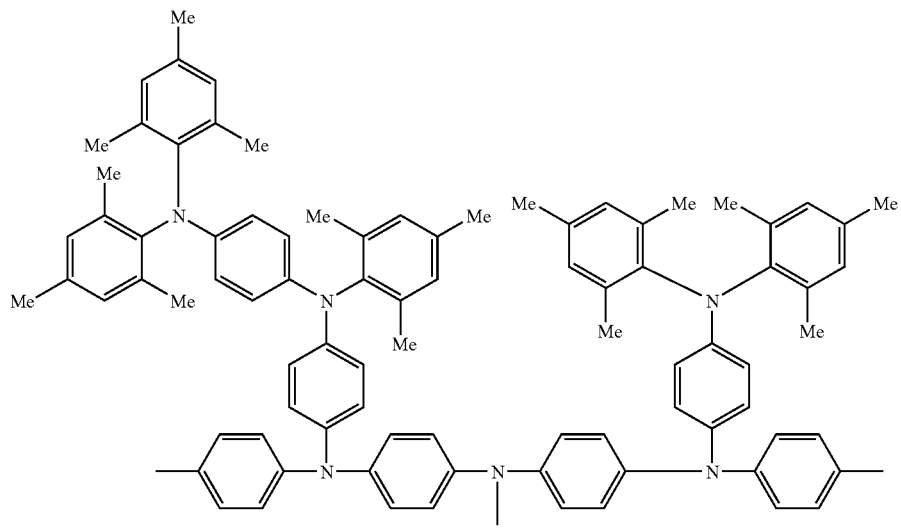
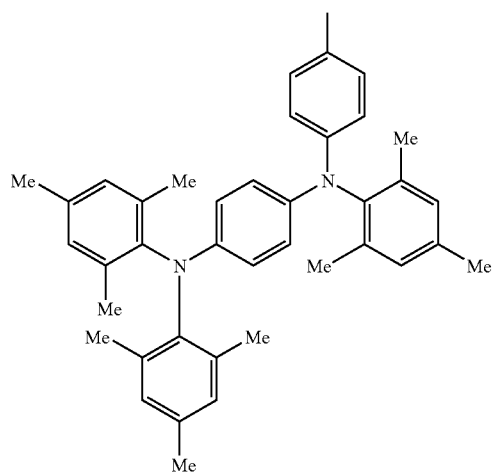
(I = 2, m = 2, o = 1)
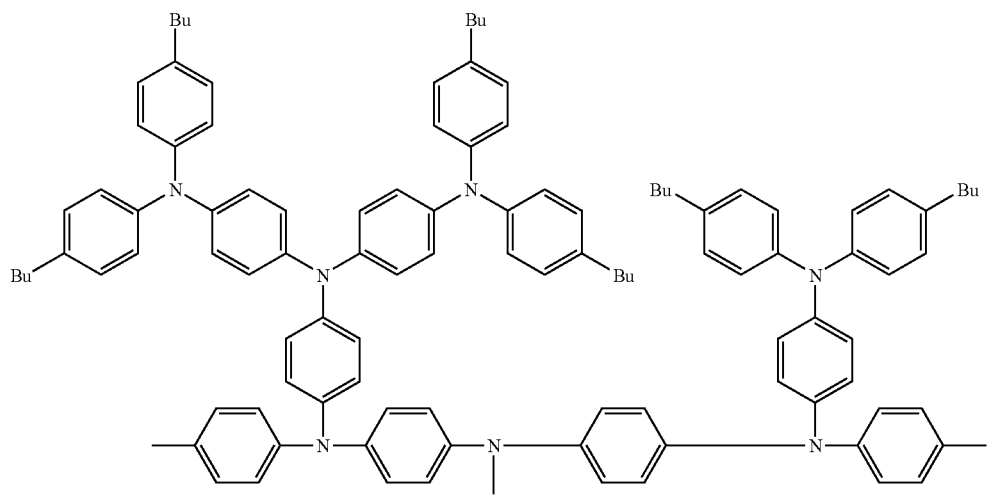

-continued
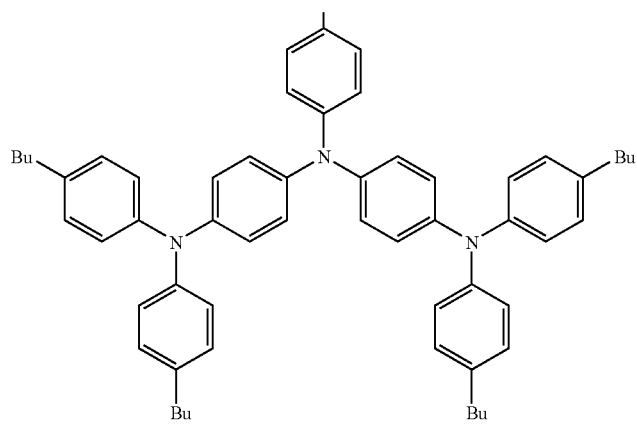
(l = 2, m = 2, o = 1, p = 1)
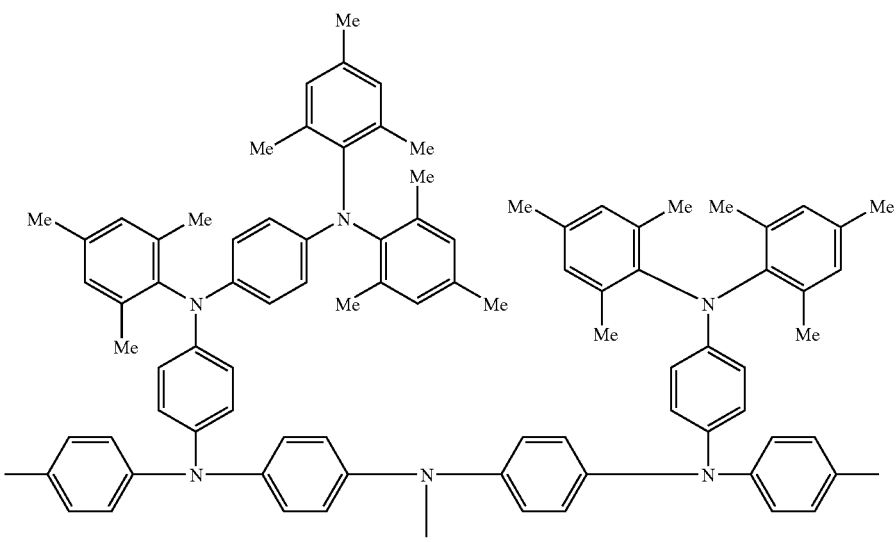
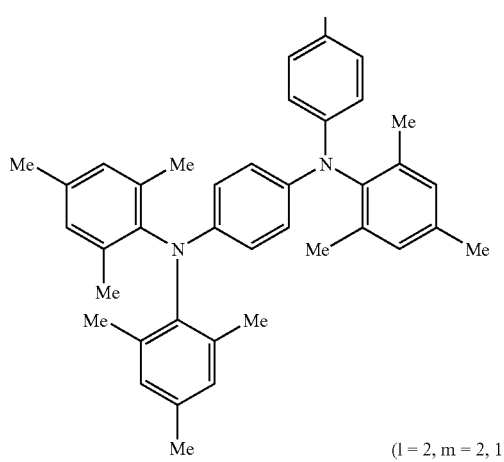
(l = 2, m = 2, 1)

-continued
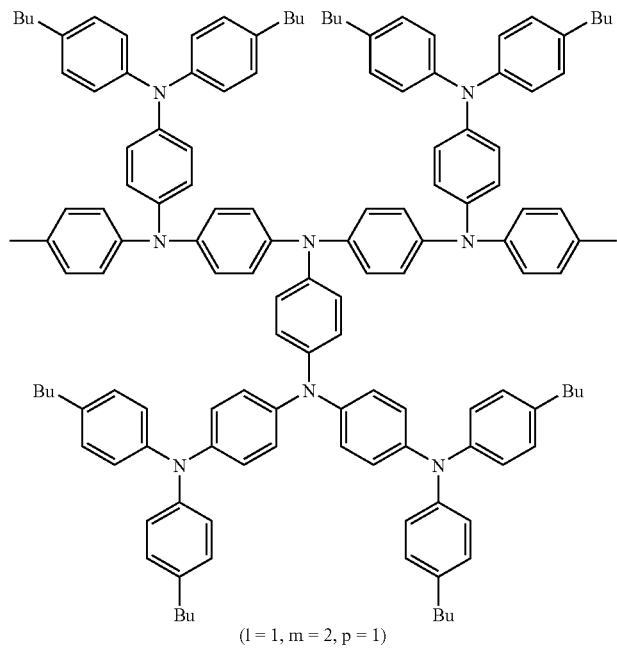
(l = 1, m = 2, p = 1)
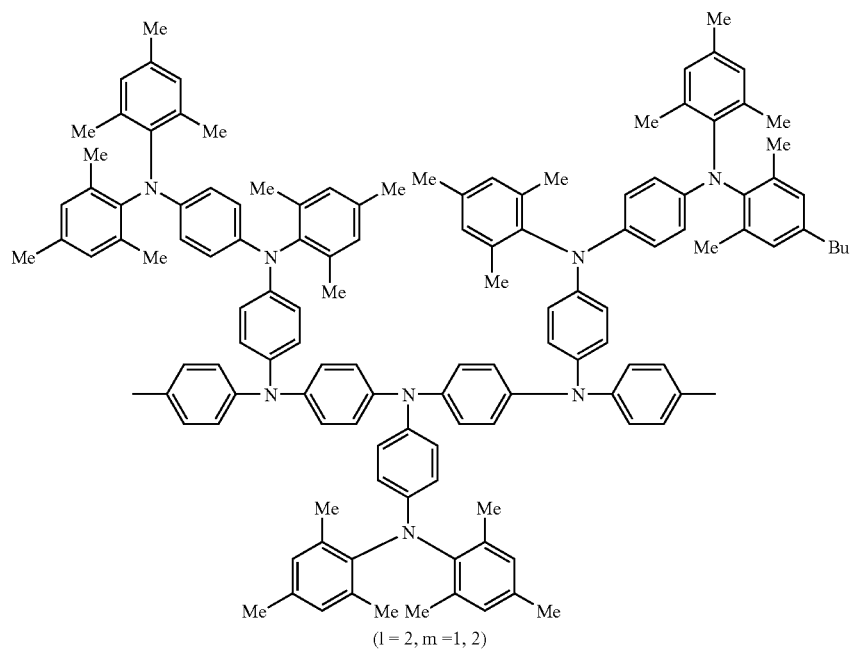
(l = 2, m =1, 2)

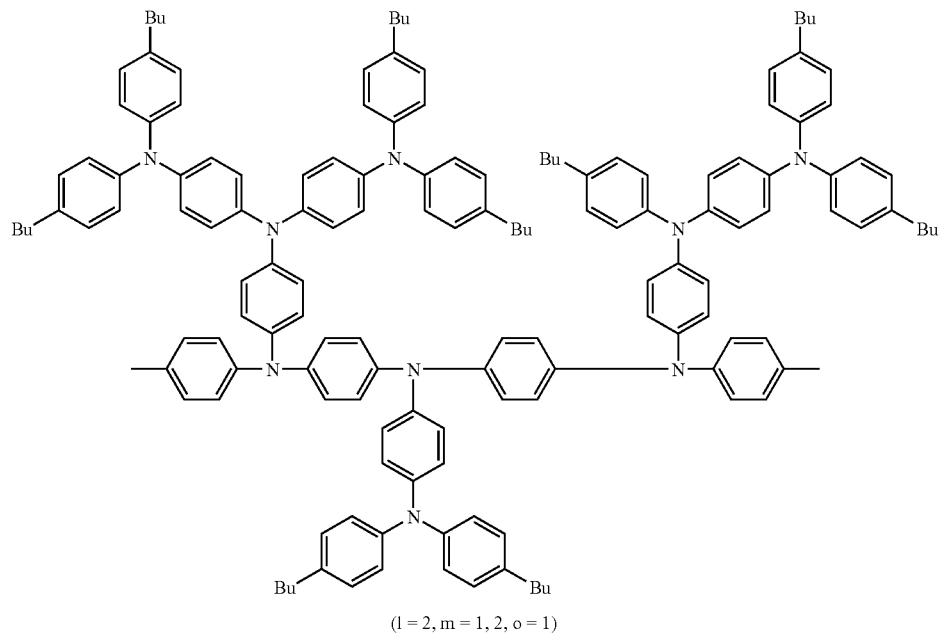
(l = 2, m = 1, 2, o = 1)
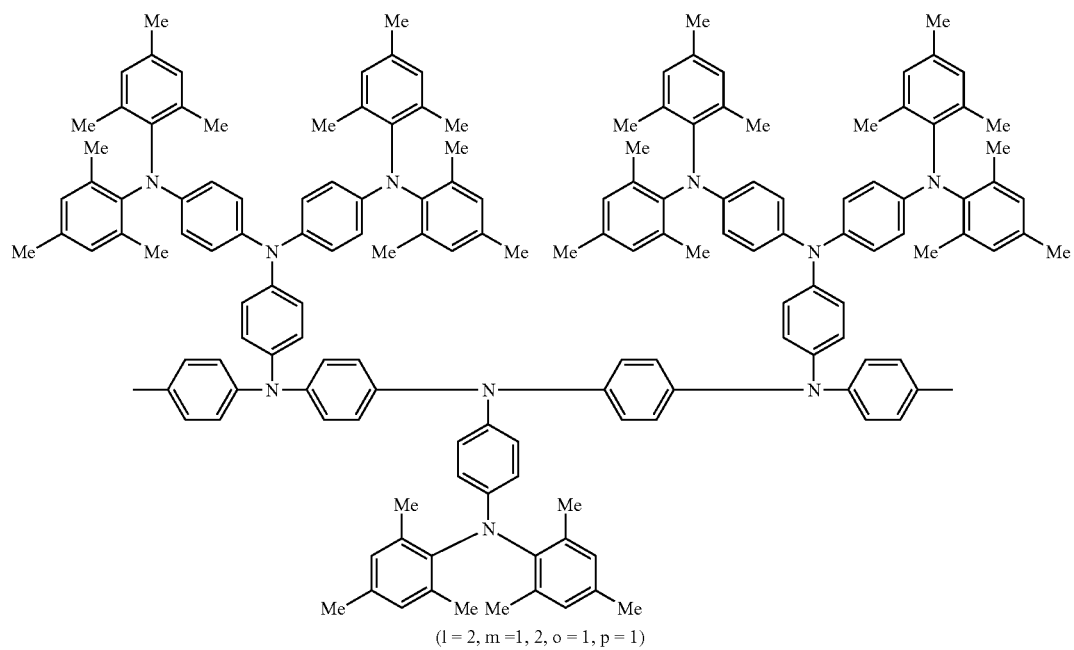
(l = 2, m = 1, 2, o = 1, p = 1)

-continued
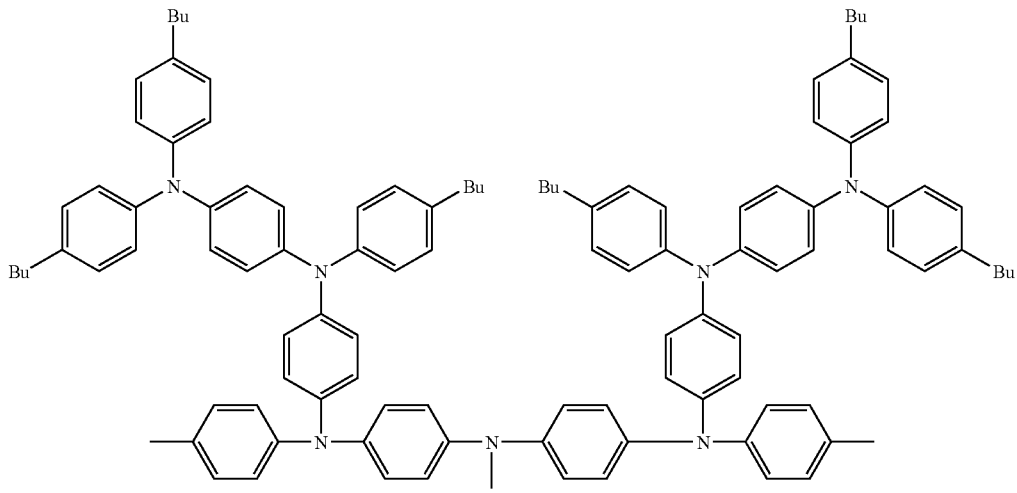
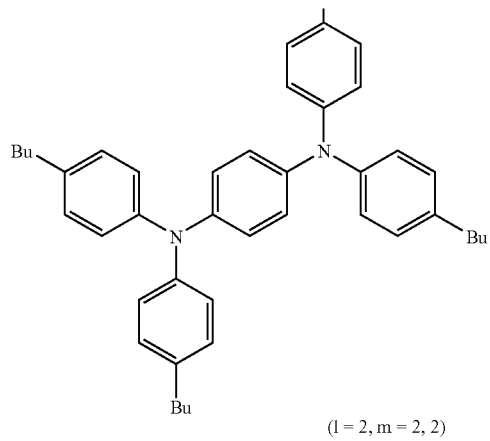
(l = 2, m = 2, 2)
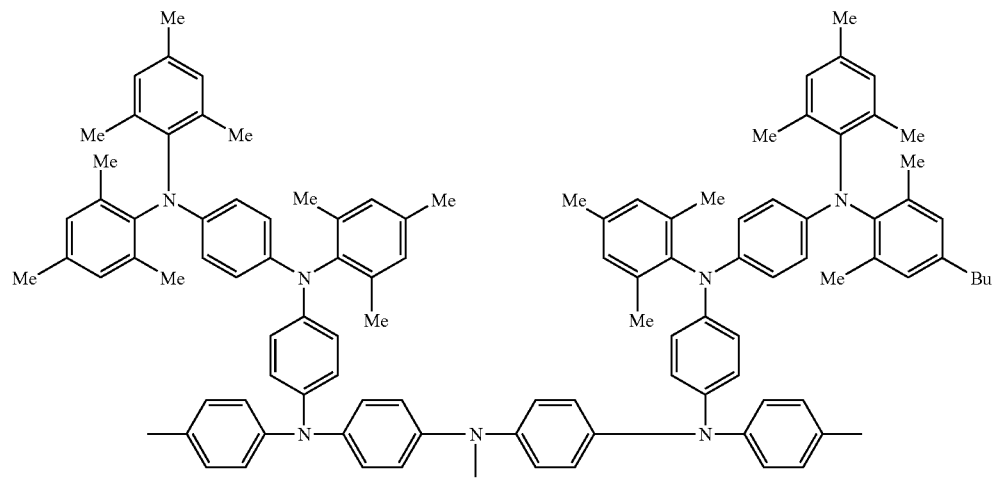

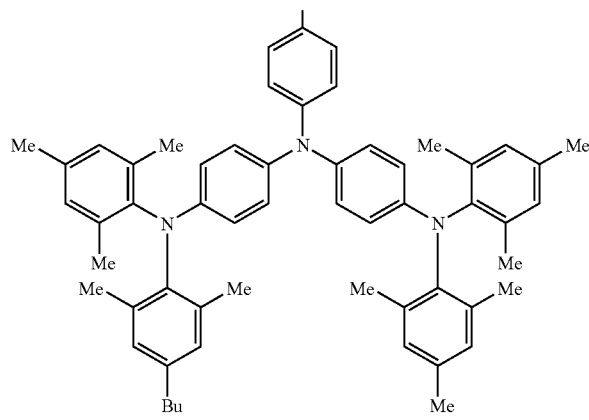
(l = 2, m = 2, 2, p = 1)
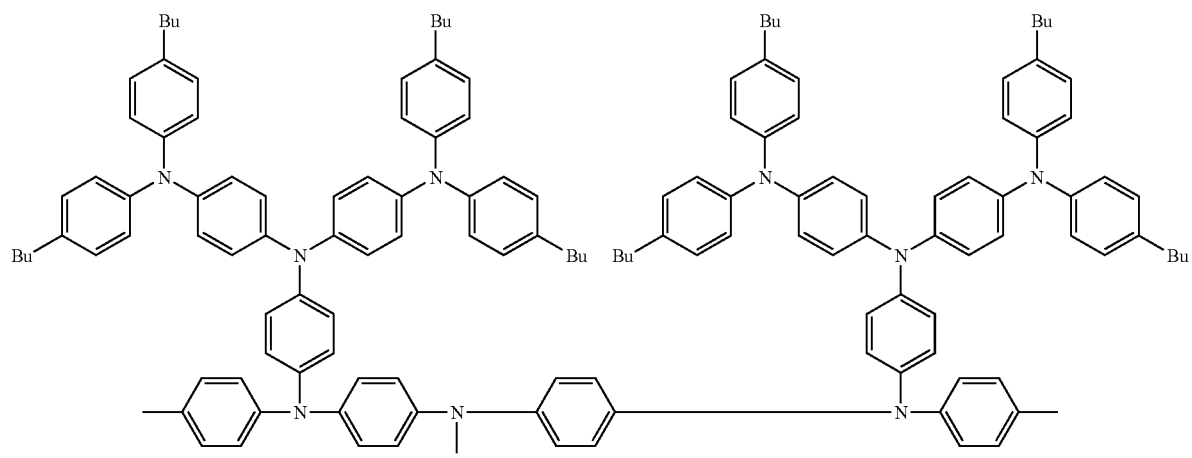
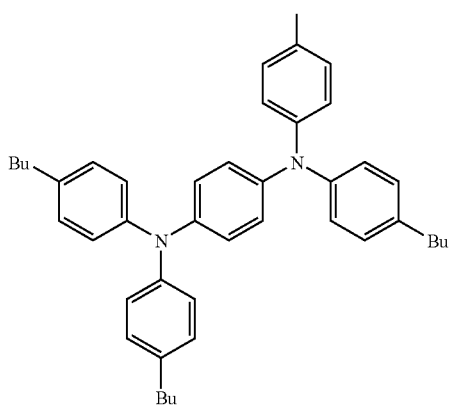
(l = 2, m = 2, 2, o = 1, p = 1)

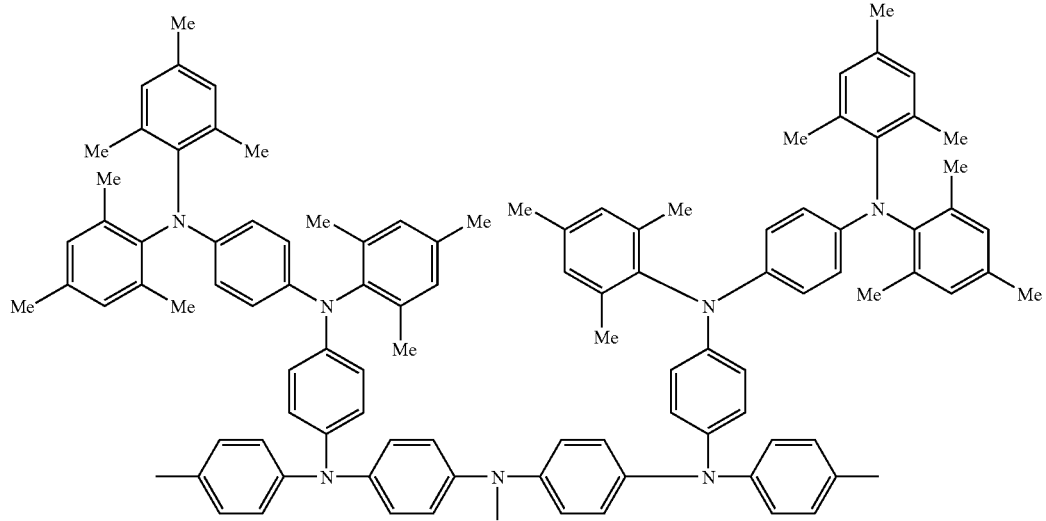
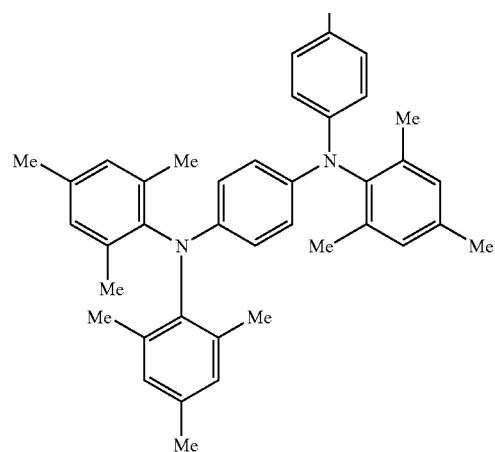
(l = 2, m = 2, 2, o = 1)
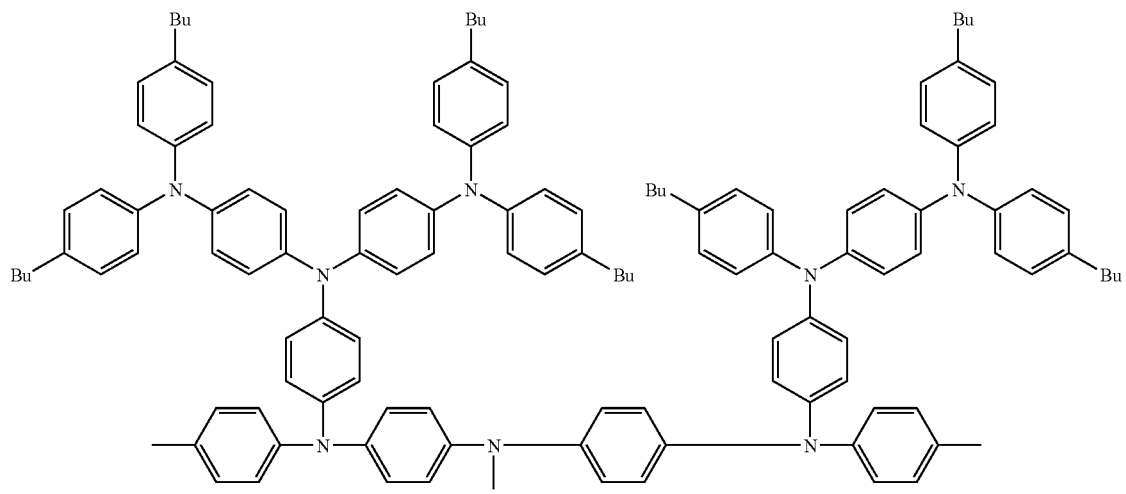

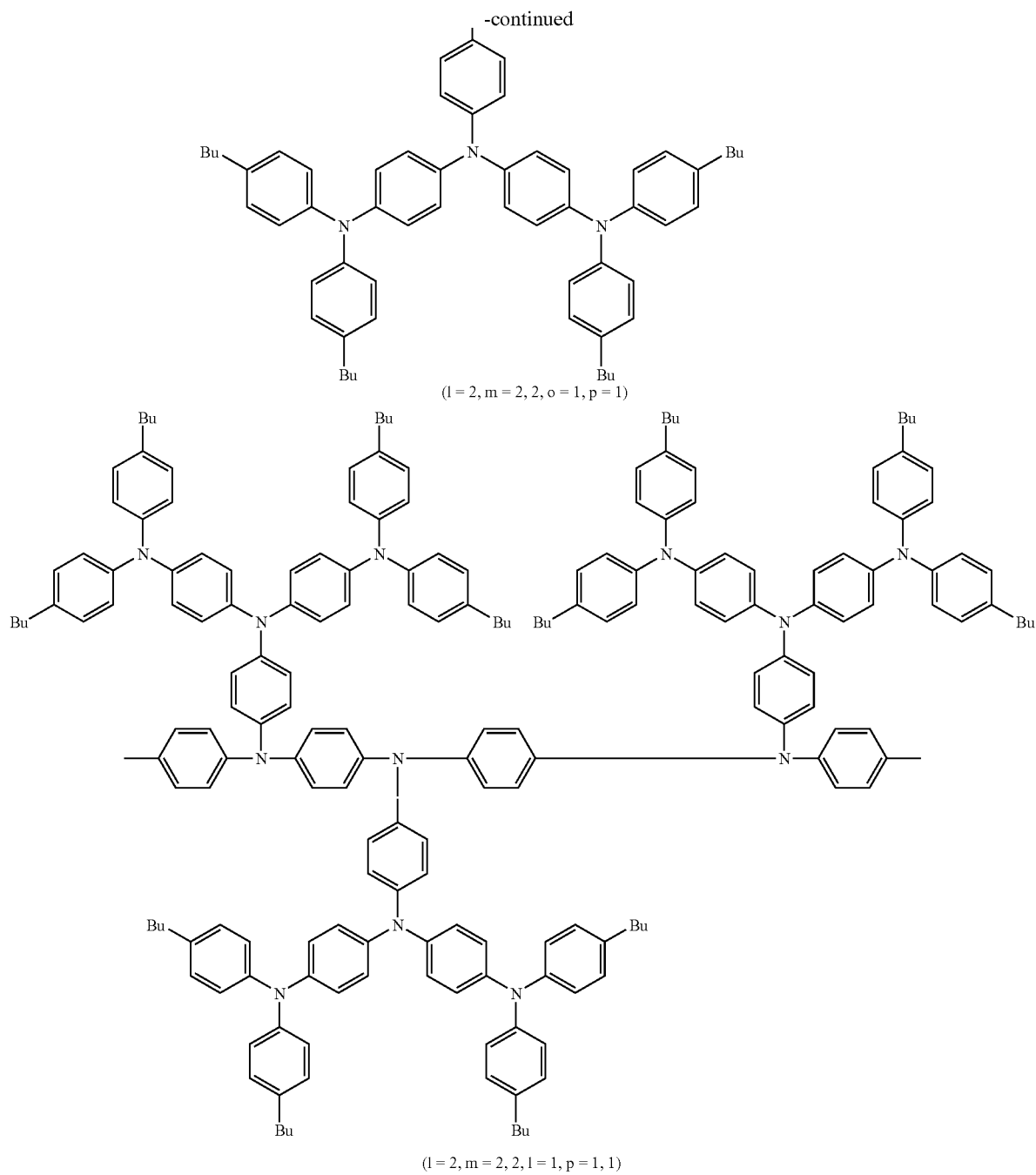

In the formula, Me represents methyl group and Bu represents butyl group.

In the above formula (2), when $E_4, E_5, E_6, E_7, E_8$ and $E_9$ are the above formulas (3), it is preferable that Re and Rf are each independently an alkyl, alkoxy, or alkylthio group having three or less carbon atoms, and Rg is an alkyl, alkoxy, or alkylthio group having 3-20 carbon atoms.

In the polymer compound of the present invention, the amount of the repeating unit selected from the group of repeating unit shown by formula (1) and formula (2) is usually 1 to 100% by mole based on all the repeating units of the polymer compound, and preferably 10 to 90% by mole.

In view of luminescence strength improvement, the polymer compound of the present invention is preferably a copolymer comprising a plurality of repeating units represented by the same formula of either (1) or (2), but said repeating units have different substituents; or a copolymer comprising a repeating unit represented by formula (1) and a repeating unit represented by formula (2).

The copolymer may preferably further contain one or more other repeating units in addition to the repeating units represented by formula (1) or (2).

As the repeating units other than the repeating unit represented by formula (1) or (2) which the polymer compound of the present invention can contain, the repeating unit represented by the below formula (4), (5), (6), or (7) is preferable.

$$—Ar_{12}— \quad (4)$$

$$—Ar_{12}—X_1—(Ar_{13}—X_2)_c—Ar_{14}— \quad (5)$$

$$—Ar_{12}—X_2— \quad (6)$$

$$—X_2— \quad (7)$$

In the formula, $Ar_{12}$, $Ar_{13}$, and $Ar_{14}$ each independently represent an arylene group, divalent heterocyclic group, or a divalent group having a metal-complex structure; $X_1$ represents —$CR_2$=$CR_3$—, —C≡C—, or —$(SiR_5R_6)_d$—; $X_2$ represents —$CR_2$=$CR_3$—, —C≡C—, —$N(R_4)$— or —$(SiR_5R_6)_d$—; $R_2$ and $R_3$ each independently represent a hydrogen atom, alkyl group, aryl group, monovalent heterocyclic group, carboxyl group, substituted carboxyl group, or cyano group; $R_4$, $R_5$ and $R_6$ each independently represent a hydrogen atom, alkyl group, aryl group, monovalent heterocyclic group, or arylalkyl group; c represents an integer of 0 to 2; and d represents an integer of 1 to 12.

Here, the arylene group and the divalent heterocyclic group are the same as previously mentioned.

The divalent group having metal-complex structure means a divalent group in which two hydrogen atoms are removed from the organic ligand of the metal complex.

The organic ligand of the metal complex has usually about 4 to 60 carbon atoms. Examples of the organic ligand include: 8-quinolinol and its derivative, benzoquinolinol and its derivative, 2-phenyl-pyridine and its derivative, 2-phenyl-benzothiazole and its derivative, 2-phenyl-benzoxazole and its derivative, porphyrin, and its derivative, etc.

As the central metal of the metal complex having an organic ligand, for example, aluminum, zinc, beryllium, iridium, platinum, gold, europium, terbium, etc. are exemplified.

As the metal complex having an organic ligand, those materials known as a fluorescence material and a phosphorescence material of low molecular weight, so-called a triplet luminescence complex, etc. are exemplified.

As the divalent group having metal-complex structure, for example, following structures (126-132) are exemplified.

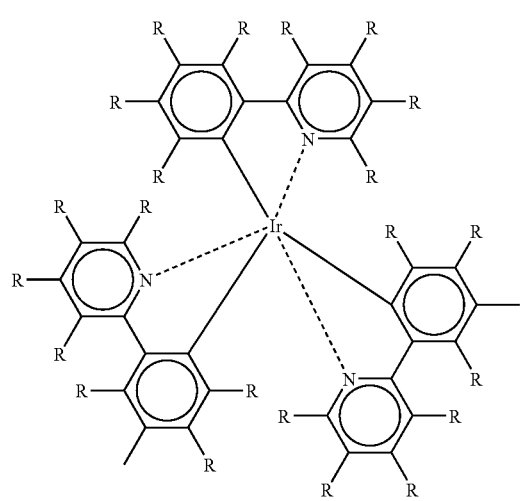

126

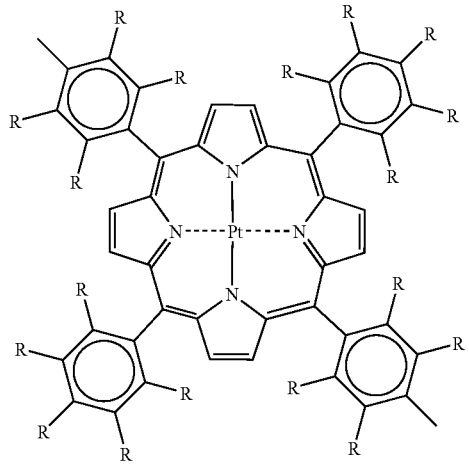

127

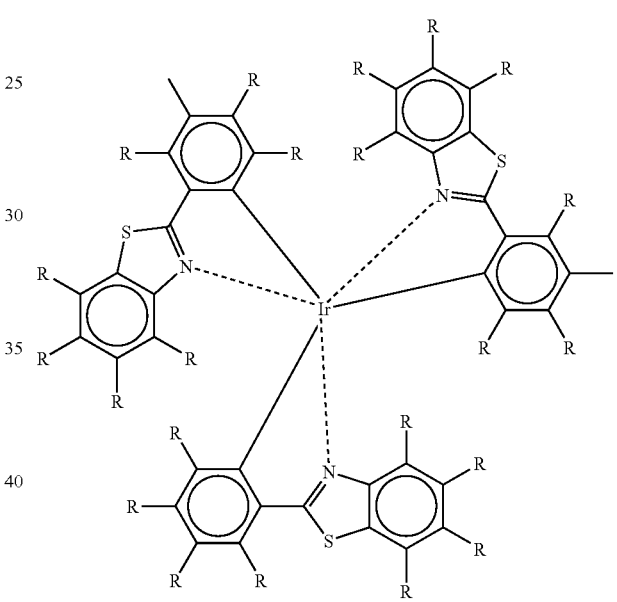

128

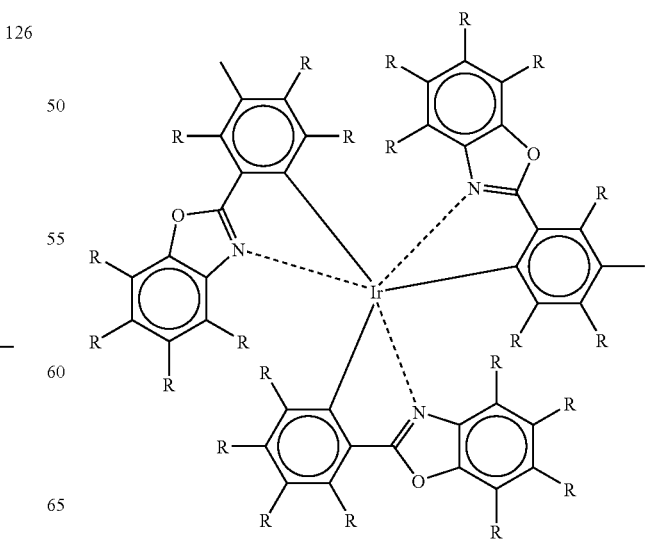

129

-continued
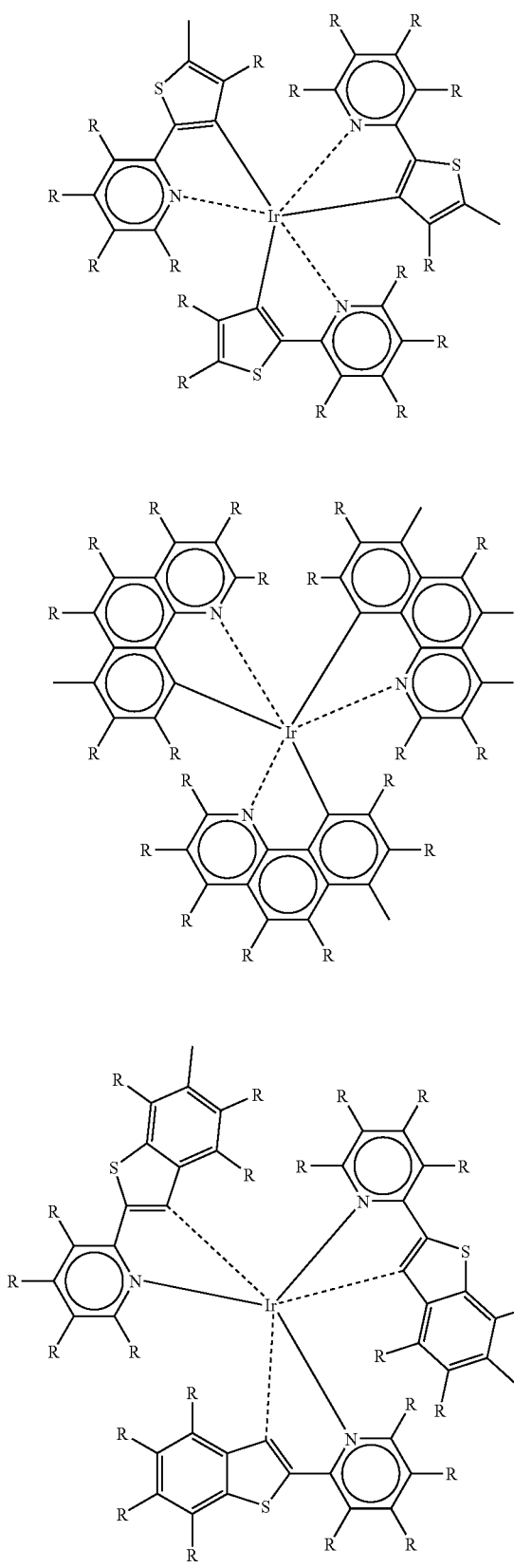
130
131
132
In the formula, R means the same as that of the above formulas 1 to 125.
As the repeating units other than the repeating units shown by the formula (1) or (2), those represented by the above formula (4) or (5) are preferable.
As the example of the repeating unit represented by the above formula (5), the following (formulas 133-140) are exemplified.
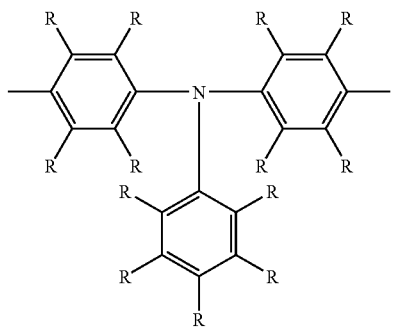
133
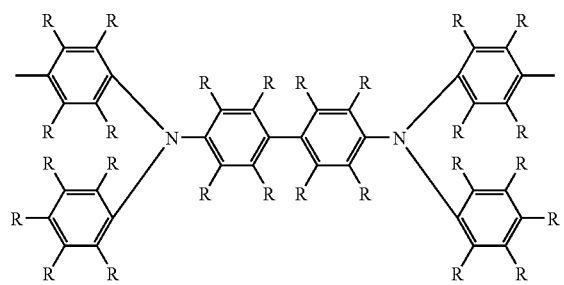
134
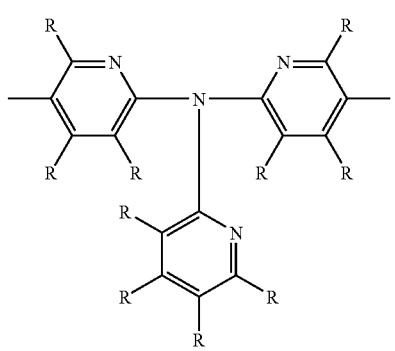
135
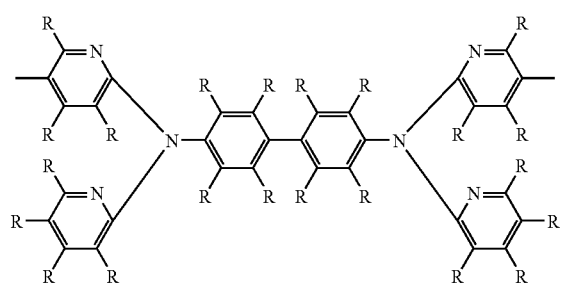
136

-continued

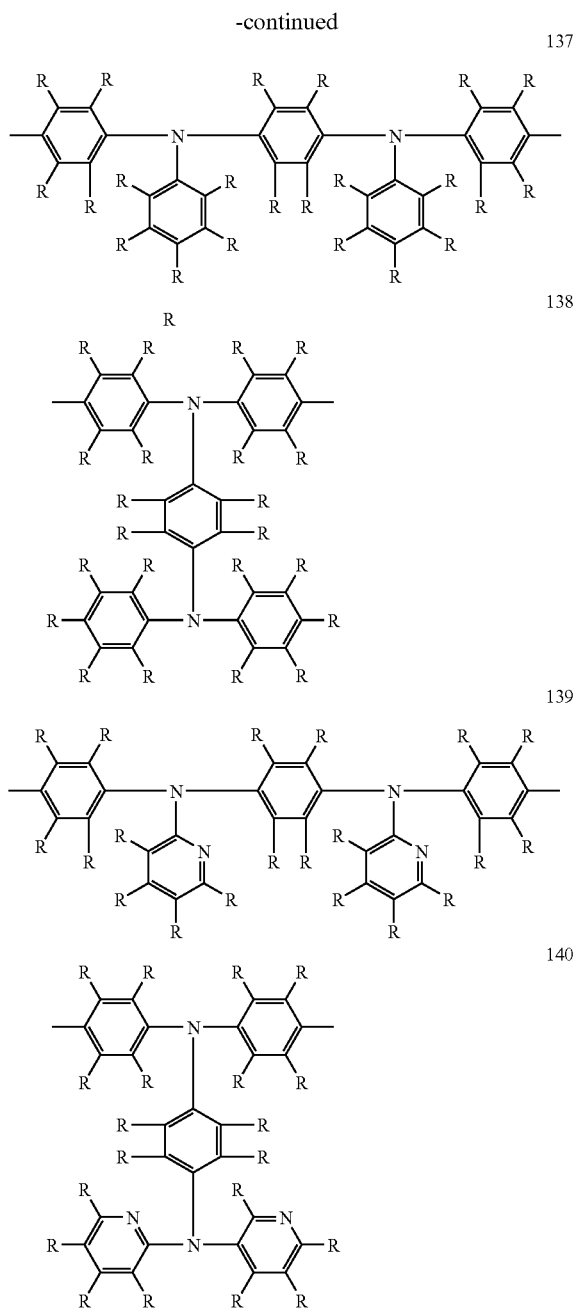

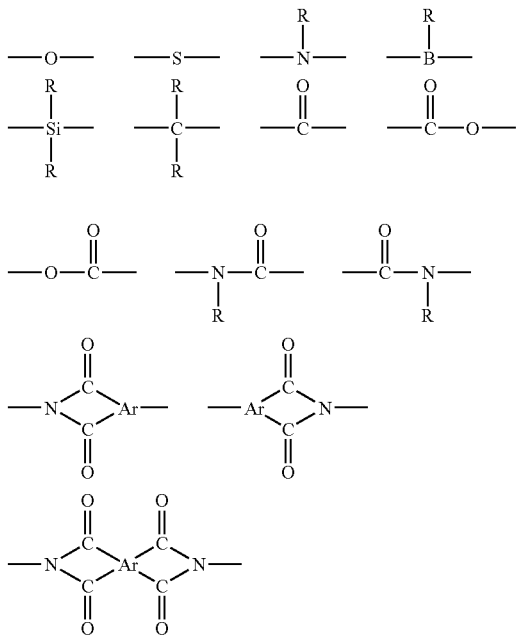

In the above formulas, R means the same as that of the above formulas 1 to 132.

The polymer compound of the present invention may contain a repeating unit other than the repeating unit represented by the above formula (1), (2), (4), (5), (6), and (7), within a range of not injuring light-emission characteristics or charge transportation characteristics. Moreover, these repeating units and other repeating units may be connected with non-conjugated unit, and the non-conjugated portions thereof may be contained in the repeating units. As the connected structure, the following and a combination of two or more of them are exemplified. Here, R is a group selected from the same substituents as the above mentioned, and Ar represents a hydrocarbon group of 6-60 carbon atoms.

The polymer compound may also be a random, block or graft copolymer, or a polymer having an intermediate structure thereof, for example, a random copolymer having block property. From the viewpoint for obtaining a light emitting material (polymer light emitting material) having high fluorescent or phosphorescent quantum yield, random copolymers having block property and block or graft copolymers are more preferable than complete random copolymers. Further, the polymer compound may have a branched main chain and more than three terminals. Moreover, the polymer compound may be a dendrimer.

Furthermore, the end group of polymer compound may also be protected with a stable group since if a polymerization active group remains intact, there is a possibility of reduction in light emitting property and life-time when made into an device. Those having a conjugated bond continuing to a conjugated structure of the main chain are preferable, and there are exemplified structures connected to an aryl group or heterocyclic compound group via a carbon-carbon bond. Specifically, substituents of the chemical formula 10 in JP 9-45478A are exemplified.

The polystyrene reduced number average molecular weight of the polymer compound of the present invention is $10^3$-$10^8$, and preferably $10^4$-$10^6$.

As a good solvent for the polymer compound of the present invention, exemplified are chloroform, methylene chloride, dichloroethane, tetrahydrofuran, toluene, xylene, mesitylene, tetralin, decalin, n-butylbenzene, etc. It can be dissolved in the solvent usually 0.1% by weight or more, although it depends on the structure and the molecular weight of the polymer compound.

The polymer compound of the present invention can be produced by condensation polymerization of, for example, the compound shown by below formula (8) and/or formula (9) as one of raw materials.

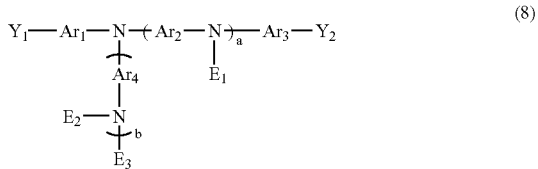  (8)

In the formula, $Ar_1$, $Ar_2$, $Ar_3$, $Ar_4$, $E_1$, $E_2$, $E_3$, a, and b mean the same with those as above-mentioned. $Y_1$ and $Y_2$ each independently represent a substituent which participates in condensation polymerization reaction.

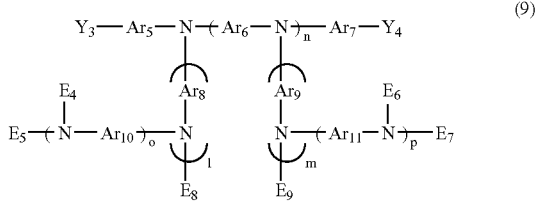  (9)

In the formula, $Ar_5$, $Ar_6$, $Ar_7$, $Ar_8$, $Ar_9$, $Ar_{10}$, $Ar_{11}$, $E_4$, $E_5$, $E_6$, $E_7$, $E_8$, $E_9$, m, n, l, o, and p mean the same with those as above-mentioned. $Y_3$ and $Y_4$ each independently represent a substituent which participates in condensation polymerization reaction.

As the substituent which participates in condensation polymerization reaction, a halogen atom, alkyl sulfonate group, aryl sulfonate group, arylalkyl sulfonate group, boric ester group, sulfonium methyl group, phosphonium methyl group, phosphonate methyl group, monohalogenated methyl group, boric acid group, formyl group, cyano group, vinyl group, etc. are exemplified.

Here, as the alkyl sulfonate group, exemplified are methane sulfonate group, ethane sulfonate group, trifluoromethane sulfonate group, etc., and as the aryl sulfonate group, examples are benzene sulfonate group, p-toluene sulfonate group, etc., and as the arylalkyl sulfonate group, exemplified are benzyl sulfonate group etc.

As the boric ester group, exemplified are the groups shown by the below formulas.

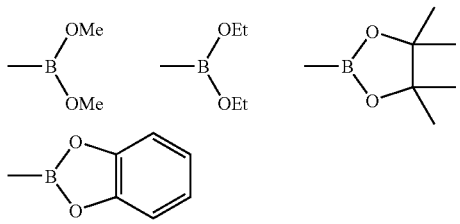

In the formula, Me shows methyl group and Et shows ethyl group.

As the sulfonium methyl group, exemplified are the groups shown by the below formula.

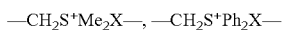

(X Shows a Halogen Atom and pH Shows Phenyl Group.)

As the phosphonium methyl group, exemplified are the groups shown by the below formula.

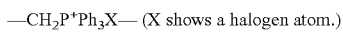

As the phosphonate methyl group, exemplified are the groups shown by the below formula.

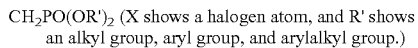

As the monohalogenated-methyl group, exemplified are fluoromethyl group, methyl chloride group, bromomethyl group, and iodomethyl group.

Preferable substituents as a substituent capable of condensation polymerization depend upon a kind of polymerization reaction. For example, when using a zero-valent nickel complex, such as Yamamoto coupling reaction, exemplified are a halogen atom, alkyl sulfonate group, aryl sulfonate group, or arylalkyl sulfonate group. When using a nickel catalyst or a palladium catalyst, such as Suzuki coupling reaction, exemplified are an alkyl sulfonate group, halogen atom, boric ester group, boric acid group, etc.

When the polymer compound of the present invention has a repeating units other than those represented by formula (1) or (2), a condensation polymerization can be carried out under the existence of a compound having two substituents capable of condensation polymerization as the repeating unit other than the repeating units represented by formula (1) or (2).

As the compound having substituents capable of condensation polymerization used as a repeating unit other than formula (1) and (2), exemplified are the compounds of following formulas (10)-(13).

By condensation polymerization of the compound shown by either of below formula (10)-(13), in addition to the compounds represented by the above formula (8) or (9), a polymer compound comprising the repeating unit of formula (4), (5), (6) or (7), in addition to the repeating unit of formula (1), can be produced.

 (10)

 (11)

 (12)

 (13)

In the formulas, $Ar_{12}$, $Ar_{13}$, $Ar_{14}$, $Ar_{11}$, c, $X_1$, and $X_2$ means the same as those shown above. $Y_5$ and $Y_6$ each independently represent a substituent which participates in the condensation polymerization reaction.

In the method for producing the polymer compound of the present invention, a known condensation reaction can be used, according to the substituent which participates in the condensation polymerization reaction of the compound shown by the above formulas (10) to (13).

As the method for producing the polymer compound of the present invention, exemplified are: a polymerizing method of a corresponding monomer with using a nickel catalyst or palladium catalyst, by Suzuki coupling reaction; a polymerizing method by Grignard reaction; a polymerizing method by nickel(0) complex by Yamamoto coupling reaction; a polymerizing method by an oxidizing agent such as $FeCl_3$; an electrochemical oxidation polymerization method; or a method by decomposition of an intermediate polymer having a suitable leaving group.

When the polymer compound of the present invention contains a vinylene group in the main chain, a method recited in JP 5-202355A is exemplified. Namely, exemplified are: a polymerization by Wittig reaction of a compound having formyl group and a compound having phosphonium methyl group; a polymerization by Wittig reaction of a compound having formyl group and a phosphonium methyl group; a polymerization by Horner reaction of a compound having formyl group and a compound having phosphonate methyl group; a polymerization by Horner reaction of a compound having formyl group and phosphonate methyl group; a polymerization by Heck reaction of a compound having vinyl group and a compound having halogen atom; a polycondensation by dehydrohalogenation method of a compound having two or more mono-halogenated methyl group; a polycondensation by the sulfonium-salt decomposition method of a compound having two or more sulfonium methyl groups; a polymerization by Knoevenagel reaction of a compound having a formyl group and a compound having cyano group; a polymerization by McMurry reaction of a compound having two or more formyl groups, etc.

When a polymer compound of the present invention contains a triple bond in the main chain in condensation polymerization, for example, Heck reaction or Sonogashira reaction can be used.

Of these, the polymerization method using a nickel catalyst or palladium catalyst by a Suzuki coupling reaction, the polymerization method by a Grignard reaction, the polymerizing method using zero valent nickel complex by Yamamoto coupling reaction, the polymerization method by a Wittig reaction, the polymerization method by a Heck reaction, the polymerization method by a Knoevenagel reaction, the polymerization method by a Sonogashira reaction are preferable since structure control is easy in these methods.

The reaction conditions will be described more specifically. In case of Wittig reaction, Horner reaction, Knoevengel reaction, etc., the reaction is conducted with using alkali in an equivalent amount to the functional group of the compound, and preferably in an amount of 1 to 3 times to the functional group of the compound.

As the alkali, can be used are: metal alcoholates such as potassium-t-butoxide, sodium-t-butoxide, a sodium ethylate, and lithium methylate; hydride reagents such as a sodium hydride; amides such as a sodium amide, without being limited. As the solvent, can be used are: N,N-dimethylformamide, tetrahydrofuran, dioxane, toluene, etc. The reaction is conducted usually at a temperature of a room temperature to about 150° C.

The reaction time is just required to proceed the reaction sufficiently, for example, about 5 minutes to 40 hours. It is not necessary to leave it for a long time after the reaction end, and preferably it is 10 minutes to 24 hours.

The concentration is appropriately determined in a range of about 0.01 wt % to the maximum soluble concentration, and it is usually 0.1 wt % to 30 wt %. When it is too concentrated, the reaction control becomes difficult, and when it is too diluted, the reaction efficiency becomes low.

Wittig reaction is described in "Organic Reactions", vol. 14, pp. 270 to 490, John Wiley & Sons, Inc., 1965; and Knoevenagel, Wittig, dehydrohalogenation reactions are described in Makromolecular Chemistry Macromolecular Symposium, vol. 12, p. 229 (1987).

In case of Heck reaction, monomers are reacted using a palladium catalyst, in the existence of a base, such as triethylamine, etc. A comparatively high boiling point solvents, such as N and N-dimethylformamide and N-methylpyrrolidone are used, and the reaction temperature is about 80-160° C., and the reaction time is from about 1 hour to 100 hours. Heck reaction is described in, for example, Polymer, vol. 39, pp 5241-5244 (1998).

In case of Sonogashira reaction, monomers are reacted using a palladium catalyst and cuprous iodide in the existence of a base, such as triethylamine, etc., in N,N-dimethylformamide, an amine solvent, or an ether solvent. The reaction temperature is usually about −50 to 120° C., and the reaction time is from about 1 hour to 100 hours, depending the reaction conditions and the reactivity of the substituent in the monomers.

Sonogashira reaction is described in, for example, Tetrahedron Letters, vol. 40, 3347-3350 (1999) and Tetrahedron Letters, vol. 16, 4467-4470 (1975).

In case of Suzuki reaction, the reaction is conducted with using, for example, palladium [tetrakis (triphenylphosphine)], palladium acetate, or the like as the catalyst. Inorganic bases, such as potassium carbonate, sodium carbonate, and barium hydroxide; organic bases, such as triethylamine; and inorganic salts, such as cesium fluoride, are used in equivalent amount or more to the monomers, preferably 1 to ten equivalent amount.

In addition, the reaction may be conducted in 2 phases system, using an aqueous solution of inorganic salt. As the solvent, N,N-dimethylformamide, toluene, dimethoxyethane, tetrahydrofuran, etc. are exemplified. The temperature is preferably about 50-160° C., depending on a solvent. The temperature may be raised near to boiling point of the solvent, and refluxed. The reaction time is from about 1 hour to 200 hours.

Suzuki reaction is described, for example, in Chemical Review, vol. 95, p. 2457 (1995).

Next, the case of using a zero-valent nickel complex is explained. There are a method using a zero-valent nickel complex as the zero-valent nickel complex, and a method generating a zero-valent nickel in the system by reacting a nickel salt in the existence of a reducing agent.

As the zero-valent nickel complex, bis(1,5-cyclooctadiene)nickel(0), (ethylene)bis(triphenylphosphine)nickel(0), tetrakis(triphenylphosphine)nickel etc. are exemplified, and among them, bis(1,5-cyclooctadiene)nickel(0) is preferable in viewpoint that it is versatile and cheap.

It is preferable to add a neutral ligand, in view of the improvement of yield. The neutral ligand is a ligand which has neither an anion nor a cation, and the examples thereof include: nitrogen-containing ligands, such as 2,2'-bipyridyl, 1,10-phenanthroline, methylenebisoxazoline, and N,N'-tetramethylethylenediamine, etc.; and tertiary phosphine ligands, such as triphenyl phosphine, tritolyl phosphine, tributyl phosphine, and triphenoxy phosphine, etc. The nitrogen-containing ligand is preferable in view of versatility and cheapness. Among them, 2,2'-bipyridyl is further preferable in respect of high reactivity and high yield. Especially preferable is a system where 2,2'-bipyridyl is added to the system containing bis(1,5-cyclooctadiene)nickel(0) as a neutral ligand in view of the improvement of polymer yield.

In the method of reacting zero-valent nickel in the system, nickel chloride, nickel acetate, etc. are exemplified as the nickel salt. As the reducing agent, zinc, sodium hydride, hydrazine and its derivative, lithium aluminum hydride, etc. are exemplified. Additives such as ammonium iodide, lithium iodide, potassium iodide, etc. are used, according to requirements.

In the manufacture methods of the present invention, it is preferable is that $Y_1$, $Y_2$, $Y_3$, $Y_4$, $Y_5$, and $Y_6$ are each independently a halogen atom, alkyl sulfonate group, aryl sulfonate group, or arylalkyl sulfonate group, and condensation polymerization is carried out under the existence of zero valent nickel complex.

As the raw material compounds, a dihalogenated compound, bis(alkylsulfonate) compound, bis(arylsulfonate) compound, bis(arylalkylsulfonate) compound or halogen-alkyl sulfonate compound, halogen-aryl sulfonate compound, halogen-arylalkyl sulfonate compound, alkylsulfonate-aryl sulfonate compound, alkylsulfonate-arylalkyl sulfonate compound are exemplified.

Moreover, in the manufacture method of the present invention, it is preferable that $Y_1, Y_2, Y_3, Y_4, Y_5$, and $Y_6$ are each independently a halogen atom, alkyl sulfonate group, arylsulfonate group, arylalkylsulfonate group, boric acid group or boric ester group, and The ratio of the total moles (J) of a halogen atom, alkylsulfonate group, aryl sulfonate group, and arylalkyl sulfonate group, to the total moles (K) of the boric acid group and boric ester group is substantially 1 (K/J is usually in the range of 0.7 to 1.2), and condensation polymerization is carried out using a nickel catalyst or a palladium catalyst.

As the concrete combination of the raw material compounds, exemplified is a combination of dihalogenated compound, bis(alkylsulfonate)compound, a bis (arylsulfonate) compound or bis(arylalkylsulfonate)compound, with diboric acid compound or diboric ester compound.

Moreover, exemplified are halogen-boric acid compound, halogen-boric ester compound, alkylsulfonate-boric acid compound, alkylsulfonate-boric ester compound, aryl sulfonate-boric acid compound, arylsulfonate-boric ester compound, arylalkylsulfonate-boric acid compound, arylalkylsulfonate-boric acid compound, and arylalkylsulfonate-boric ester compound.

It is preferable that the organic solvent used is subjected to a deoxygenation treatment sufficiently and the reaction is progressed under an inert atmosphere, generally for suppressing a side reaction, though the treatment differs depending on compounds and reactions used. Further, it is preferable to conduct a dehydration treatment likewise. However, it is not applicable in the case of a reaction in a two-phase system with water, such as a Suzuki coupling reaction.

For the reaction, an alkali or suitable catalyst is added appropriately. These may be selected according to the reaction used. It is preferable that the alkali or catalyst is soluble sufficiently in a solvent used for the reaction. As the method of mixing an alkali or catalyst, there is exemplified a method of adding a solution of an alkali or catalyst slowly while stirring under an inner atmosphere of argon and nitrogen and the like or a method of slowly adding the reaction solution to a solution of an alkali or catalyst, inversely.

Although it depends the kind of polymerization reaction, the polymerization time is usually about 5 minutes-200 hours, and preferably within 10 hours, in view of production cost. Although it depends on the kind of polymerization reaction, the polymerization temperature is usually about −50 to 160° C., and preferably 20-100° C. in view of high yield and low heating cost.

When these polymer compounds are used as a light-emitting material of a polymer LED, the purity thereof exerts an influence on the performance of devices, such as luminescence characteristics, therefore, it is preferable that a monomer is purified by a method such as distillation, sublimation purification, re-crystallization and the like before being polymerized. Furthermore, after the polymerization, it is preferable to conduct a common purification operation of separation, purification, drying or others, such as acid washing, alkali washing, neutralization, water washing, organic solvent washing, reprecipitation, centrifugal separation, extraction, column chromatography, and dialysis.

Next, the use of the polymer compound of the present invention is explained.

The polymer compound of the present invention has fluorescence or phosphorescence in the solid state, and it can be used as a light emitting polymer (high molecular weight light-emitting material). The polymer LED using this light emitting polymer is a high performance polymer LED which can be driven at a low-voltage and efficiently. Therefore, the polymer LED can be preferably used for back light of a liquid crystal display, a light source of curved or flat surface for lighting, a segment type display element, and apparatus such as a flat-panel display of dot matrix.

Moreover, the polymer compound of the present invention can be used also as a coloring matter for lasers, a material for organic solar-cell, an organic transistor for organic semiconductor, and a conductive thin film such as conductive thin-film material, and organic-semiconductor thin film.

Furthermore, it can be used also as a luminescent thin-film material which emits fluorescence or phosphorescence.

Next, the polymer LED of the present invention is explained.

The polymer LED of the present invention comprises an organic layer between the electrodes consisting of an anode and a cathode, and the organic layer contains the polymer compound of the present invention.

The organic layer may be any of a light emitting layer, a hole transporting layer, and an electron transporting layer, and it is preferable that the organic layer is a light emitting layer.

The light emitting layer means a layer having a function of light-emission. The hole transporting layer means a layer having a function of transporting holes, and an electron transporting layer means a layer having a function of transporting electrons. The electron transporting layer and the hole transporting layer are collectively referred to as a charge transport layer. Two or more layers of the light emitting layer, hole transporting layer, and electron transporting layer can be used each independently.

When an organic layer is the light emitting layer, said light emitting layer may contain further a hole transporting material, an electron transporting material, or a light-emitting material. Here, the light-emitting material is a material exhibiting fluorescence and/or phosphorescence.

When mixing the polymer compound of the present invention with a hole transporting material, the mixing ratio of the hole transporting material is 1 wt %-80 wt % based on the total amount of the mixture, and it is preferably 5 wt %-60 wt %. When mixing the polymer compound of the present invention with an electron transporting material, the mixing ratio of the electron transporting material is 1 wt %-80 wt % based on the total amount of the mixture, and it is preferably 5 wt %-60 wt %. Furthermore, when mixing the polymer compound of the present invention with a light-emitting material, the mixing ratio of the light-emitting material is 1 wt %-80 wt % based on the total amount of the mixture, and it is preferably 5 wt %-60 wt %.

When mixing the polymer compound of the present invention with a light-emitting material, a hole transporting material, and/or an electron transporting material, the mixing ratio of the light-emitting material is 1 wt %-50 wt % based on the total amount of the mixture, and preferably 5 wt %-40 wt %. The total amount of the hole transporting material and the electron transporting material is 1 wt %-50 wt %, and preferably 5 wt %-40 wt %. The amount of the polymer compound of the present invention is 99 wt %-20 wt %.

As the hole transporting material, electron transporting material, and light-emitting material to be mixed, known low molecular weight compounds, known phosphorescent compounds and known polymer compounds can be used, and it is preferable to use a polymer compound. As the hole transporting material, electron transporting material or light-emitting material of polymer compound, exemplified are: a polyfluorene and derivatives thereof and copolymers thereof; a polyarylene and derivatives thereof and copolymers thereof; a polyarylene vinylene and derivatives thereof and copolymers thereof; and a (co)polymer of aromatic amine and derivatives thereof. These are disclosed in WO 99/13692, WO 99/48160, GB 2340304A, WO 00/53656, WO 01/19834, WO 00/55927, GB 2348316 and WO 00/46321, WO 00/06665, WO 99/54943, WO 99/54385, U.S. Pat. No. 5,777,070 and WO 98/06773, WO 97/05184, WO 00/35987, WO 00/53655, WO 01/34722, WO 99/24526, WO 00/22027, WO 00/22026, WO 98/27136,U.S. Pat. No. 573,636 and WO 98/21262, U.S. Pat. No. 5,741,921, WO 97/09394, WO 96/29356, WO 96/10617, EP 0707020 and WO 95/07955, JP 2001-181618A, JP 2001-123156A, JP 2001-3045A, JP 2000-351967A, JP 2000-303066A, JP 2000-299189A, JP 2000-252065A, JP 2000-136379A, JP 2000-104057A, JP 2000-80167A, JP 10-324870A, JP 10-114891A, JP 9-111233A, JP 9-45478A, etc.

As the light-emitting material of low molecular weight compound, exemplified are: naphthalene, and derivatives thereof; anthracene and derivatives thereof, and derivatives thereof; coloring matters, such as polymethines, xanthenes, coumarins, and cyanines; 8-hydroxyquinoline or the metal complex of its derivative; aromatic amines; tetraphenyl cyclopentadienes or its derivative; tetraphenylbutadiene or its derivatives, etc.

Specifically, known materials disclosed in JP 57-51781A or JP 59-194393A, can be used.

As the phosphorescent compounds, exemplified are triplet luminescence complexes such as: Ir(ppy)$_3$ and Btp$_2$ Ir(acac) which have iridium as a central metal; PtOEP which has platinum as a central metal; and Eu(TTA)$_3$phen which has europium as a central metal, etc.

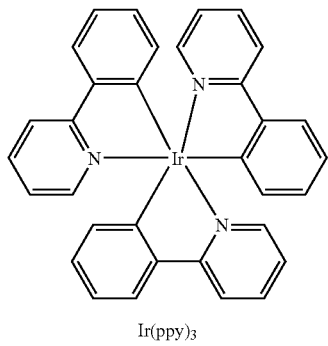

Ir(ppy)$_3$

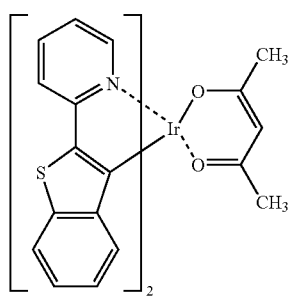

Btp$_2$Ir(acac)

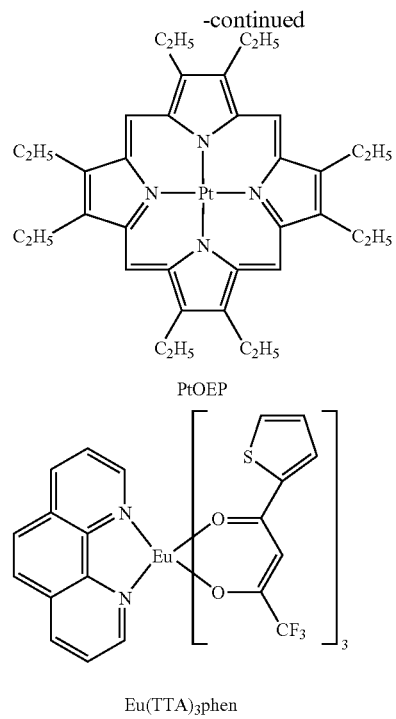

PtOEP

Eu(TTA)$_3$phen

Specifically, examples of the phosphorescent compounds are described in: Nature, (1998), 395, 151; Appl. Phys. Lett. (1999), 75(1), 4; Proc. SPIE-Int. Soc. Opt. Eng. (2001), 4105 (Organic Light-Emitting Materials and Devices IV), 119; J. Am. Chem. Soc., (2001), 123, 4304; Appl. Phys. Lett., (1997), 71(18), 2596; Syn. Met., (1998), 94(1), 103; Syn. Met., (1999), 99(2), 1361; Adv. Mater., (1999), 11(10), 852; Jpn. J. Appl. Phys., 34, 1883 (1995), etc.

The composition of the present invention may contain at least one kind of material selected from a hole transporting material, an electron transporting material, and a light-emitting material, which can be used for a light-emitting material or a charge transporting material. The composition of the present invention may contain two or more of the polymer compounds of the present invention.

The mixing ration of at least one kind of material selected from a hole transporting material, an electron transporting material, and a light-emitting material, with the polymer compound of the present invention can be determined according to the use. In case of the use as a light-emitting material, the mixing ration is preferably the same as that in the above mentioned light emitting layer.

Regarding the thickness of the light emitting layer, the optimum value differs depending on material used, and may properly be selected so that the driving voltage and the light emitting efficiency become an optimum value, and the thickness is, for example, from 1 nm to 1 μm, preferably from 2 nm to 500 nm, further preferably from 5 nm to 200 nm.

As a forming method of the light emitting layer, for example, exemplified is a method by film forming from a solution. As the film-forming method from a solution, application methods, such as a spin coat method, casting method, micro gravure coating method, gravure coating method, bar-coating method, roll coating method, wire bar coat method, dip coat method, spray coating method, screen printing, flexography method, offset printing, and ink jet printing method, can be used. Printing methods, such as screen printing, flexography method, offset printing, and ink jet printing method, are preferable, since pattern forming and multicolored printing are easy.

As the ink composition used for the printing method etc., at least 1 kind of the polymer compounds of the present invention should be contained, additives, such as a hole transporting material, electron transporting material, light-emitting material, solvent, or stabilizer, may be contained in addition to the polymer compound of the present invention.

The amount of the polymer compound of the present invention in said ink composition is 20 wt %-100 wt % based on the total weight of the composition except the solvent, and preferably 40 wt %-100 wt %.

When a solvent is contained, the amount of the solvent in the ink composition is 1 wt %-99.9 wt % based on the total weight of the composition, preferably 60 wt %-99.5 wt %, and more preferably 80 wt %-99.0 wt %.

The suitable viscosity of the ink composition is depend on the printing methods. When the ink composition is processed via a discharging apparatus, in order to prevent clogging and ejection-deflecting at discharging, the viscosity is preferably in a range of 1-20 mPa·s at 25° C.

The solvent used as the ink composition is not especially limited, and preferable are those which can dissolve or disperse the materials constituting the ink composition other than the solvent uniformly.

When the materials constituting the ink composition are soluble in a nonpolar solvent, as the solvent, exemplified are: chlorinated solvents, such as chloroform, methylene chloride, and dichloroethane; ether solvents, such as tetrahydrofuran; aromatic hydrocarbon solvents, such as toluene, and xylene; ketone solvents, such as acetone, and methyl ethyl ketone; and ester solvents, such as ethyl acetate, butyl acetate, and ethyl cellosolve acetate.

Moreover, as the polymer LED of the present invention, there are exemplified: a polymer LED having an electron transporting layer disposed between a cathode and a light emitting layer; a polymer LED having a hole transporting layer disposed between an anode and a light emitting layer; and a polymer LED having an electron transporting layer disposed between a cathode and a light emitting layer, and a hole transporting layer disposed between an anode and a light emitting layer.

For example, the following structures a) to d) are specifically exemplified.

a) anode/light emitting layer/cathode b) anode/hole transporting layer/light emitting layer/cathode c) anode/light emitting layer/electron transporting layer//cathode d) anode/hole transporting layer/light emitting layer/electron transporting layer/cathode (wherein, / indicates adjacent lamination of layers. Hereinafter, the same)

When the polymer LED of the present invention has a hole transporting layer, as the hole transporting materials used, there are exemplified polyvinylcarbazole or derivatives thereof, polysilane or derivatives thereof, polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, or the like.

Specific examples of the hole transporting material include those described in JP 63-70257A, JP 63-175860A, JP 2-135359A, JP 2-135361A, JP 2-209988A, JP 3-37992A and JP 3-152184A.

Among them, as the hole transporting materials used in the hole transporting layer, preferable are polymer hole transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2,5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain.

Moreover, as the hole transporting material of low molecular weight compound, exemplified are pyrazoline derivatives, arylamine derivatives, stilbene derivatives, and triphenyl diamine derivatives. In case of the low molecular weight hole transporting material, it is preferably dispersed in a polymer binder for use.

As the polymer binder to be mixed, preferable are those which do not inhibit charge transportation extremely and do not have strong absorbance in a visible light.

As the polymer binder, exemplified are: poly(N-vinylcarbazole); polyaniline or derivatives thereof; poly thiophene or derivatives thereof; poly(p-phenylenevinylene) or derivatives thereof; poly(2,5-thienylenevinylene) or derivatives thereof; polycarbonate; polyacrylate, poly methylacrylate, polymethylmethacrylate, polystyrene, polyvinylchloride, polysiloxane, etc.

Polyvinyl carbazole and derivatives thereof are obtained from, for example, a vinyl monomer, by cationic polymerization or radical polymerization.

As the polysilane or derivatives thereof, there are exemplified compounds described in Chem. Rev., 89, 1359 (1989) and GB 2300196 published specification, and the like. For synthesis, methods described in them can be used, and a Kipping method can be suitably used particularly.

As the polysiloxane or derivatives thereof, those having the structure of the above-described hole transporting material having lower molecular weight in the side chain or main chain, since the siloxane skeleton structure has poor hole transporting property. Particularly, there are exemplified those having an aromatic amine having hole transporting property in the side chain or main chain.

The method for forming a hole transporting layer is not restricted, and in the case of a hole transporting layer having lower molecular weight, a method in which the layer is formed from a mixed solution with a polymer binder is exemplified. In the case of a polymer hole transporting material, a method in which the layer is formed from a solution is exemplified.

The solvent used for the film forming from a solution is not particularly restricted providing it can dissolve a hole transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like, from a solution.

Regarding the thickness of the hole transporting layer, the optimum value differs depending on material used, and may properly be selected so that the driving voltage and the light emitting efficiency become an optimum value. The thickness is should be at least such that pinholes are not generated, but when it is too thick, the driving voltage of a device becomes high, and it is not preferable. Therefore, the film thickness of the hole transporting layer is, for example, from 1 nm to 1 μm, preferably 2 nm-500 nm, and more preferably 5 nm-200 nm.

When the polymer LED of the present invention has an electron transporting layer, known compounds are used as the electron transporting materials, and there are exemplified oxadiazole derivatives, anthraquinonedimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP 63-70257A, JP 63-175860A, JP 2-135359A, JP 2-135361A, JP 2-209988A, JP 3-37992A and JP 3-152184A.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t-butylphenyl)-1,3,4-oxadiazole, benzoquinone, anthraquinone, tris(8-quinolinol)aluminum and polyquinoline are further preferable.

The method for forming the electron transporting layer is not particularly restricted, and in the case of an electron transporting material having lower molecular weight, a vapor deposition method from a powder, or a method of film-forming from a solution or melted state is exemplified, and in the case of a polymer electron transporting material, a method of film-forming from a solution or melted state is exemplified, respectively. At the time of film forming from a solution or a molten state, the above polymer binder can be used together.

The solvent used in the film-forming from a solution is not particularly restricted provided it can dissolve electron transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

Regarding the thickness of the electron transporting layer, the optimum value differs depending on material used, and may properly be selected so that the driving voltage and the light emitting efficiency become an optimum value. The thickness is should be at least such that pinholes are not generated, but when it is too thick, the driving voltage of a device becomes high, and it is not preferable.

Therefore, the film thickness of the hole transporting layer is, for example, from 1 nm to 1 μm, preferably 2 nm-500 nm, and more preferably 5 nm-200 nm.

Among charge transporting layers provided adjacent to an electrode, those having a function to improve the charge injection efficiency from an electrode and to lower the driving voltage of a device may be sometimes called charge injection layers (a hole injection layer, electronic injection layer).

For enhancing adherence with an electrode and improving charge injection from an electrode, the above-described charge injecting layer or insulation layer having a thickness of 2 nm or less may also be provided adjacent to an electrode, and further, for enhancing adherence of the interface, preventing mixing and the like, a thin buffer layer may also be inserted into the interface of a charge transporting layer and light emitting layer.

The order and number of layers laminated and the thickness of each layer can be appropriately applied while considering light emitting efficiency and life of the device.

In the present invention, as the polymer LED having a charge injecting layer (electron injecting layer, hole injecting layer) provided, there are listed a polymer LED having a charge injecting layer provided adjacent to a cathode and a polymer LED having a charge injecting layer provided adjacent to an anode.

For example, the following structures e) to p) are specifically exemplified.

e) anode/charge injecting layer/light emitting layer/cathode f) anode/light emitting layer/charge injecting layer/cathode g) anode/charge injecting layer/light emitting layer/charge injecting layer/cathode h) anode/charge injecting layer/hole transporting layer/light emitting layer/cathode i) anode/hole transporting layer/light emitting layer/charge injecting layer/cathode j) anode/charge injecting layer/hole transporting layer/light emitting layer/charge injecting layer/cathode k) anode/charge injecting layer/light emitting layer/electron transporting layer/cathode l) anode/light emitting layer/electron transporting layer/charge injecting layer/cathode m) anode/charge injecting layer/light emitting layer/electron transporting layer/charge injecting layer/cathode n) anode/charge injecting layer/hole transporting layer/light emitting layer/electron transporting layer/cathode o) anode/hole transporting layer/light emitting layer/electron transporting layer/charge injecting layer/cathode p) anode/charge injecting layer/hole transporting layer/light emitting layer/electron transporting layer/charge injecting layer/cathode As the specific examples of the charge injecting layer, there are exemplified: layers containing an conducting polymer; layers which are disposed between an anode and a hole transporting layer and contain a material having an ionization potential between the ionization potential of an anode material and the ionization potential of a hole transporting material contained in the hole transporting layer, and the like.

When the above-described charge injecting layer is a layer containing an conducting polymer, the electric conductivity of the conducting polymer is preferably $10^{-5}$ S/cm or more and $10^3$ S/cm or less, and for decreasing the leak current between light emitting pixels, more preferably $10^{-5}$ S/cm or more and $10^2$ S/cm or less, further preferably $10^{-5}$ S/cm or more and $10^1$ S/cm or less.

Usually, in order to make the electrical conductivity of the conductive polymer $10^{-5}$ S/cm or more and $10^3$ S/cm or less, an appropriate amount of ion is doped to the conductive polymer.

Regarding the kind of ion to be doped, an anion is used for a hole injecting layer and a cation is used for an electron injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified.

The thickness of the charge injecting layer is for example, from 1 nm to 100 nm, preferably from 2 nm to 50 nm.

Materials used as the charge injecting layer are appropriately selected in view of the relationship with an electrode or a material of the adjacent layer. Exemplified are: conductive polymers, such as polyaniline and its derivative, polythiophene and its derivative, polypyrrole and its derivative, polyphenylenevinylene and its derivative, polythienylenevinylene and its derivative, poly quinoline and its derivative, polyquinoxaline and its derivative, and a polymer which includes aromatic amine structure in the main chain or side chain; metal phthalocyanines such as copper phthalocyanine etc.; carbon, etc.

The insulation layer having a thickness of 2 nm or less has a function of fascilitating the charge injection. As the materials of the insulating layer, metal fluoride, metal oxide, organic insulating material, etc. are exemplified. As the polymer LED having an insulation layer having a thickness of 2 nm or less, exemplified are: a polymer LED containing an insulation layer having a thickness of 2 nm or less adjacent to cathode; and a polymer LED containing an insulation layer having a thickness of 2 nm or less adjacent to anode.

Specifically, there are listed the following structures q) to ab) for example.

q) anode/insulation layer having a thickness of 2 nm or less/light emitting layer/cathode r) anode/light emitting layer/insulation layer having a thickness of 2 nm or less/cathode s) anode/insulation layer having a thickness of 2 nm or less/light emitting layer/insulation layer having a thickness of 2 nm or less/cathode t) anode/insulation layer having a thickness of 2 nm or less/hole transporting layer/light emitting layer/cathode u) anode/hole transporting layer/light emitting layer/insulation layer having a thickness of 2 nm or less/cathode v) anode/insulation layer having a thickness of 2 nm or less/hole transporting layer/light emitting layer/insulation layer having a thickness of 2 nm or less/cathode w) anode/insulation layer having a thickness of 2 nm or less/light emitting layer/electron transporting layer/cathode x) anode/light emitting layer/electron transporting layer/insulation layer having a thickness of 2 nm or less/cathode y) anode/insulation layer having a thickness of 2 nm or less/light emitting layer/electron transporting layer/insulation layer having a thickness of 2 nm or less/cathode z) anode/insulation layer having a thickness of 2 nm or less/hole transporting layer/light emitting layer/electron transporting layer/cathode aa) anode/hole transporting layer/light emitting layer/electron transporting layer/insulation layer having a thickness of 2 nm or less/cathode ab) anode/insulation layer having a thickness of 2 nm or less/hole transporting layer/light emitting layer/electron transporting layer/insulation layer having a thickness of 2 nm or less/cathode The substrate forming the polymer LED of the present invention may preferably be that does not change in forming an electrode and layers of organic materials, and there are exemplified glass, plastics, polymer film, silicon substrates and the like. In the case of a opaque substrate, it is preferable that the opposite electrode is transparent or semitransparent.

Usually, either the anode or the cathode in the polymer LED of the present invention is transparent or semitransparent. It is preferable that the anode side is transparent or semitransparent.

As the material of this anode, electron conductive metal oxide films, semitransparent metal thin films and the like are used. Specifically, there are used indium oxide, zinc oxide, tin oxide, and films (NESA and the like) fabricated by using an electron conductive glass composed of indium-tin-oxide (ITO), indium•zinc•oxide and the like, which are metal oxide complexes, and gold, platinum, silver, copper and the like are used, and among them, ITO, indium•zinc•oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like.

The thickness of the anode can be appropriately selected while considering transmission of a light and electric conductivity, and for example, from 10 nm to 10 μm, preferably from 20 nm to 1 μm, further preferably from 50 nm to 500 nm.

Further, for easy charge injection, there may be provided on the anode a layer comprising a phthalocyanine derivative conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two of more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers.

The thickness of the cathode can be appropriately selected while considering transmission of a light and electric conductivity, and for example, from 10 μm to 10 μm, preferably from 20 nm to 1 μm, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising an conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymer compound, metal oxide, metal fluoride, metal borate and the like. As the protective cover, there can be used a glass plate, a plastic plate the surface of which has been subjected to lower water-permeation treatment, and the like, and there is suitably used a method in which the cover is pasted with an device substrate by a thermosetting resin or light-curing resin for sealing. If space is maintained using a spacer, it is easy to prevent an device from being injured. If an inner gas such as nitrogen and argon is sealed in this space, it is possible to prevent oxidation of a cathode, and further, by placing a desiccant such as barium oxide and the like in the above-described space, it is easy to suppress the damage of an device by moisture adhered in the production process. Among them, any one means or more are preferably adopted.

The polymer LED of the present invention can be suitably used as a flat light source, segment display apparatus, dot-matrix display apparatus, and back light of a liquid crystal display.

For obtaining light emission in plane form using the polymer LED of the present invention, an anode and a cathode in the plane form may properly be placed so that they are laminated each other. Further, for obtaining light emission in pattern form, there are a method in which a mask with a window in pattern form is placed on the above-described plane light emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymer compounds emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light emitting device in plane form is a thin self-light-emitting one, and can be suitably used as a flat light source for back-light of a liquid crystal display, or as a flat light source for illumination. Further, if a flexible plate is used, it can also be used as a curved light source or a display.

EXAMPLES

The following examples further illustrate the present invention in detail but do not limit the scope thereof.

As for the molecular weight, a number-average molecular weight and a weight-average molecular weight were obtained as a polystyrene reduced average molecular weight by gel permeation chromatography (GPC).

Synthetic Example 1

Synthesis of Compound A

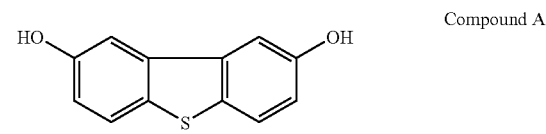

Compound A 2,8-dibromodibenzothiophene 7 g and THF 280 ml were charged into a 1 liter four-necked flask under an inert atmosphere, and stirred to dissolve at a room temperature, then cooled to −78° C. n-butyllithium 29 ml (1.6 mol/L hexane solution) was added dropwise to it. After the dropwise addition, it was stirred for 2 hours, at the fixed temperature, and trimethoxyboronic acid 13 g was added dropwise. After the dropwise addition, the temperature was raised to a room temperature slowly. After stirring for 3 hours at a room temperature, disappearance of the raw material was confirmed by TLC. 5% sulfuric acid 100 ml was added to terminate the reaction, and stirred at a room temperature for 12 hours. After washing with water, the organic layer was separated. After replacing the solvent with ethyl acetate, 30% aqueous hydrogen peroxide 5 ml was added and stirred at 40° C. for 5 hours. Then the organic layer was separated, washed with 10% aqueous solution of iron(II)ammonium sulfate, and dried. By distilling off the solvent, brown solid 4.43 g was obtained. By-products, such as a dimer, were also produced as confirmed by LC-MS measurement, and the purity of Compound A was 77% (LC area percentage).

MS (APCI(−)):(M−H)⁻ 215

Synthetic Example 2

Synthesis of Compound B

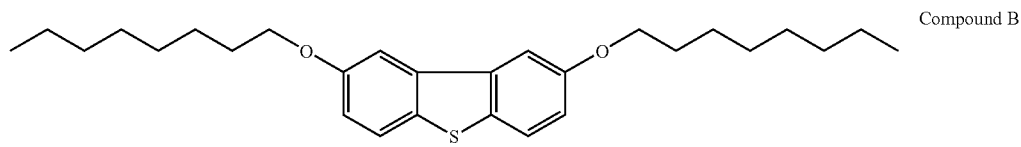

Compound B

Under an inert atmosphere, into a 200 ml three neck flask, Compound A 4.43 g, n-octylbromide 25.1 g and potassium carbonate 12.5 g were charged, and methylisobutyl ketone 50 ml was added as a solvent, then refluxed with heating at 125° C. for 6 hours. After the reaction, the solvent was distilled off, and chloroform and water are added to the reaction product, the organic layer was separated and further washed with water twice. After drying by anhydrous sodium sulfate, it was purified through silica gel column (eluent: toluene/cyclohexane=1/10) to give Compound B 8.49 g (LC area %=97%, yield=94%) was obtained.

$^1$H-NMR (300 MHz/CDCl$_3$):

δ 0.91 (t, 6H), 1.31~1.90 (m, 24H), 4.08 (t, 4H), 7.07 (dd, 2H), 7.55 (d, 2H), 7. 68 (d, 2H)

Synthetic Example 3

Synthesis of Compound C

Compound B 6.67 g and acetic acid 40 ml were charged into a 100 ml three neck flask, and the bath-temperature was raised to 140° C. with using an oil bath. Then, 30% hydrogen-peroxide 13 ml was added through a condenser, and stirred vigorously, then the reaction was terminated by being poured into 180 ml of cold water. After extracting with chloroform and being dried, the solvent was distilled off and Compound C 6.96 g (LC area %=90%, yield=97%) was obtained.

$^1$H-NMR (300 MHz/CDCl$_3$):

δ 0.90 (t, 6H), 1.26~1.87 (m, 24H), 4.06 (t, 4H), 7.19 (dd, 2H), 7.69 (d, 2H), 7.84 (d, 2H)

MS (APCI(+)):(M+H)$^+$ 473

Synthetic Example 4

Synthesis of Compound D

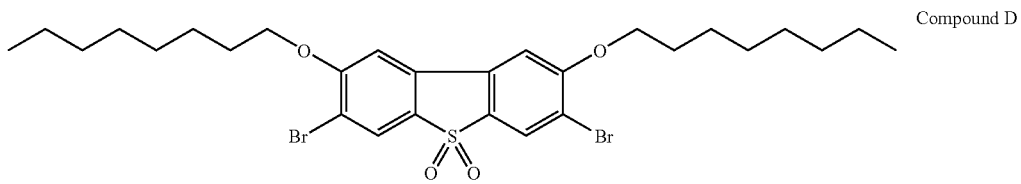

Compound D

Compound C 3.96 g and mixed solution 15 ml of acetic acid/chloroform=1:1 were charged into a four-necked flask 200 ml under an inert atmosphere, stirred at 70° C. and dissolved. Then, bromine 6.02 g dissolved in the above solvent 3 ml was added and stirred for 3 hours. A sodium thiosulfate aqueous solution was added to remove unreacted bromine, and chloroform and water are added to the reaction

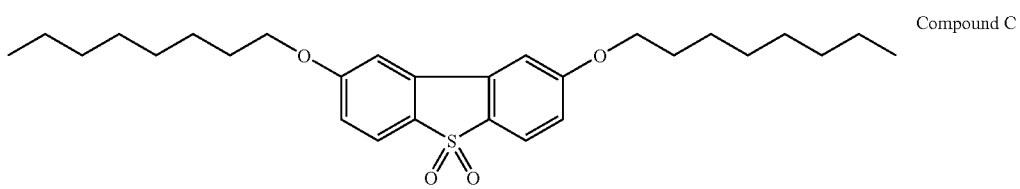

Compound C product, the organic layer was separated and dried. After distilling off the solvent, it was purified through silica gel column (eluent: chloroform/hexane=1/4) to give Compound D 4.46 g (LC area %=98%, yield=84%) was obtained.

$^1$H-NMR (300 MHz/CDCl$_3$):

δ0.95 (t, 6H), 1.30~1.99 (m, 24H), 4.19 (t, 4H), 7.04 (s, 2H), 7.89 (s, 2H)

MS (FD$^+$) M$^+$ 630

Synthetic Example 5

Synthesis of Compound E

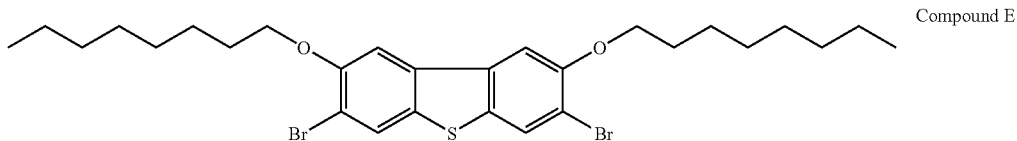

Compound E

Compound D 3.9 g and diethyl ether 50 ml were charged into a 200 ml three neck flask under an inert atmosphere, and the temperature was raised to 40° C. and stirred. Lithium aluminum hydride 1.17 g was added a little at a time and reacted for 5 hours. Excess of lithium aluminum hydride was decomposed by adding a small amount of water at a time, and washed with 36% hydrochloric acid 5.7 ml. Chloroform and water are added to the reaction mixture, the organic layer was separated and dried. It was purified through silica gel column (eluent: chloroform/hexane=1/5) to give Compound E 1.8 g (LC area %=99%, yield=49%) was obtained.

$^1$H-NMR (300 MHz/CDCl$_3$):

δ 0.90 (t, 6H), 1.26~1.97 (m, 24H), 4.15 (t, 4H), 7.45 (s, 2H), 7.94 (s, 2H)

MS (FD$^+$) M$^+$ 598

According to MS (APCI (+)) method, peaks were observed at 615 and 598.

Synthetic Example 6

Synthesis of Polymer Compound 1

After dissolving 2,7-dibromo-9,9-dioctylfluorene (26 g, 0.047 mol), 2,7-dibromo-9,9-diisopentylfluorene (5.6 g, 0.012 mol), and 2,2'-bipyridyl (22 g, 0.141 mol) in tetrahydrofuran (dehydrated) 1600 ml, the inside of the system was replaced with nitrogen by bubbling with nitrogen gas. To this solution, bis(1,5-cyclooctadiene)nickel(0) {Ni(COD)$_2$} (40 g, 0.15 mol) was added, and the temperature was raised to 60° C. and reacted for 8 hours.

After the reaction, this reaction liquid was cooled to a room temperature (about 25° C.), and added dropwise to a mixed solution of 25% aqueous ammonia 200 ml/methanol 1200 ml/1200 ml ion-exchanged water and stirred for 30 minutes. The deposited precipitate was filtrated and air-dried. Then, it was dissolved in toluene 1100 ml and filtrated. The filtrate was added dropwise to methanol 3300 ml, and stirred for 30 minutes. Then the deposited precipitate was filtrated, washed with methanol 1000 ml, and then dried under reduced pressure for 5 hours. A polymer was obtained in yield of 20 mg. This polymer is referred to as Polymer Compound 1.

The polystyrene reduced average molecular weight of Polymer Compound 1 was Mn=4.6×10$^4$, and Mw=1.1×10$^5$.

Synthetic Example 7

Synthesis of Polymer Compound 2

After dissolving 2,7-dibromo-9,9-dioctylfluorene (5.8 g, 0.0105 mol), the above N,N'-bis(4-bromophenyl)-N,N'-bis(4-n-butylphenyl)-1,4-phenylenediamine (3.1 g, 0.0045 mmol) and 2,2'-bipyridyl (6.6 g) in 20 ml tetrahydrofuran (dehydrated), the inside of the system was replaced with nitrogen by bubbling with nitrogen gas. To this solution, bis(1,5-cyclooctadiene)nickel(0) {Ni(COD)$_2$} (12.0 g) was added, and the temperature was raised to 60° C. and reacted for 3 hours with stirring.

After the reaction, this reaction liquid was cooled to a room temperature (about 25° C.), and added dropwise to a mixed solution of 25% aqueous ammonia 50 ml/methanol 200 ml/300 ml ion-exchanged water and stirred for 1 hour. The deposited precipitate was filtrated and dried for 2 hours under reduced pressure, and dissolved in about 350 ml of toluene. Then, about 200 ml of 1N hydrochloric acid was added and stirred for 1 hour, the aqueous layer was removed; about 200 ml of 4% aqueous ammonia was added to the organic layer, stirred for 1 hour, and the aqueous layer was removed; about 200 ml of ion-exchanged water was added, and the aqueous layer was removed. The organic layer was added dropwise to about 700 ml of methanol, and stirred for 1 hour. Then the deposited precipitate was filtrated and dried under reduced pressure for 2 hours, and dissolved in about 350 ml toluene. Then, purification through alumina column was carried out, and recovered toluene solution was added to about 700 ml of methanol, stirred for 1 hour, and deposited precipitate was filtrated and dried under reduced pressure for two hours. The yield of the obtained copolymer (referred to as Polymer Compound 2) was 3.5 g. Polystyrene reduced number average molecular weight and weight average molecular weight were Mn=3.4×10$^4$ and Mw=5.4×10$^4$, respectively.

Example 1

Synthesis of N,N'-diphenyl-N,N'-bis(2,4,6-trimethylphenyl)-1,4-phenylenediamine

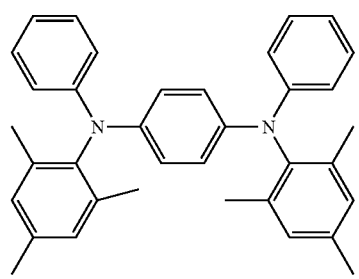

Under an inert atmosphere, deaerated toluene (dehydrated) 40 ml was put in a 100 ml three-necked flask, and 0.40 g of tri(t-butyl)phosphine was added. Then, tris(dibenzylidine acetone)dipalladium 0.52 g, bromo mesitylene 9.5 g, t-butoxy sodium 5.5 g, and N,N'-diphenyl-1,4-phenylenedianine 5.0 g were added, and reacted at 100° C. for 3 hours.

The reaction liquid was charged into saturated NaCl aqueous solution, and extracted by about 50° C. chloroform 300 ml. After distilling off the solvent, toluene 100 ml was added thereto and heated to dissolve, and then stand it to cool. The precipitation was filtrated and 6.1 g of white solid was obtained.

$^1$H-NMR (300 MHz/CDCl$_3$):

δ (ppm)=1.2-2.8 [br, 18H], 6.0-8.0 [br, 18H]

MS (APCI(+)):M$^+$ 497

Synthesis of N,N'-bis(4-bromophenyl)-N,N'-bis(2,4,6-trimethylphenyl)-1,4-phenylenediamine

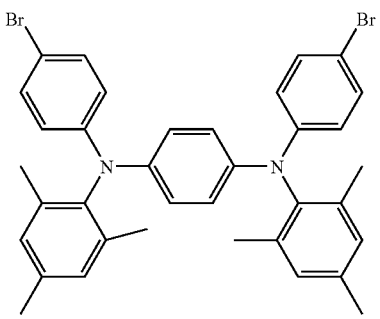

Under an inert atmosphere, dehydrated N,N-dimethylformamide 200 ml was put into a 300 ml three-necked flask and 1.0 g of above N,N'-diphenyl-N,N'-bis(2,4,6-trimethylphenyl)-1,4-phenylenediamine was dissolved. Then, a solution of N-bromosuccinimide 0.75 g/N,N-dimethylformamide 1.0 ml were added dropwise, and reacted in an ice bath for one whole day and night.

The precipitate which added 100 ml of water to reaction liquid, and deposited was filtrated, and 1.2 g of the solids of thin brown was obtained.

$^1$H-NMR (300 MHz/CDCl$_3$):

δ (ppm)=1.9-2.1 [br, 12H], 2.2-2.4 [br, 6H], 6.6-7.4 [br, 16H]

MS (APCI(+)):M$^+$ 655

Synthesis of Polymer Compound 3

After dissolving the above compound E (346 mg, 0.578 mmol), the above N,N'-bis(4-bromophenyl)-N,N'-bis(2,4,6-trimethylphenyl)-1,4-phenylenediamine (97 mg, 0.148 mmol) and 2,2'-bipyridyl (263 mg, 1.68 mmol) in tetrahydrofuran (dehydrated) 20 ml, the inside of the system was replaced with nitrogen by bubbling with nitrogen gas. To this solution, bis(1,5-cyclooctadiene)nickel(0) {Ni(COD)$_2$} (470 g, 1.71 mol) was added, and the temperature was raised to 60° C. and reacted for 3 hours with stirring.

After the reaction, this reaction liquid was cooled to a room temperature (about 25° C.), and added dropwise to a mixed solution of 25% aqueous ammonia 10 ml/methanol 120 ml/50 ml ion-exchanged water and stirred for 1 hour. The deposited precipitate was filtrated and dried for 2 hours under reduced pressure, and dissolved in about 30 ml of toluene. Then, 30 ml of 1N hydrochloric acid was added and stirred for 1 hour, the aqueous layer was removed; and 30 ml of 4% aqueous ammonia was added to the organic layer, stirred for 1 hour, and the aqueous layer was removed. The organic layer was added dropwise to 200 ml of methanol, and stirred for 1 hour. Then the deposited precipitate was filtrated and dried under reduced pressure for 2 hours, and dissolved in 30 ml toluene. Then, purification through alumina column (10 g of alumina) was carried out, and recovered toluene solution was added to about 250 ml of methanol, stirred for 1 hour, and deposited precipitate was filtrated and dried under reduced pressure for two hours. The yield of the obtained copolymer (referred to as Polymer Compound 3) was 228.6 mg. Polystyrene reduced number average molecular weight was Mn=5.4×10$^4$.

Example 2

On a glass substrate on which ITO film was formed in a thickness of 150 nm by sputtering method, a film was formed by a thickness of 70 nm with a spin coat using a solution (Bayer Co., Baytron P) of poly(ethylenedioxythiophene)/polystyrene sulfonic acid, and then it was dried at 200° C. for 10 minutes on a hot plate. Next, a film was formed by spin-coating at a rotational rate of 1500 rpm, using toluene solutions of 1:1 mixture (weight ratio) of Polymer Compound 3 and Polymer Compound 1 whose concentration was set to being 1.5 wt %. Furthermore, after drying this at 80° C. under reduced pressure for 1 hour, an EL device was fabricated, by depositing about 4 nm of LiF, about 5 nm of calcium as the cathode, and subsequently, about 35 nm of aluminum. Here, after the vacuum degree reached to 1×10$^{-4}$ Pa or less, the deposition of metal was started.

By applying a voltage to the resultant device, EL luminescence having a peak at 464 nm was observed. Attenuation of luminance was measured with setting the initial luminance to 100 cd/m$^2$, and the luminance after 300 hours was 73 cd/m$^2$.

Comparative Example 1

A device was produced as the same manner with Example 2 except that Polymer Compound 2 was used instead of Polymer Compound 3, a film was formed by spin-coating at a rotational rate of 1200 rpm, using 1.5 wt % toluene solutions of 1:1 mixture (weight ratio) of Polymer Compound 2 and Polymer Compound 1.

By applying a voltage to the resultant device, EL luminescence having a peak at 464 nm was observed. Attenuation of luminance was measured with setting the initial luminance to 100 cd/m$^2$, and the luminance after 300 hours was 53 cd/m$^2$.

Example 3

Synthesis of Compound F

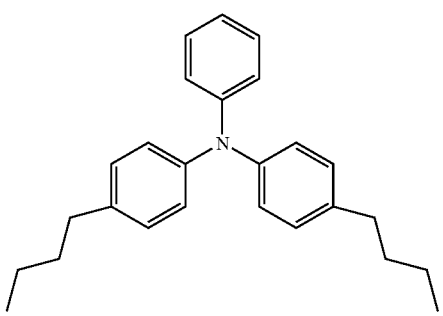

Compound F 1.68 g (1.83 mmol) of tris(dibenzylidine acetone) dipalladium, 1.52 g (2.74 mmol) of diphenylphosphinoferrocene, 17.6 g (183 mmol) of sodium tertiarybutoxide, and toluene 430 mL were put into a 1 L three-necked flask under an inert atmosphere, and stirred for 10 minutes at a room temperature. Then, aniline was added and stirred further for 10 minutes. Then, the temperature was raised to 80° C., and 1-bromo-4- butylbenzene 13 g (61 mmol) dissolved in toluene 50 mL was added dropwise, and after the addition, the temperature was raised to 125° C. After 2 hours, it was cooled to a room temperature, the toluene layer was washed with 1N hydrochloric acid, and dried with sodium sulfate. After the toluene solvent was distilled off, the residual matter was purified through silica gel with using toluene:cyclohexane=1:5 mixed solvent as the eluent, and 5.39 g (25% yield) of the desired compound F was obtained.

$^1$H-NMR (300 MHz/CDCl$_3$):

δ 0.94 (t, 6H), 1.31-1.43 (m, 4H), 1.51-1.64 (m, 4H), 2.56 (t, 4H), 6.90-7.06 (m, 7H), 7.16-7.24 (m, 6H)

MS (APCI(+)) (M+H)$^+$ 358

Synthesis of Compound G

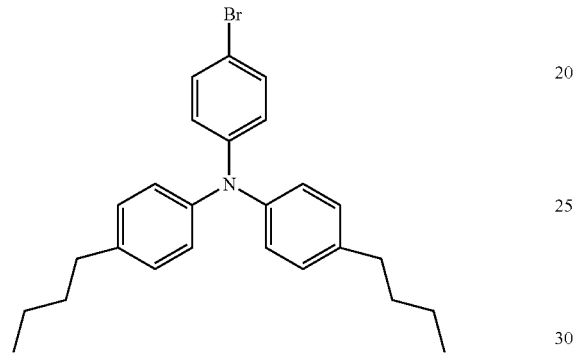

Compound G 5.39 g (15 mmol) of compound F was dissolved in N,N-dimethylformamide (DMF) 130 mL. Then, 2.63 g (14.8 mmol) of N-bromo succinimid (NBS) was dissolved in DMF 65 mL, and added dropwise at a room temperature. After the dropwise addition, it was stirred for 24 hours and the reaction was terminated by adding an aqueous solution of sodium thiosulfate. Toluene and water was added to the reaction mixture, and the organic layer was separated and dried with sodium sulfate. Sodium sulfate was removed by filtration and the solvent was distilled off, and 6.05 g (92% yield) of the desired compound G was obtained.

$^1$H-NMR (300 MHz/CDCl$_3$):

δ 0.93 (t, 6H), 1.30-1.43 (m, 4H), 1.53-1.64 (m, 4H), 2.56 (t, 4H), 6.91 (d, 4H), 6.95 (d, 2H), 7.01 (d, 4H), 7.27 (d, 2H)<

Synthesis of Compound H

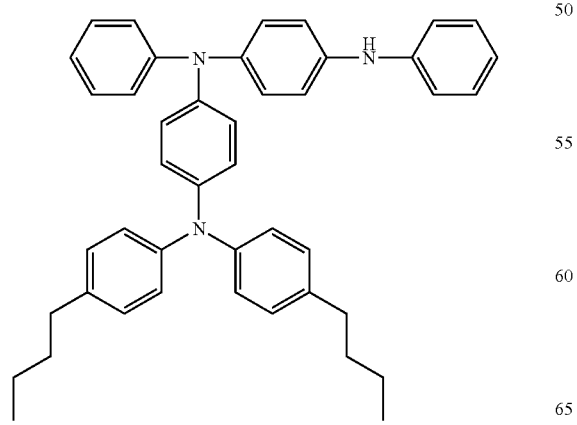

Compound H 0.69 g (0.76 mmol) of tris(dibenzylidine acetone) dipalladium, 0.63 g (1.13 mmol) of diphenylphosphinoferrocene, and toluene 180 mL were put into a 500 mL three-necked flask under an inert atmosphere, and stirred for 10 minutes at a room temperature. Then, Compound G 11 g (25.2 mmol) was put in, and stirred further for 10 minutes at a room temperature. Then, 13.1 g (50.4 mmol) of N,N-diphenylphenylene diamine and 14.5 g (151 mmol) of sodium tertiary butoxide were put in, and the temperature was raised to 125° C., it was refluxed for 8 hours reflux. The reaction liquid was washed with 1N hydrochloric acid, and the organic layer was separated and dried with sodium sulfate. After sodium sulfate was removed by filtration and the solvent was distilled off, the residual material was purified through silica gel with using toluene:hexane=5:1 mixed solvent as the eluent, and 8.84 g (57% yield) of the desired compound H was obtained.

$^1$H-NMR (300 MHz/CDCl$_3$):

δ 0.93 (t, 6H), 1.30-1.42 (m, 4H), 1.51-1.64 (m, 4H), 2.55 (t, 4H), 6.98-7.34 (br, 27H)

Synthesis of Compound J

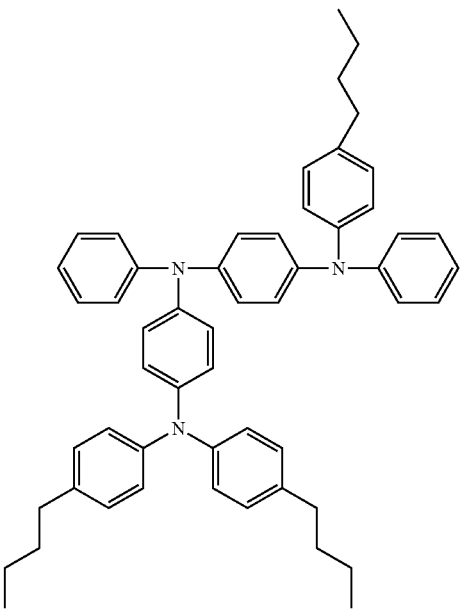

Compound J 0.11 g (0.12 mmol) of tris(dibenzylidine acetone) dipalladium, 0.10 g (0.18 mmol) of diphenylphosphinoferrocene, 2.34 g (24.4 mmol) of sodium tertiary butoxide, and toluene 60 mL were put into 200 mL a three-necked flask under an inert atmosphere, and stirred for 10 minutes at a room temperature. Then, 5 g (8.12 mmol) of compound H was put in, and further stirred for 10 minutes at a room temperature. Then, 1.73 g (8.12 mmol) of 1-bromo-4-butylbenzene was put in, and the temperature was raised to 125° C., it was refluxed for 8 hours reflux. The reaction liquid was washed with 1N hydrochloric acid, and the organic layer was separated and dried with sodium sulfate. After sodium sulfate was removed by filtration and the solvent was distilled off, the residual material was purified through silica gel with using toluene:cyclohexane=1:5 mixed solvent as the eluent, and 4.50 g (74% yield) of the desired compound J was obtained.

$^1$H-NMR (300 MHz/CDCl$_3$):

δ 0.93 (t, 9H), 1.30-1.43 (m, 6H), 1.52-1.64 (m, 6H), 2.56 (br, 6H), 6.95-7.28 (br, 30H)<

Synthesis of Compound K

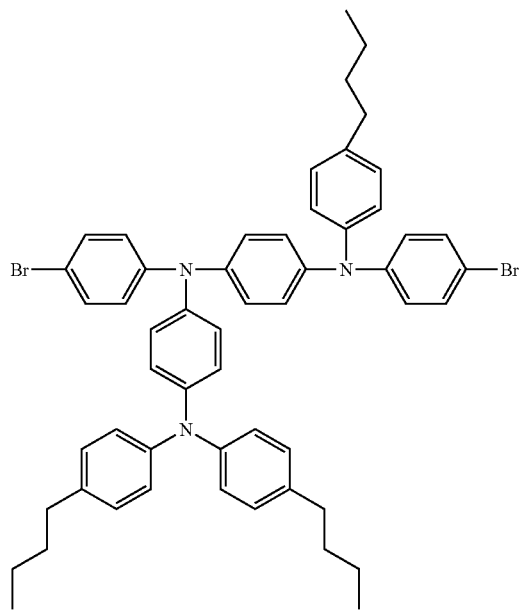

Compound K 4.5 g (6.02 mmol) of compound J was dissolved in 50 mL of N,N-dimethylformamide (DMF). Then, 2.10 g (11.8 mmol) of N-bromosuccinimid (NBS) dissolved in 50 mL of DMF, and added dropwise at a room temperature. After the dropwise addition, it was stirred for 24 hours and the reaction was terminated by adding an aqueous solution of sodium thiosulfate. It was poured into 500 mL water and the deposited precipitate was filtrated. 5.10 g (94% yield) of the desired compound K was obtained.

$^1$H-NMR (300 MHz/CDCl$_3$):

δ 0.94 (t, 9H), 1.34-1.41 (br, 6H), 1.52-1.64 (br, 6H), 2.56 (br, 6H), 6.42 (d, 4H), 6.87-7.41 (br, 24H)

MS (APCI(+)) (M+H)$^+$ 906

Synthesis of Polymer Compound 4

After dissolving 0.63 g (1.05 mmol) of the above compound E, 0.41 g (0.45 mmol) of the above compound K, and 0.55 g of 2,2'-bipyridyl in tetrahydrofuran (dehydrated) 45 mL, the inside of the system was replaced with nitrogen by bubbling with nitrogen gas. Under nitrogen atmosphere, 1.0 g of bis(1,5-cyclooctadiene) nickel(0) {nickel(COD)$_2$} was added to this solution, and the temperature was raised to 60° C. The reaction was conducted for 3 hours with stirring. After the reaction, this reaction liquid was cooled to a room temperature (about 25° C.), and added dropwise to a mixed solution of 25% aqueous ammonia 10 ml/about 100 ml of methanol/about 200 ml of ion-exchanged water and stirred for 1 hour. The deposited precipitate was filtrated and dried for 2 hour under reduced pressure. Then, it was dissolved in about 350 ml toluene. Then, about 200 ml of 1N hydrochloric acid was added and stirred for 1 hour, the aqueous layer was removed; about 200 ml of 2% aqueous ammonia was added to the organic layer, stirred for 1 hour, and the aqueous layer was removed; about 200 ml of ion-exchanged water was added, and the aqueous layer was removed. Then, purification through alumina column was carried out, and recovered toluene solution was added to about 700 ml of methanol, stirred for 1 hour, and deposited precipitate was filtrated and dried under reduced pressure for two hours. The yield of the obtained copolymer (referred to as Polymer Compound 4) was 0.4 g. Polystyrene reduced number average molecular weight and weight average molecular weight were Mn=2.3× 10$^4$ and Mw=8.8×10$^4$, respectively.

Example 4

On a glass substrate on which ITO film was formed in a thickness of 150 nm by sputtering method, a film was formed by a thickness of 70 nm with a spin coat using a solution (Bayer Co., Baytron P) of poly(ethylenedioxythiophene)/polystyrene sulfonic acid, and then it was dried at 200° C. for 10 minutes on a hot plate. Next, a film was formed by spin-coating at a rotational rate of 1500 rpm, using toluene solutions of 1:1 mixture (weight ratio) of Polymer Compound 4 and Polymer Compound 1 whose concentration was set to being 1.5 wt %. Furthermore, after drying this at 80° C. under reduced pressure for 1 hour, an EL device was fabricated, by depositing about 4 nm of LiF, about 5 nm of calcium as the cathode, and subsequently, about 35 nm of aluminum. Here, after the vacuum degree reached to 1×10$^{-4}$ Pa or less, the deposition of metal was started.

By applying a voltage to the resultant device, EL luminescence having a peak at 480 nm was observed. Attenuation of luminance was measured with setting the initial luminance to 100 cd/m$^2$, and the luminance after 300 hours was 71 cd/m$^2$.

Example 5

Synthesis of 4-t-butyl-2,6-dimethylbromobezene

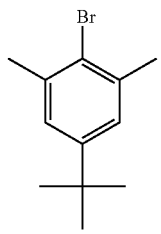

Under an inert atmosphere, 225 g of acetic acid was put into a 500 ml three-necked flask, and 24.3 g of 5-t-butyl-m-xylene was added. Then, after adding 31.2 g of bromine, it was reacted at 15-20° C. for 3 hours. The reaction liquid was added to 500 ml of water, and the deposited precipitate was filtrated. It was washed with 250 ml of water twice and 34.2 g of white solid was obtained.

$^1$H-NMR (300 MHz/CDCl$_3$):

δ (ppm)=1.3 [s, 9H], 2.4 [s, 6H], 7.1 [s, 2H]

MS (FD+) M$^+$ 241

Synthesis of N,N'-diphenyl-N,N'-bis(4-t-butyl-2,6-dimethylphenyl)-1,4-phenylenediamine

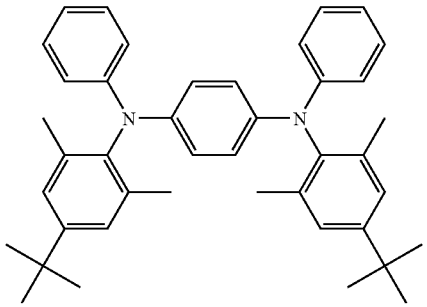

Under an inert atmosphere, deaerated toluene (dehydrated) 36 ml was put in a 100 ml three-necked flask, and 0.63 g of tri(t-butyl)phosphine was added. Then, after adding 0.41 g of tris(dibenzylidine acetone)dipalladium, 9.6 g of the above 4-t-butyl-2,6-dimethyl bromobenzene, 5.2 g of t-butoxy sodium, and 4.7 g of N,N'-diphenyl-1,4-phenylenediamine, it was reacted at 100° C. for 3 hours.

The reaction liquid was added to 300 ml of saturated NaCl aqueous solution, and extracted with 300 ml of 50° C. chloroform. After distilling off the solvent, toluene 100 ml was added and heated to dissolve the solid, and then stand it to cool. The precipitate was filtrated and 9.9 g of white solid was obtained.

Synthesis of N,N'-bis(4-bromophenyl)-N,N'-bis(4-t-butyl-2,6-dimethylphenyl)-1,4-phenylenediamine

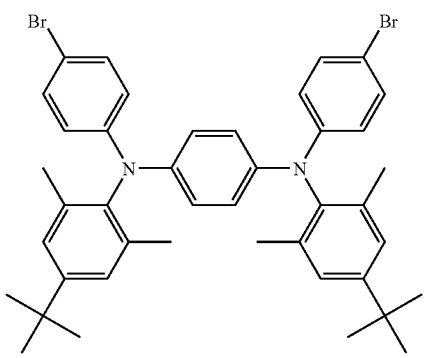

Under an inert atmosphere, dehydrated N,N-dimethylformamide 350 ml was put in a 1000 ml three-necked flask, and 5.2 g of the above N,N'-diphenyl-N,N'-bis(4-t-butyl-2,6-dimethylphenyl)-1,4-phenylenediamine was dissolved in it, then, a solution of 3.5 g of N-bromosuccinimide/N,N-dimethylformamide was added dropwise, and reacted with cooling by an ice bath one whole day and night.

150 ml of water was added to the reaction liquid, and deposited precipitate was filtrated, and washed twice with 50 ml methanol. 4.4 g of white solid was obtained.

$^1$H-NMR (300 MHz/THF-d$_8$):

δ (ppm)=1.3 [s, 18H], 2.0 [s, 12H], 6.6-6.7-[d, 4H], 6.8-6.9 [br, 4H], 7.1 [s, 4H], 7.2-7.3 [d, 4H]

MS (FD+) M$^+$ 738

Synthesis of Polymer Compound 5

The above compound E (5.4 g, 9 mmol), the above N,N'-bis(4-bromophenyl)-N,N'-bis(4-t-butyl-2,6-dimethylphenyl)-1,4-phenylenediamine (4.5 g, 6 mmol) and 2,2'-bipyridyl (5.1 g, 33 mmol) were dissolved in dehydrated tetrahydrofuran 420 mL, then the inside of the system was replaced with nitrogen by bubbling with nitrogen gas.

Under nitrogen atmosphere, bis(1,5-cyclooctadiene) nickel(0) {nickel (COD)$_2$} (9.0 g, 33 mmol) was added to this solution, the temperature was raised to 60° C., and reacted for 3 hours with stirring. After the reaction, this reaction liquid was cooled to a room temperature (about 25° C.), and added dropwise to a mixed solution of 25% aqueous ammonia 150 ml/methanol 1500 ml/600 ml ion-exchanged water and stirred for 1 hour. The deposited precipitate was filtrated and dried for 2 hours under reduced pressure, and dissolved in 450 ml of toluene. Then, 450 ml of 1N hydrochloric acid was added and stirred for 1 hour, the aqueous layer was removed; and 450 ml of 4% aqueous ammonia was added to the organic layer, stirred for 1 hour, and the aqueous layer was removed. The organic layer was added dropwise to 1350 ml of methanol, and stirred for 1 hour. Then the deposited precipitate was filtrated and dried under reduced pressure for 2 hours, and dissolved in 400 ml toluene. Then, purification through alumina column (100 g of alumina) was carried out, and recovered toluene solution was added to about 1350 ml of methanol, stirred for 1 hour, and deposited precipitate was filtrated and dried under reduced pressure for two hours. The yield of the obtained copolymer (referred to as Polymer Compound 5) was 5.5 mg. Polystyrene reduced number average molecular weight was Mn=3.2×10$^4$.

Example 6

On a glass substrate on which ITO film was formed in a thickness of 150 nm by sputtering method, a film was formed by a thickness of 70 nm with a spin coat using a solution (Bayer Co., Baytron P) of poly(ethylenedioxythiophene)/polystyrene sulfonic acid, and then it was dried at 200° C. for 10 minutes on a hot plate. Next, a film was formed by spin-coating at a rotational rate of 1500 rpm, using a toluene solution of 25:75 mixture (weight ratio) of Polymer Compound 5 and Polymer Compound 1 whose concentration was set to being 1.5 wt %. Furthermore, after drying this at 80° C. under reduced pressure for 1 hour, an EL device was fabricated, by depositing about 4 nm of LiF, about 5 nm of calcium as the cathode, and subsequently, about 35 nm of aluminum. Here, after the vacuum degree reached to 1×10$^4$ Pa or less, the deposition of metal was started.

By applying a voltage to the resultant device, EL luminescence having a peak at 472 nm was observed. Attenuation of luminance was measured with setting the initial luminance to 100 cd/m$^2$, and the luminance after 300 hours was 78 cd/m$^2$.

A synthesis of N,N-bis[N'-phenyl-N'-(4-t-butyl-2,6-dimethylphenyl)-4-amino phenyl]-2,4,6-trimethyl aniline

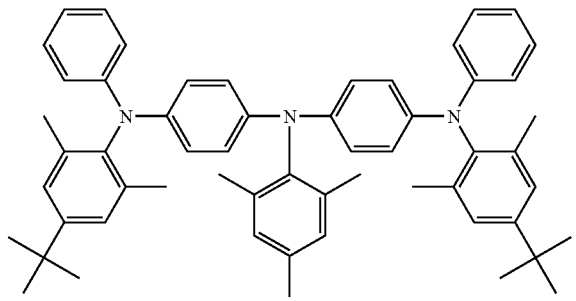

Under an inert atmosphere, deaerated toluene (dehydrated) 40 ml was put in a 100 ml three-necked flask, and 0.27 g of tri(t-butyl)phosphine was added. Then, 0.18 g of tris(dibenzylidine acetone)dipalladium, 4.3 g of N-4-t-butyl-2,6-dimethylphenyl aniline, 2.2 g of t-butoxy sodium, and 3.5 g of N,N-di(4-bromophenyl)-2,4,6-trimethylaniline, were added and reacted at 100° C. for 3 hour.

The reaction liquid was added to 300 ml of saturated NaCl aqueous solution, and extracted with 300 ml of warmed chloroform. After distilling off the solvent, toluene 100 ml was added and heated to dissolve the solid, and then stand it to cool. The precipitate was filtrated and 5.2 g of white solid was obtained.

Synthesis of N,N-bis[N'-4-bromophenyl-N'-(4-t-butyl-2,6-dimethylphenyl)-4-aminophenyl]-2,4,6-trimethylaniline

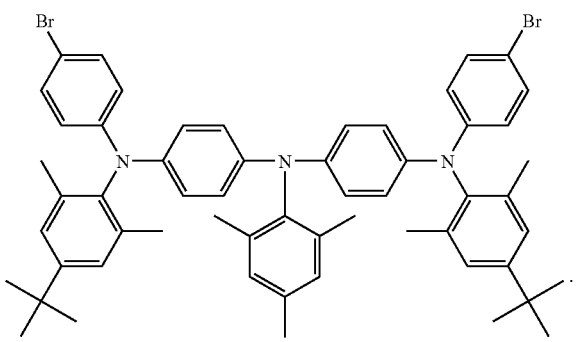

Under an inert atmosphere, dehydrated N,N-dimethylformamide 350 ml is put into a 1000 ml three-necked flask. After dissolving 5.0 g of the above N,N-bis[N'-phenyl-N'-(4-t-butyl-2,6-dimethylphenyl)-4-aminophenyl]-2,4,6-trimethyl aniline, a solution of N-bromosuccinimide 2.4 g/N,N-dimethylformamide was added dropwise, and reacted with cooling by an ice bath one whole day and night.

150 ml of water was added to the reaction liquid, and the deposited precipitate was filtrated, and washed twice with methanol 50 ml. 4.4 g of white solid was obtained.

$^1$H-NMR (300 MHz/THF-$d_8$):

δ (ppm)=1.3 [s, 18H], 1.9 [s, 6H], 2.0 [s, 12H], 2.2 [s, 3H], 6.6-6.7-[d, 4H], 6.7-6.8-[br, 8H], 6.9 [s, 2H], 7.1 [s, 4H], 7.1-7.2-[d, 4H]

MS (FD+) M$^+$ 947

Synthesis of Polymer Compound 6

The above compound E (479 mg, 0.8 mmol), the above N,N-bis[N'-4-bromophenyl-N'-(4-t-butyl-2,6-dimethylphenyl)-4-amino phenyl]-2,4,6-trimethylaniline (190 mg, 0.2 mmol) and 2,2'-bipyridyl (330 mg, 2.1 mmol) were dissolved in 28 mL of dehydrated tetrahydrofuran, then the inside of the system was replaced with nitrogen by bubbling with nitrogen gas.

Under nitrogen atmosphere, bis(1,5-cyclooctadiene)nickel(0) {nickel (COD)$_2$} (580 mg, 2.1 mmol) was added to this solution, the temperature was raised to 60° C., and reacted for 3 hours with stirring. After the reaction, this reaction liquid was cooled to a room temperature (about 25° C.), and added dropwise to a mixed solution of 25% aqueous ammonia 10 ml/methanol 120 ml/50 ml ion-exchanged water and stirred for 1 hour. The deposited precipitate was filtrated and dried for 2 hours under reduced pressure, and dissolved in 30 ml of toluene. Then, 30 ml of 1N hydrochloric acid was added and stirred for 1 hour, the aqueous layer was removed; and 30 ml of 4% aqueous ammonia was added to the organic layer, stirred for 1 hour, and the aqueous layer was removed. The organic layer was added dropwise to 150 ml of methanol, and stirred for 1 hour. Then the deposited precipitate was filtrated and dried under reduced pressure for 2 hours, and dissolved in 30 ml toluene. Then, purification through alumina column (10 g of alumina) was carried out, and recovered toluene solution was added to about 200 ml of methanol, stirred for 1 hour, and the deposited precipitate was filtrated and dried under reduced pressure for two hours. The yield of the obtained copolymer (referred to as Polymer Compound 6) was 350 mg. Polystyrene reduced number average molecular weight was Mn=5.2×10$^4$.

Example 8

On a glass substrate on which ITO film was formed in a thickness of 150 nm by sputtering method, a film was formed by a thickness of 70 nm with a spin coat using a solution (Bayer Co., Baytron P) of poly(ethylenedioxythiophene)/polystyrene sulfonic acid, and then it was dried at 200° C. for 10 minutes on a hot plate. Next, a film was formed by spin-coating at a rotational rate of 1500 rpm, using a toluene solution of 5:5 mixture (weight ratio) of Polymer Compound 6 and Polymer Compound 1 whose concentration was set to being 1.5 wt %. Furthermore, after drying this at 80° C. under reduced pressure for 1 hour, an EL device was fabricated, by depositing about 4 nm of LiF, about 5 nm of calcium as the cathode, and subsequently, about 35 nm of aluminum. Here, after the vacuum degree reached to 1×10$^4$ Pa or less, the deposition of metal was started.

By applying a voltage to the resultant device, EL luminescence having a peak at 468 nm was observed. Attenuation of luminance was measured with setting the initial luminance to 100 cd/m$^2$, and the luminance after 300 hours was 74 cd/m$^2$.

When the polymer compound of the present invention is used for polymer LED, the polymer LED has a longer operating life. Therefore, the polymer LED can be preferably used for back light of a liquid crystal display, a light source of curved or flat surface for lighting, a segment type display element, and apparatus such as a flat-panel display of dot matrix.

What is claimed is:

1. A polymer compound having a polystyrene reduced number average-molecular weight of $10^3$-$10^8$, and comprising at least one repeating unit resented by formula (1),

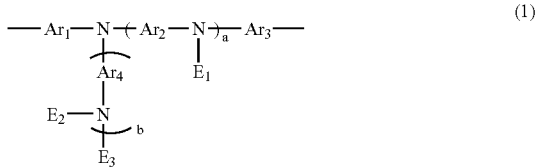

(1)

wherein $Ar_1$, $Ar_2$, $Ar_3$ and $Ar_4$ each independently represent an arylene group or a divalent heterocyclic group; $E_1$, $E_2$, and $E_3$ each independently represent the below aryl group (A); a and b each independently represent 0 or 1, and a+b=1, aryl group (A): an aryl group which has three or more substituents selected from an alkyl group, an alkoxy group, an alkylthio group, an aryl group, an aryloxy group, an arylthio group, a substituted amino group, a substituted silyl group, a substituted silyloxy group, or a monovalent heterocyclic group, wherein the aryl group (A) has substituents on the carbon atoms selected by following (C), (C): An arylamine compound derived from aryl group (A) by replacing the free bond of aryl group (A) with amino group, and by replacing all the substituents of aryl group (A) with hydrogen atoms, is considered for the calculation; the highest occupied molecular orbital (HOMO) of the arylamine compound calculated by AM1 method which is a semi-empirical molecular orbital method, is selected; sum square values of atomic orbital coefficients of the HOMO are calculated only about the carbon atoms to which a hydrogen atom is bonded, and three or more carbon atoms are selected from the carbon atoms having large sum square value in descending order.

2. The polymer compound according to claim 1, wherein the aryl group (A) is a phenyl, a naphthyl, or an anthracenyl group having three or more substituents.

3. The polymer compound according to claim 1, wherein the aryl group (A) is a group represented by the below formula (3),

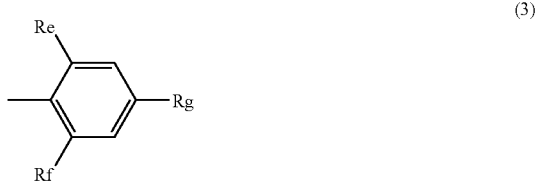

(3)

wherein Re, Rf, and Rg each independently represent an alkyl group, an alkoxy group, an alkylthio group, an aryl group, an aryloxy group, an arylthio group, a substituted amino group, a substituted silyl group, a substituted silyloxy group, or a monovalent heterocyclic group.

4. The polymer compound according to claim 3, wherein Re and Rf each independently represent alkyl, alkoxy or alkylthio groups having three or less carbon atoms, and Rg represents alkyl, alkoxy or alkylthio groups having 3-20 carbon atoms.

5. The polymer compound according to claim 1, wherein said polymer compound further comprises a repeating unit represented by below formula (4), (5), (6), or (7), —$Ar_{12}$— (4)

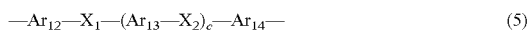

(5)

(6)

—$X_2$— (7)

in the formula, $Ar_{12}$, $Ar_{13}$, and $Ar_{14}$ each independently represent an arylene group, a divalent heterocyclic group, or a divalent group having a metal-complex structure; $X_1$ represents —$CR_2$=$CR_3$—, —C≡C—, or —$(SiR_5R_6)_d$—; $X_2$ represents —$CR_2$=$CR_3$—, —C≡C—, —$N(R_4)$— or —$(SiR_5R_6)_d$—; $R_2$ and $R_3$ each independently represent a hydrogen atom, an alkyl group, an aryl group, a monovalent heterocyclic group, a carboxyl group, a substituted carboxyl group, or a cyano group; $R_4$, $R_5$ and $R_6$ each independently represent a hydrogen atom, an alkyl group, an aryl group, a monovalent heterocyclic group, or an arylalkyl group; c represents an integer of 0 to 2; and d represents an integer of 1 to 12.

6. A composition comprising at least a material selected from a hole transporting material, an electron transporting material, and a light-emitting material, and at least the polymer compound according to claim 1.

7. An ink composition containing the polymer compound according to claim 1.

8. The ink composition according to claim 7, wherein the viscosity is 1 to 20 mPa·s at 25° C.

9. A luminescent thin film containing the polymer compound according to claim 1.

10. A conductive thin film containing the polymer compound according to claim 1.

11. An organic-semiconductor thin film containing the polymer compound according to claim 1.

12. A polymer light-emitting device having a layer containing the polymer compound according to claim 1, between electrodes consisting of an anode and a cathode.

13. The polymer light-emitting device according to claim 12, wherein the layer is a light emitting layer.

14. The polymer light-emitting device according to claim 13, wherein the light emitting layer further contains a hole transporting material, an electron transporting material, or a light-emitting material.

15. A flat light source comprising the polymer light-emitting device according to claim 12.

16. A segment display apparatus comprising the polymer light-emitting device according to claim 12.

17. A dot-matrix display apparatus comprising the polymer light-emitting device according to claim 12.

18. A liquid crystal display comprising the polymer light-emitting device according to claim 12 as a back light.

* * * * *